US012001138B2

(12) United States Patent
Kai et al.

(10) Patent No.: US 12,001,138 B2
(45) Date of Patent: Jun. 4, 2024

(54) COMPOSITION FOR FORMING SILICON-CONTAINING RESIST UNDERLAYER FILM AND PATTERNING PROCESS

(71) Applicant: SHIN-ETSU CHEMICAL CO., LTD., Tokyo (JP)

(72) Inventors: Yusuke Kai, Joetsu (JP); Takeru Watanabe, Joetsu (JP); Yusuke Biyajima, Joetsu (JP); Tsutomu Ogihara, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 673 days.

(21) Appl. No.: 17/000,566

(22) Filed: Aug. 24, 2020

(65) Prior Publication Data
US 2021/0088908 A1 Mar. 25, 2021

(30) Foreign Application Priority Data
Sep. 19, 2019 (JP) ................................. 2019-169969

(51) Int. Cl.
G03F 7/004 (2006.01)
C08G 77/04 (2006.01)
C08G 77/16 (2006.01)
C08G 77/18 (2006.01)
C08G 77/26 (2006.01)
C09D 183/04 (2006.01)
C09D 183/06 (2006.01)
C09D 183/08 (2006.01)
G03F 7/095 (2006.01)
G03F 7/11 (2006.01)
H01L 21/027 (2006.01)
H01L 21/033 (2006.01)

(52) U.S. Cl.
CPC ........... G03F 7/0045 (2013.01); C08G 77/04 (2013.01); C08G 77/16 (2013.01); C08G 77/18 (2013.01); C08G 77/26 (2013.01); C09D 183/04 (2013.01); C09D 183/06 (2013.01); C09D 183/08 (2013.01); G03F 7/004 (2013.01); G03F 7/095 (2013.01); G03F 7/11 (2013.01); H01L 21/0274 (2013.01); H01L 21/0332 (2013.01); H01L 21/0335 (2013.01); H01L 21/0337 (2013.01); H01L 21/0338 (2013.01)

(58) Field of Classification Search
CPC .. C08G 77/04; C08K 5/19; C08K 5/18; H01L 21/0335; H01L 21/0274; H01L 21/02115; H01L 21/02118
See application file for complete search history.

(56) References Cited

U.S. PATENT DOCUMENTS

| 2005/0215713 | A1* | 9/2005 | Hessell | ............. H01L 21/02282 525/162 |
| 2007/0172759 | A1* | 7/2007 | Ogihara | .................. G03F 7/091 430/311 |
| 2007/0238300 | A1 | 10/2007 | Ogihara et al. | |
| 2008/0199789 | A1* | 8/2008 | Abdallah | .......... H01L 21/02126 430/21 |
| 2009/0136869 | A1* | 5/2009 | Ogihara | ................ G03F 7/0752 430/316 |
| 2010/0210765 | A1* | 8/2010 | Nakajima | ............. G03F 7/0757 524/285 |
| 2011/0045404 | A1* | 2/2011 | Imamura | ................. C08G 77/60 430/316 |
| 2011/0143149 | A1 | 6/2011 | Shibayama et al. | |
| 2012/0052685 | A1 | 3/2012 | Ogihara et al. | |
| 2013/0164545 | A1 | 6/2013 | Evans et al. | |
| 2013/0210236 | A1 | 8/2013 | Ogihara et al. | |
| 2013/0280912 | A1 | 10/2013 | Ogihara et al. | |
| 2013/0302991 | A1 | 11/2013 | Kanno et al. | |
| 2014/0205951 | A1 | 7/2014 | Ogihara et al. | |
| 2015/0079792 | A1 | 3/2015 | Shigaki et al. | |
| 2015/0357204 | A1* | 12/2015 | Ogihara | ................ C07C 229/12 524/240 |
| 2018/0081272 | A1 | 3/2018 | Ogihara et al. | |

FOREIGN PATENT DOCUMENTS

EP 2 669 737 A1 12/2013
JP 2007-226204 A 9/2007
(Continued)

OTHER PUBLICATIONS

"Advanced Materials for 193-nm Resists" authored by Shida et al. and published in the Journal of Photopolymer Science and Technology (2000) 13 (4), 601-606.*

(Continued)

Primary Examiner — Marc S Zimmer
(74) Attorney, Agent, or Firm — Oliff PLC

(57) ABSTRACT

A composition for forming a silicon-containing resist underlayer film contains at least one or more kinds of a quaternary ammonium salt shown by the following general formula (A-1), and a thermally crosslinkable polysiloxane (Sx), where $Ar^1$ represents an aromatic group having 6 to 20 carbon atoms, or a heteroaromatic group having 4 to 20 carbon atoms. $R^{11}$ represents an alkyl group, alkenyl group, oxoalkyl group, or oxoalkenyl group having 1 to 12 carbon atoms, an aryl group having 6 to 20 carbon atoms, or an aralkyl group or aryloxoalkyl group having 7 to 12 carbon atoms. Some or all of hydrogen atoms of these groups are optionally substituted. $Z^-$ represents an organic or inorganic anion as a counterion of the quaternary ammonium cation. An object is to provide a silicon-containing resist underlayer film having high effect of suppressing ultrafine pattern collapse and appropriate etching rate in multilayer resist methods.

$$Ar^1-N^+-(R^{11})_3 \quad\quad (A\text{-}1)$$
$$Z^-$$

16 Claims, No Drawings

(56) References Cited

FOREIGN PATENT DOCUMENTS

| JP | 2007-302873 | A | | 11/2007 |
|---|---|---|---|---|
| JP | 2009-126940 | A | | 6/2009 |
| JP | 2009126940 | | * | 6/2009 |
| JP | 2012-053253 | A | | 3/2012 |
| JP | 2013-167669 | A | | 8/2013 |
| JP | 2013-173916 | A | | 9/2013 |
| JP | 2013-224279 | A | | 10/2013 |
| JP | 2014141585 | A | | 8/2014 |
| JP | 2015-229640 | A | | 12/2015 |
| JP | 2018-049817 | A | | 3/2018 |
| KR | 10-2018-0066829 | A | | 6/2018 |
| TW | 201605770 | A | | 2/2016 |
| WO | 2010/021290 | A1 | | 2/2010 |
| WO | 2013/161372 | A1 | | 10/2013 |

OTHER PUBLICATIONS

Mar. 1, 2022 Office Action issued in Korean Patent Application No. 10-2020-0119967.
Feb. 10, 2021 Extended European Search Report issued in European Patent Application No. 20197261.9.
Jun. 24, 2021 Office Action issued in Taiwanese Patent Application No. 109131977.
May 2, 2023 Notification of Reasons for Refusal issued in Japanese Patent Application No. 2020-133498.
Jul. 4, 2023 Notification of Reasons for Refusal issued in Japanease Patent Application No. 2020-133498.

* cited by examiner

COMPOSITION FOR FORMING SILICON-CONTAINING RESIST UNDERLAYER FILM AND PATTERNING PROCESS

TECHNICAL FIELD

The present invention relates to a composition for forming a silicon-containing resist underlayer film, and a patterning process using the composition.

BACKGROUND ART

As Large-Scale Integrated circuits (LSIs) advance toward higher integration and higher processing speed, miniaturization of pattern size is rapidly progressing. Along with this miniaturization, the lithography technology has achieved formation of fine patterns by shortening the wavelength of a light source and by selecting a proper resist composition corresponding to the shortened wavelength. The main factor of this achievement is a positive photoresist composition used as a monolayer. This monolayer positive photoresist composition allows a resist resin to have not only a skeleton that possesses etching resistance against dry etching with chlorine- or fluorine-based gas plasma, but also a switching mechanism that makes an exposed part soluble. Thereby, after a pattern is formed by dissolving the exposed part, a substrate to be processed is dry-etched using the remaining resist pattern as an etching mask.

However, if the miniaturization is pursued, that is, if the pattern width is reduced, without changing the film thickness of a photoresist film to be used, the resolution of the photoresist film decreases. In addition, if the photoresist film is pattern-developed by using a developer, what is called an aspect ratio thereof becomes so large that a problem of the pattern collapse occurs. For these reasons, the thickness of the photoresist film has been reduced in accordance with the pattern miniaturization.

On the other hand, a substrate to be processed has been generally processed by dry etching using a pattern-formed photoresist film as an etching mask. In practice, however, there is no dry etching method capable of providing an absolute etching selectivity between the photoresist film and the substrate to be processed. Thus, there have been problems that the resist film is also damaged and collapses during the substrate processing, and the resist pattern cannot be precisely transferred to the substrate to be processed. Accordingly, higher dry etching resistance has been required in a photoresist composition along with the pattern miniaturization. In the meanwhile, a resin used for the photoresist composition has been required to have low absorption at the wavelength of the exposure light in order to enhance the resolution. The resin used for the photoresist composition thus has been shifted to a novolak resin, polyhydroxystyrene, and a resin having an aliphatic polycyclic skeleton as the exposure light is shifted to i-line, KrF, and ArF, which have shorter wavelengths. This shift actually accelerates the etching rate under dry etching condition for processing the substrate, and recent photoresist compositions having high resolution tend to have rather low etching resistance.

In such circumstances, a substrate to be processed has to be dry-etched with a thinner photoresist film having lower etching resistance. A material and a process reliably employed in this patterning process are urgently needed.

A multilayer resist method is one of solutions for these problems. In this method, an underlayer film having a different etching selectivity from that of a photoresist film (i.e., resist upper layer film) is placed between the resist upper layer film and a substrate to be processed; a pattern is formed in the resist upper layer film; then, the pattern is transferred to the underlayer film by dry etching using the resist upper layer film pattern as a dry etching mask; and the pattern is further transferred to the substrate to be processed by dry etching using the underlayer film as a dry etching mask.

One of the multilayer resist methods is a three-layer resist method which can be performed using a resist composition generally adopted in a monolayer resist method. In this three-layer resist method, for example, an organic film made of a novolak resin or the like is formed on a substrate to be processed, a silicon-containing resist underlayer film is formed on the organic film, and further a usual organic photoresist film is formed as a resist upper layer film on the silicon-containing resist underlayer film. When dry etching is performed with fluorine-based gas plasma, such an organic resist upper layer film can have a good etching selectivity ratio relative to the silicon-containing resist underlayer film, so that the resist upper layer film pattern can be transferred to the silicon-containing resist underlayer film by dry etching with fluorine-based gas plasma. According to this method, even if a resist composition to be used has difficulty in forming a pattern with a sufficient film thickness to directly process the substrate to be processed or does not have sufficient dry etching resistance to process the substrate, the pattern can be transferred to the silicon-containing film (resist underlayer film); next, pattern transfer by dry etching with oxygen- or hydrogen-based gas plasma gives the pattern of the organic film made of a novolak resin or the like having sufficient dry etching resistance to process the substrate. After this organic film pattern is formed, the remaining silicon-containing film is removed generally by dry etching with fluorine-based gas plasma or wet etching with, for example, alkali- or fluorine-based etching solution to eliminate the defect-causing residue. If the etching rate is insufficient, this increases a possibility that the residue derived from the silicon-containing film stays and causes defect, or that longer etching treatment is required, bringing about problems such as damaging the substrate to be processed. As described above, for precise patterning and smooth removal, the silicon-containing resist underlayer film needs to be etched at appropriate speed.

Meanwhile, the recent advents of ArF immersion lithography, EUV lithography, and so forth start to realize finer pattern formations. On the other hand, ultrafine patterns have such small contact areas that the patterns quite easily collapse. Suppressing such pattern collapse is an enormous challenge. Hence, the development of a silicon-containing resist underlayer film having a high effect of suppressing pattern collapse is urgently required.

In this respect, there have been proposed compositions each containing a curing catalyst for forming a silicon-containing resist underlayer film for ArF or EUV lithography (Patent Documents 1, 2). The curing catalyst has a suitable structure for catalyzing silanol condensation reaction and promoting the formation of siloxane bonds that serve as the main skeleton of a silicon-containing resist underlayer film. In addition, it is about to be revealed that the selection of a curing catalyst have various influences on properties of a resist underlayer film. Examples of the properties include acidity/basicity, hydrophilicity/hydrophobicity, hardness, film density, etching rate, etc. By these influences, consequently, the interaction with an upper layer resist is also influenced, the pattern falls due to adhesion degradation, and the resist footing is induced. The subsequent substrate processing failure causes serious problems.

Furthermore, as another composition containing a curing catalyst for forming a silicon-containing resist underlayer film, there has been proposed a composition for forming a silicon-containing resist underlayer film, the composition containing a silane compound having a functional group that acts as a curing catalyst (Patent Document 3). However, in the latest application of further advanced miniaturization by employing EUV lithography or the like, pattern collapse is sometimes problematic, and the improvement is demanded.

CITATION LIST

Patent Literature

Patent Document 1: JP 2007-302873A
Patent Document 2: WO 2013/161372A1
Patent Document 3: WO 2010/021290A1

SUMMARY OF INVENTION

Technical Problem

An object of the present invention is to provide a silicon-containing resist underlayer film having high effect of suppressing ultrafine pattern collapse so as to form favorable resist pattern and having appropriate etching rate in multilayer resist methods.

Solution to Problem

The present invention has been made to achieve the above object, and provides a composition for forming a silicon-containing resist underlayer film, comprising at least:
one or more kinds of a quaternary ammonium salt shown by the following general formula (A-1); and
a thermally crosslinkable polysiloxane (Sx),

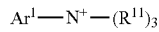

$$Ar^1-N^+-(R^{11})_3 \quad Z^- \tag{A-1}$$

wherein $Ar^1$ represents an aromatic group having 6 to 20 carbon atoms optionally having a substituent, or a heteroaromatic group having 4 to 20 carbon atoms optionally having a substituent; $R^{11}$'s each independently represent a linear, branched, or cyclic alkyl group, alkenyl group, oxoalkyl group, or oxoalkenyl group having 1 to 12 carbon atoms, a substituted or unsubstituted aryl group having 6 to 20 carbon atoms, or an aralkyl group or aryloxyalkyl group having 7 to 12 carbon atoms; some or all of hydrogen atoms of these groups are optionally substituted; two of $R^{11}$'s are optionally bonded to each other to form a ring; and Z represents an organic or inorganic anion as a counterion of the quaternary ammonium cation.

The quaternary ammonium salt shown by the general formula (A-1) contained in the inventive composition for forming a silicon-containing resist underlayer film functions as a crosslinking catalyst, and promotes thermal curing of the silicon-containing resist underlayer film. The thermally cured underlayer film has all of sufficient etching rate, an effect of preventing pattern collapse of an upper layer resist, and an effect of forming favorable resist pattern.

In the present invention, the quaternary ammonium salt shown by the general formula (A-1) is preferably shown by the following general formula (A-2):

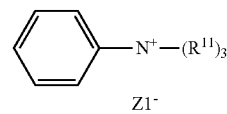

wherein each $R^{11}$ is as defined above; and $Z1^-$ represents an organic or inorganic anion as a counterion of the quaternary ammonium cation, and
a conjugate acid Z1-H of the $Z1^-$ has a boiling point of 200° C. or less.

When the quaternary ammonium salt shown by the general formula (A-1) is shown by the general formula (A-2), the effects of the present invention are more sufficiently exhibited.

The thermally crosslinkable polysiloxane (Sx) preferably comprises any one or more of a repeating unit shown by the following general formula (Sx-1), a repeating unit shown by the following general formula (Sx-2), and a partial structure shown by the following general formula (Sx-3):

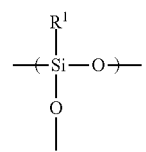

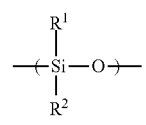

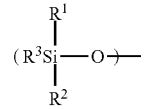

wherein $R^1$, $R^2$, and $R^3$ are identical to or different from each other and each represent a monovalent organic group having 1 to 30 carbon atoms.

When the thermally crosslinkable polysiloxane (Sx) has a certain structure(s) as described above, the effects of the present invention are more sufficiently exhibited.

The inventive composition for forming a silicon-containing resist underlayer film may further comprise an acid generator.

Adding an acid generator as necessary allows fine adjustment of pattern profile, exposure sensitivity, etc.

When the inventive composition for forming a silicon-containing resist underlayer film contains an acid generator, the acid generator is preferably a sulfonium salt which is a photoacid generator and generates an acid by an action of a high energy beam.

In this case, the pattern profile, exposure sensitivity, and so forth of a resist upper layer film can be appropriately adjusted while decreases in the other properties are suppressed to the minimum. Additionally, a residue derived from the resist upper layer film is effectively reduced in some cases.

The present invention provides a patterning process comprising steps of:

forming an organic film by using a coating-type organic film material on a body to be processed;

forming a silicon-containing resist underlayer film on the organic film by using the above-described composition for forming a silicon-containing resist underlayer film;

forming a resist upper layer film on the silicon-containing resist underlayer film by using a resist upper layer film composition composed of a photoresist composition;

forming a circuit pattern in the resist upper layer film;

transferring the pattern to the silicon-containing resist underlayer film by etching using the resist upper layer film having the formed circuit pattern as a mask;

transferring the pattern to the organic film by etching using the silicon-containing resist underlayer film having the transferred pattern as a mask; and transferring the pattern to the body to be processed by etching using the organic film having the transferred pattern as a mask.

Moreover, the present invention provides a patterning process comprising steps of:

forming a hard mask mainly containing carbon by a CVD method on a body to be processed;

forming a silicon-containing resist underlayer film on the hard mask by using the above-described composition for forming a silicon-containing resist underlayer film;

forming a resist upper layer film on the silicon-containing resist underlayer film by using a resist upper layer film composition composed of a photoresist composition;

forming a circuit pattern in the resist upper layer film;

transferring the pattern to the silicon-containing resist underlayer film by etching using the resist upper layer film having the formed circuit pattern as a mask;

transferring the pattern to the hard mask by dry etching using the silicon-containing resist underlayer film having the transferred pattern as a mask; and transferring the pattern to the body to be processed by dry etching using the hard mask having the transferred pattern as a mask.

These patterning processes suppress pattern collapse of the resist upper layer film and can provide a favorable resist pattern. Moreover, a pattern is favorably transferred to the silicon-containing resist underlayer film by dry etching. Furthermore, after the patterning is ended, the remaining silicon-containing resist underlayer film is easily removed, so that the residue hardly generates defect. Accordingly, the patterning processes are particularly practical for forming fine patterns.

In the step of forming the circuit pattern in the resist upper layer film, the pattern is preferably formed by a photolithography with a wavelength of 10 nm or more and 300 nm or less, direct lithography with electron beam, nanoimprinting, or a combination thereof.

When a pattern is formed in the resist upper layer film by a certain patterning method as described above, the effects of the present invention are more sufficiently exhibited.

The body to be processed may be a semiconductor device substrate, a metal film, a metal carbide film, a metal oxide film, a metal nitride film, a metal oxycarbide film, or a metal oxynitride film.

When the body to be processed is a certain material as described above, the effects of the present invention are more sufficiently exhibited.

Further, a metal constituting the body to be processed is preferably silicon, gallium, titanium, tungsten, hafnium, zirconium, chromium, germanium, copper, silver, gold, indium, arsenic, palladium, tantalum, iridium, aluminum, iron, molybdenum, cobalt, or an alloy thereof.

When the metal constituting the body to be processed is a certain metal as described above, the effects of the present invention are more sufficiently exhibited.

Advantageous Effects of Invention

The inventive composition for forming a silicon-containing resist underlayer film contains a quaternary ammonium salt with a certain structure(s), and thus makes it possible to form not only an ultrafine upper layer resist pattern without collapse but also favorable pattern profile. Moreover, the inventive composition allows formation of a semiconductor-device pattern on a substrate with high yield because of excellent dry etching selectivity relative to a resist upper layer film and an organic film or hard mask. Further, the inventive composition for forming a silicon-containing resist underlayer film has high etching selectivity relative to an organic material, so that a photoresist pattern to be formed can be successively transferred from the silicon-containing resist underlayer film to an organic film or hard mask by dry etching process. Furthermore, the silicon-containing resist underlayer film formed according to the present invention has sufficient etching rate, so that the silicon-containing resist underlayer film remaining after the patterning is easily removed, and the residue hardly generates defect. Thus, the present invention is particularly useful for forming fine patterns.

DESCRIPTION OF EMBODIMENTS

The present invention relates to: a composition for forming a coating-type silicon-containing film used in lithography in processes of manufacturing semiconductor devices and the like; and a patterning process using the composition.

As described above, there have been demands for: a composition for forming a silicon-containing resist underlayer film in multilayer resist methods, the silicon-containing resist underlayer film having high effect of suppressing collapse of ultrafine patterns and appropriate etching rate, and enabling formation of favorable resist pattern; and an ultrafine-patterning process using the composition.

The present inventors have earnestly studied to achieve the above object and consequently found that blending a quaternary ammonium salt with a certain structure into a composition for forming a silicon-containing resist underlayer film results in a silicon-containing resist underlayer film capable of suppressing ultrafine pattern collapse and forming favorable resist pattern in multilayer resist methods, and having appropriate etching rate in the processing. This finding has led to the completion of the present invention.

Specifically, the present invention is a composition for forming a silicon-containing resist underlayer film, comprising at least:

one or more kinds of a quaternary ammonium salt shown by a general formula (A-1) to be described below; and a thermally crosslinkable polysiloxane (Sx).

Hereinafter, the present invention will be described in detail, but the present invention is not limited thereto.

<Composition for Forming Resist Underlayer Film>

The inventive composition for forming a silicon-containing resist underlayer film contains at least: one or more kinds of a quaternary ammonium salt shown by the following general formula (A-1); and a thermally crosslinkable polysiloxane (Sx).

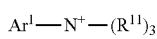

(A-1)

In the formula, $Ar^1$ represents an aromatic group having 6 to 20 carbon atoms optionally having a substituent, or a heteroaromatic group having 4 to 20 carbon atoms optionally having a substituent. $R^{11}$'s each independently represent a linear, branched, or cyclic alkyl group, alkenyl group, oxoalkyl group, or oxoalkenyl group having 1 to 12 carbon atoms, a substituted or unsubstituted aryl group having 6 to 20 carbon atoms, or an aralkyl group or aryloxoalkyl group having 7 to 12 carbon atoms. Some or all of hydrogen atoms of these groups are optionally substituted. Two of $R^{11}$'s are optionally bonded to each other to form a ring. Z represents an organic or inorganic anion as a counterion of the quaternary ammonium cation.

[Quaternary Ammonium Salt Shown by General Formula (A-1) or (A-2)]

The inventive composition for forming a silicon-containing resist underlayer film contains at least one or more kinds of the quaternary ammonium salt shown by the general formula (A-1). This quaternary ammonium salt functions as a crosslinking catalyst, and thereby promotes thermal curing, so that the formed silicon-containing resist underlayer film has appropriate composition and structure and sufficient etching rate for the processing. Presumably, the basicity of this quaternary ammonium salt is appropriately suppressed because the unshared electron pair of the nitrogen atom is delocalized in an aromatic ring directly bonded thereto, so that footing of an upper layer resist is suppressed; moreover, the surface of the formed silicon-containing resist underlayer film is in an appropriate state, so that pattern collapse of the upper layer resist is suppressed.

In the general formula, $Ar^1$ represents an aromatic group having 6 to 20 carbon atoms optionally having a substituent, or a heteroaromatic group having 4 to 20 carbon atoms optionally having a substituent. Specific examples of the aromatic group having 6 to 20 carbon atoms include a phenyl group, a naphthyl group, an anthracenyl group, a phenanthrenyl group, and a pyrenyl group. Specific examples of the heteroaromatic group having 4 to 20 carbon atoms include a furanyl group, a thiophenyl group, a pyrrolyl group, a benzofuranyl group, a pyridinyl group, an indolyl group, an oxazolyl group, an imidazolyl group, and a benzimidazolyl group. Examples of the optional substituent include a linear, branched, or cyclic saturated or unsaturated hydrocarbon group having 1 to 12 carbon atoms, an aromatic hydrocarbon group, a heteroaromatic group, an alkoxy group, a hydroxyl group, an ester group, a carbonyl group, an amino group, a halogen group, a sulfide group, a carboxyl group, a sulfo group, an amide group, an imide group, a cyano group, an aldehyde group, an imino group, a urea group, a carbamate group, a carbonate group, a nitro group, a sulfonyl group, and groups containing any combination of these groups.

In the general formula, $R^{11}$'s each independently represent a linear, branched, or cyclic alkyl group, alkenyl group, oxoalkyl group, or oxoalkenyl group having 1 to 12 carbon atoms, a substituted or unsubstituted aryl group having 6 to 20 carbon atoms, or an aralkyl group or aryloxoalkyl group having 7 to 12 carbon atoms. Some or all of hydrogen atoms of these groups are optionally substituted with an alkoxy group or the like. Examples of the alkyl group include a methyl group, an ethyl group, a propyl group, an isopropyl group, an n-butyl group, a sec-butyl group, a tert-butyl group, a pentyl group, a hexyl group, a heptyl group, an octyl group, a cyclopentyl group, a cyclohexyl group, a cycloheptyl group, a cyclopropylmethyl group, a 4-methylcyclohexyl group, a cyclohexylmethyl group, a norbornyl group, an adamantyl group, etc. Examples of the alkenyl group include a vinyl group, an allyl group, a propenyl group, a butenyl group, a hexenyl group, a cyclohexenyl group, etc. Examples of the oxoalkyl group include a 2-oxocyclopentyl group, a 2-oxocyclohexyl group, a 2-oxopropyl group, a 2-oxoethyl group, a 2-cyclopentyl-2-oxoethyl group, a 2-cyclohexyl-2-oxoethyl group, a 2-(4-methylcyclohexyl)-2-oxoethyl group, etc. Examples of the oxoalkenyl group include a 3-oxopropenyl group, etc. Examples of the aryl group include a phenyl group, a naphthyl group, a thienyl group, etc.; a 4-hydroxyphenyl group; alkoxyphenyl groups such as a 4-methoxyphenyl group, a 3-methoxyphenyl group, a 2-methoxyphenyl group, a 4-ethoxyphenyl group, a 4-tert-butoxyphenyl group, and a 3-tert-butoxyphenyl group; alkylphenyl groups such as a 2-methylphenyl group, a 3-methylphenyl group, a 4-methylphenyl group, a 4-ethylphenyl group, a 4-tert-butylphenyl group, a 4-n-butylphenyl group, and a 2,4-dimethylphenyl group; alkylnaphthyl groups such as a methylnaphthyl group and an ethylnaphthyl group; alkoxynaphthyl groups such as a methoxynaphthyl group, an ethoxynaphthyl group, an n-propoxynaphthyl group, and an n-butoxynaphthyl group; dialkylnaphthyl groups such as a dimethylnaphthyl group and a diethylnaphthyl group; dialkoxynaphthyl groups such as a dimethoxynaphthyl group and a diethoxynaphthyl group; etc. Examples of the aralkyl group include a benzyl group, a 1-phenylethyl group, a 2-phenylethyl group, etc. Examples of the aryloxoalkyl group include 2-aryl-2-oxoethyl groups such as a 2-phenyl-2-oxoethyl group, a 2-(1-naphthyl)-2-oxoethyl group, and a 2-(2-naphthyl)-2-oxoethyl group; etc. Examples of the alkoxy group include a methoxy group, an ethoxy group, and a t-butyloxy group. Additionally, two of $R^{11}$'s are optionally bonded to each other to form a ring. In this case, two $R^{11}$'s bond together to form a divalent group. Specific examples of the divalent group to be formed include a trimethylene group, a tetramethylene group, a pentamethylene group, a 3-oxapentamethylene group, and a 3-oxopentamethylene group.

In the general formula, Z represents an organic or inorganic anion as a counterion of the quaternary ammonium cation. Specific examples of the organic anion include formate, acetate, propionate, butyrate, hexanoate, benzoate, t-butylbenzoate, trichloroacetate, trifluoroacetate, 2-hydroxy-2,2-bis(trifluoromethyl)acetate, trimethylacetate, pentafluoropropionate, methanesulfonate, butanesulfonate, benzenesulfonate, toluenesulfonate, trifluoromethanesulfonate, and methylsulfate ions. Specific examples of the inorganic anion include chloride ion, bromide ion, iodide ion, fluoride ion, cyanide ion, nitrate ion, nitrite ion, and hydroxide ion.

In the present invention, one kind of the quaternary ammonium salt shown by the general formula (A-1) may be used alone, or two or more kinds thereof may be used in mixture. The quaternary ammonium salt shown by the general formula (A-1) is blended in an amount of preferably 0.01 to 50 parts by mass, more preferably 0.1 to 40 parts by mass, based on 100 parts by mass of a base polymer (Sx) to be described later.

More preferably, the quaternary ammonium salt shown by the general formula (A-1) is shown by the following general formula (A-2).

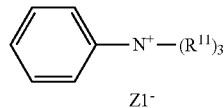

In the formula, each $R^{11}$ is as defined above. $Z1^-$ represents an organic or inorganic anion as a counterion of the quaternary ammonium cation. A conjugate acid Z1-H of the $Z1^-$ has a boiling point of 200° C. or less.

The counter ion $Z1^-$ of the quaternary ammonium salt shown by the general formula (A-2) is selected such that the conjugate acid Z1-H has a boiling point of 200° C. or less. When the conjugate acid has a boiling point of 200° C. or less, negative effect will not be exerted on the resist pattern collapse. The boiling point of the conjugate acid is not particularly limited, and is preferably −90° C. or more.

In the general formula (A-2), each $R^{11}$ is as defined above. $Z1^-$ represents an organic or inorganic anion serving as a counterion of the quaternary ammonium cation, and is characterized in that the boiling point of the conjugate acid Z1-H of $Z1^-$ is 200° C. or less. Specific examples of the $Z1^-$ include formate, acetate, propionate, butyrate, isobutyrate, trichloroacetate, trifluoroacetate, chlorodifluoroacetate, 2-hydroxy-2,2-bis(trifluoromethyl)acetate, trimethylacetate, pentafluoropropionate, perfluorobutyrate, methanesulfonate, trifluoromethanesulfonate, chloride ion, bromide ion, iodide ion, fluoride ion, cyanide ion, nitrate ion, nitrite ion, and hydroxide ion. Among these, trifluoroacetate, 2-hydroxy-2,2-bis(trifluoromethyl)acetate, pentafluoropropionate, chloride ion, bromide ion, iodide ion, and nitrate ion are more preferable in view of enhancing the effects of the present invention.

More specific examples of the quaternary ammonium salt shown by the general formula (A-1) or (A-2) include the following compounds, but are not limited thereto. In the following formulae, Me represents a methyl group, Et represents an ethyl group, and Ph represents a phenyl group. The same applies hereinafter.

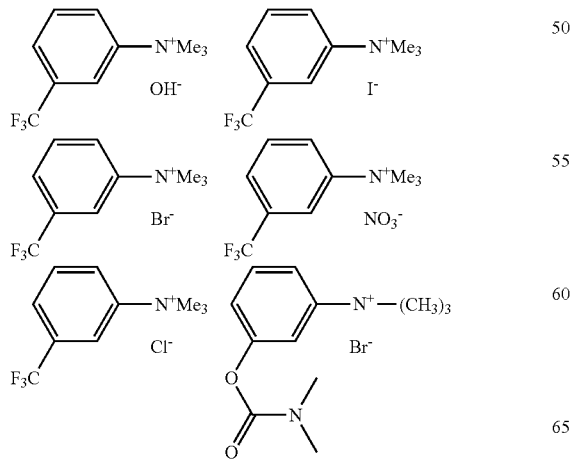

-continued

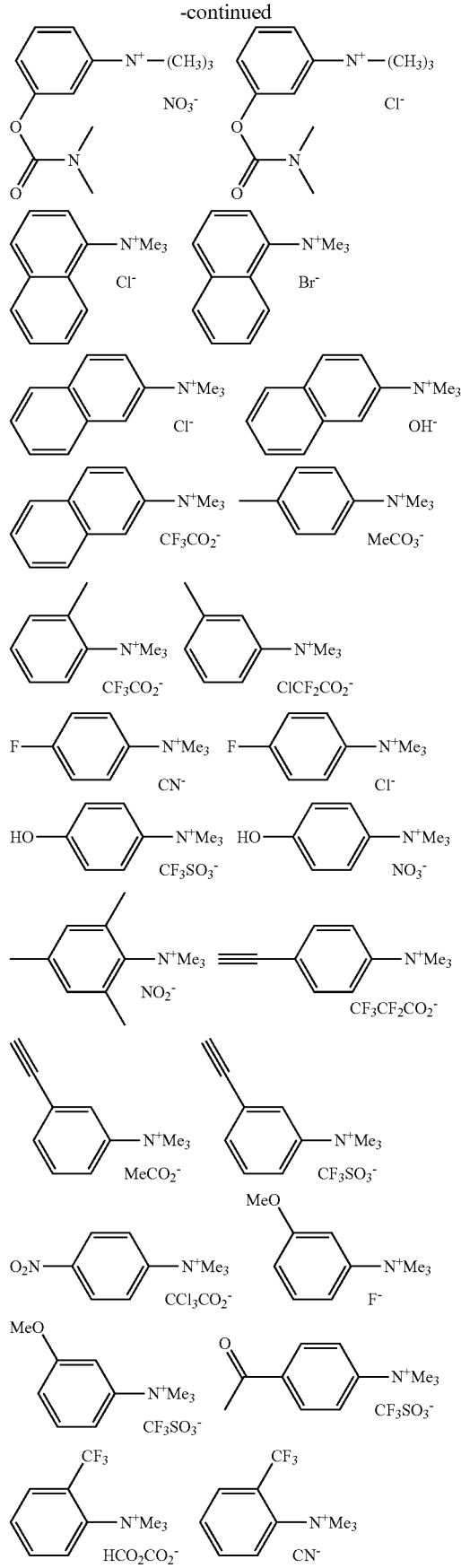

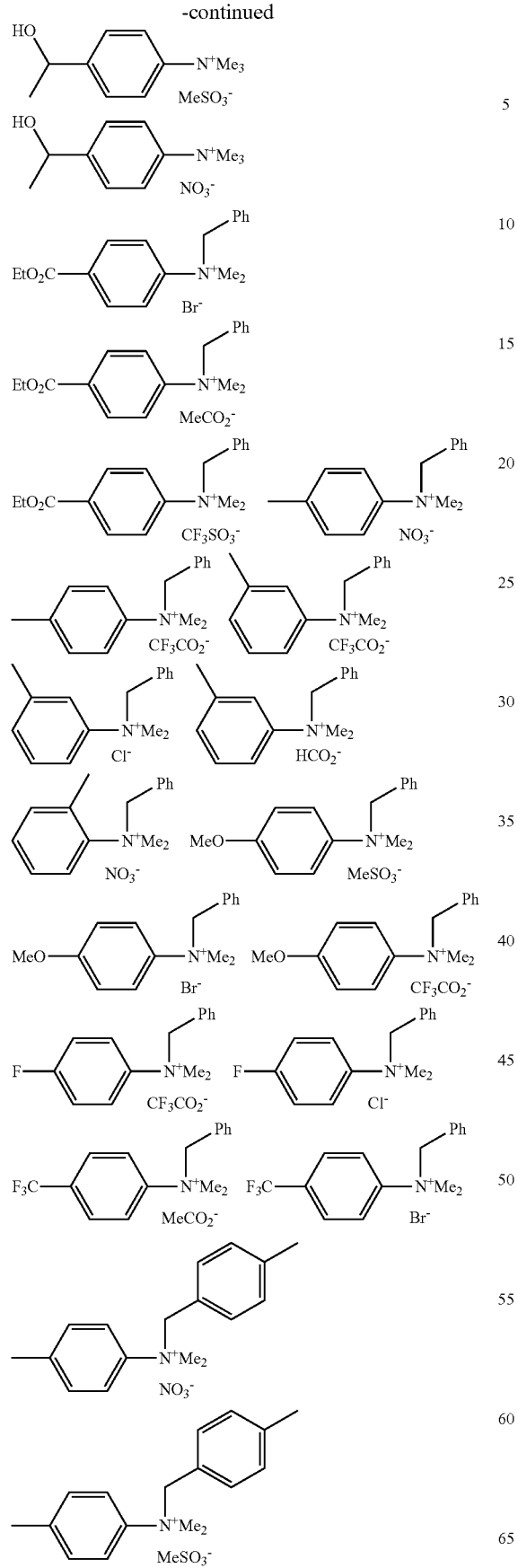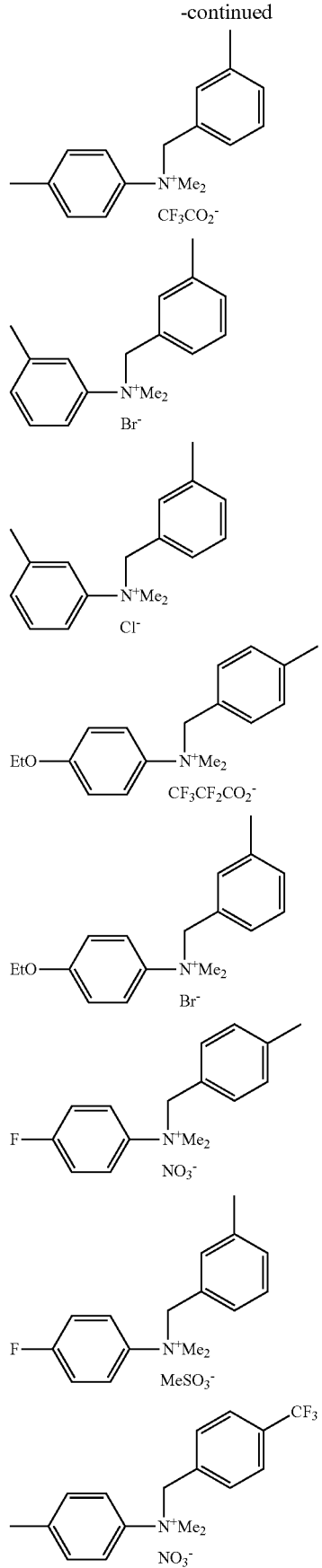

-continued

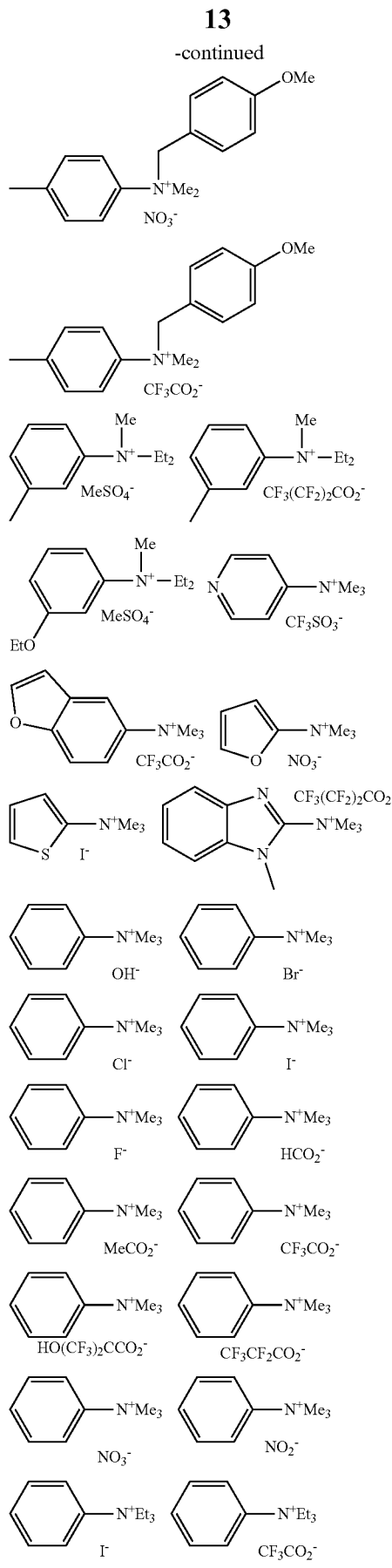

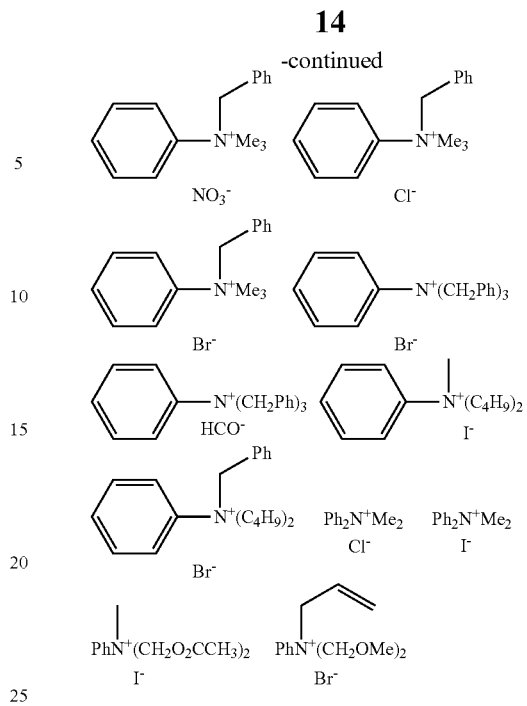

[Thermally Crosslinkable Polysiloxane (Sx)]

The inventive composition for forming a silicon-containing resist underlayer film contains a thermally crosslinkable polysiloxane (Sx), besides one or more kinds of the quaternary ammonium salt shown by the general formula (A-1) or (A-2).

The thermally crosslinkable polysiloxane (Sx) used in the present invention preferably contains any one or more of a repeating unit shown by the following general formula (Sx-1), a repeating unit shown by the following general formula (Sx-2), and a partial structure shown by the following general formula (Sx-3).

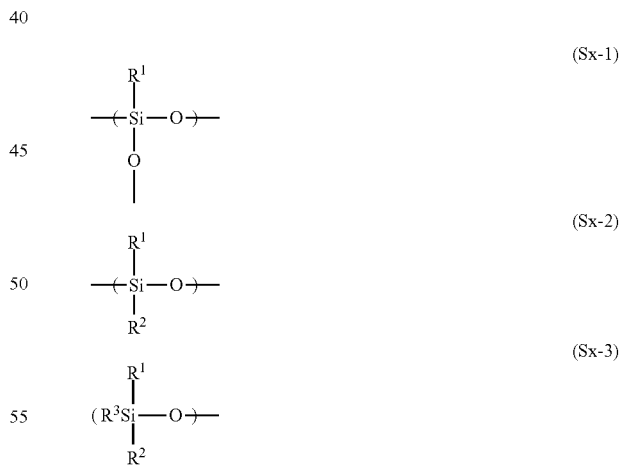

In the formulae, $R^1$, $R^2$, and $R^3$ are identical to or different from each other and each represent a monovalent organic group having 1 to 30 carbon atoms.

The thermally crosslinkable polysiloxane (Sx) can be produced by hydrolysis condensation of the following hydrolysable monomer (Sm).

Specific examples of the hydrolysable monomer (Sm) include tetramethoxysilane, tetraethoxysilane, tetrapropoxysilane, tetraisopropoxysilane, trimethoxysilane, triethoxysilane, tripropoxysilane, triisopropoxysilane, methyltrimethoxysilane, methyltriethoxysilane, methyltripropoxysilane, methyltriisopropoxysilane, ethyltrimethoxysilane, ethyltriethoxysilane, ethyltripropoxysilane, ethyltriisopropoxysilane, vinyltrimethoxysilane, vinyltriethoxysilane, vinyltripropoxysilane, vinyltriisopropoxysilane, propyltrimethoxysilane, propyltriethoxysilane, propyltripropoxysilane, propyltriisopropoxysilane, isopropyltrimethoxysilane, isopropyltriethoxysilane, isopropyltripropoxysilane, isopropyltriisopropoxysilane, butyltrimethoxysilane, butyltriethoxysilane, butyltripropoxysilane, butyltriisopropoxysilane, sec-butyltrimethoxysilane, sec-butyltriethoxysilane, sec-butyltripropoxysilane, sec-butyltri isopropoxysilane, t-butyltrimethoxysilane, t-butyltriethoxysilane, t-butyltripropoxysilane, t-butyltriisopropoxysilane, cyclopropyltrimethoxysilane, cyclopropyltriethoxysilane, cyclopropyltripropoxysilane, cyclopropyltriisopropoxysilane, cyclobutyltrimethoxysilane, cyclobutyltriethoxysilane, cyclobutyltripropoxysilane, cyclobutyltriisopropoxysilane, cyclopentyltrimethoxysilane, cyclopentyltriethoxysilane, cyclopentyltripropoxysilane, cyclopentyltriisopropoxysilane, cyclohexyltrimethoxysilane, cyclohexyltriethoxysilane, cyclohexyltripropoxysilane, cyclohexyltriisopropoxysilane, cyclohexenyltrimethoxysilane, cyclohexenyltriethoxysilane, cyclohexenyltripropoxysilane, cyclohexenyltriisopropoxysilane, cyclohexenylethyltrimethoxysilane, cyclohexenylethyltriethoxysilane, cyclohexenylethyltripropoxysilane, cyclohexenylethyltriisopropoxysilane, cyclooctyltrimethoxysilane, cyclooctyltriethoxysilane, cyclooctyltripropoxysilane, cyclooctyltriisopropoxysilane, cyclopentadienylpropyltrimethoxysilane, cyclopentadienylpropyltriethoxysilane, cyclopentadienylpropyltripropoxysilane, cyclopentadienylpropyltriisopropoxysilane, bicycloheptenyltrimethoxysilane, bicycloheptenyltriethoxysilane, bicycloheptenyltripropoxysilane, bicycloheptenyltriisopropoxysilane, bicycloheptyltrimethoxysilane, bicycloheptyltriethoxysilane, bicycloheptyltripropoxysilane, bicycloheptyltriisopropoxysilane, adamantyltrimethoxysilane, adamantyltriethoxysilane, adamantyltripropoxysilane, adamantyltrii sopropoxysilane, phenyltrimethoxysilane, phenyltriethoxysilane, phenyltripropoxysilane, phenyltri isopropoxysilane, benzyltrimethoxysilane, benzyltriethoxysilane, benzyltripropoxysilane, benzyltriisopropoxysilane, anisyltrimethoxysilane, anisyltriethoxysilane, anisyltripropoxysilane, anisyltriisopropoxysilane, tolyltrimethoxysilane, tolyltriethoxysilane, tolyltripropoxysilane, tolyltriisopropoxysilane, phenethyltrimethoxysilane, phenethyltriethoxysilane, phenethyltripropoxysilane, phenethyltriisopropoxysilane, naphthyltrimethoxysilane, naphthyltriethoxysilane, naphthyltripropoxysilane, naphthyltriisopropoxysilane, dimethyldimethoxysilane, dimethyldiethoxysilane, methylethyldimethoxysilane, methylethyldiethoxysilane, dimethyldipropoxysilane, dimethyldiisopropoxysilane, diethyldimethoxysilane, diethyldiethoxysilane, diethyldipropoxysilane, diethyldiisopropoxysilane, dipropyldimethoxysilane, dipropyldiethoxysilane, dipropyldipropoxysilane, dipropyldiisopropoxysilane, diisopropyldimethoxysilane, diisopropyldiethoxysilane, diisopropyldipropoxysilane, diisopropyldiisopropoxysilane, dibutyldimethoxysilane, dibutyldiethoxysilane, dibutyldipropoxysilane, dibutyldiisopropoxysilane, di-sec-butyldimethoxysilane, di-sec-butyldiethoxysilane, di-sec-butyldipropoxysilane, di-sec-butyldiisopropoxysilane, di-t-butyldimethoxysilane, di-t-butyldiethoxysilane, di-t-butyldipropoxysilane, di-t-butyldiisopropoxysilane, dicyclopropyldimethoxysilane, dicyclopropyldiethoxysilane, dicyclopropyldipropoxysilane, dicyclopropyldiisopropoxysilane, dicyclobutyldimethoxysilane, dicyclobutyldiethoxysilane, dicyclobutyldipropoxysilane, dicyclobutyldiisopropoxysilane, dicyclopentyldimethoxysilane, dicyclopentyldiethoxysilane, dicyclopentyldipropoxysilane, dicyclopentyldiisopropoxysilane, dicyclohexyldimethoxysilane, dicyclohexyldiethoxysilane, dicyclohexyldipropoxysilane, dicyclohexyldiisopropoxysilane, dicyclohexenyldimethoxysilane, dicyclohexenyldiethoxysilane, dicyclohexenyldipropoxysilane, dicyclohexenyldiisopropoxysilane, dicyclohexenylethyldimethoxysilane, dicyclohexenylethyldiethoxysilane, dicyclohexenylethyldipropoxysilane, dicyclohexenylethyldiisopropoxysilane, dicyclooctyldimethoxysilane, dicyclooctyldiethoxysilane, dicyclooctyldipropoxysilane, dicyclooctyldiisopropoxysilane, dicyclopentadienylpropyldimethoxysilane, dicyclopentadienylpropyldiethoxysilane, dicyclopentadienylpropyldipropoxysilane, dicyclopentadienylpropyldiisopropoxysilane, bis(bicycloheptenyl)dimethoxysilane, bis(bicycloheptenyl)diethoxysilane, bis(bicycloheptenyl)dipropoxysilane, bis(bicycloheptenyl)diisopropoxysilane, bis(bicycloheptyl)dimethoxysilane, bis(bicycloheptyl)diethoxysilane, bis(bicycloheptyl)dipropoxysilane, bis(bicycloheptyl)diisopropoxysilane, diadamantyldimethoxysilane, diadamantyldiethoxysilane, diadamantyldipropoxysilane, diadamantyldiisopropoxysilane, diphenyldimethoxysilane, diphenyldiethoxysilane, methylphenyldimethoxysilane, methylphenyldiethoxysilane, diphenyldipropoxysilane, diphenyldiisopropoxysilane, trimethylmethoxysilane, trimethylethoxysilane, dimethylethylmethoxysilane, dimethylethylethoxysilane, dimethylphenylmethoxysilane, dimethylphenylethoxysilane, dimethylbenzylmethoxysilane, dimethylbenzylethoxysilane, dimethylphenethylmethoxysilane, dimethylphenethylethoxysilane, etc.

Preferable examples of the compound include tetramethoxysilane, tetraethoxysilane, methyltrimethoxysilane, methyltriethoxysilane, ethyltrimethoxysilane, ethyltriethoxysilane, vinyltrimethoxysilane, vinyltriethoxysilane, propyltrimethoxysilane, propyltriethoxysilane, isopropyltrimethoxysilane, isopropyltriethoxysilane, butyltrimethoxysilane, butyltriethoxysilane, isobutyltrimethoxysilane, isobutyltriethoxysilane, allyltrimethoxysilane, allyltriethoxysilane, cyclopentyltrimethoxysilane, cyclopentyltriethoxysilane, cyclohexyltrimethoxysilane, cyclohexyltriethoxysilane, cyclohexenyltrimethoxysilane, cyclohexenyltriethoxysilane, phenyltrimethoxysilane, phenyltriethoxysilane, benzyltrimethoxysilane, benzyltriethoxysilane, phenethyltrimethoxysilane, phenethyltriethoxysilane, dimethyldimethoxysilane, dimethyldiethoxysilane, diethyldimethoxysilane, diethyldiethoxysilane, methylethyldimethoxysilane, methylethyldiethoxysilane, dipropyldimethoxysilane, dibutyldimethoxysilane, methylphenyldimethoxysilane, methylphenyldiethoxysilane, trimethylmethoxysilane, dimethylethylmethoxysilane, dimethylphenylmethoxysilane, dimethylbenzylmethoxysilane, dimethylphenethylmethoxysilane, etc.

Other examples of the organic group represented by $R^1$, $R^2$, and $R^3$, which correspond to the compounds exemplified above as the hydrolysable monomer (Sm), include organic groups having one or more carbon-oxygen single bonds or carbon-oxygen double bonds, specifically organic groups having one or more groups selected from the group consisting of an ether group (bond), an ester group (bond), an alkoxy group, and a hydroxy group. Examples of the organic groups include ones shown by the following general formula (Sm-R).

$$(P\text{-}Q_1\text{-}(S_1)_{v1}\text{-}Q_2\text{-})_u\text{-}(T)_{v2}\text{-}Q_3\text{-}(S_2)_{v3}\text{-}Q_4\text{-} \quad \text{(Sm-R)}$$

In the general formula (Sm-R), P represents a hydrogen atom, a cyclic ether group, a hydroxyl group, an alkoxy group having 1 to 4 carbon atoms, an alkylcarbonyloxy group having 1 to 6 carbon atoms, or an alkylcarbonyl group having 1 to 6 carbon atoms; $Q_1$, $Q_2$, $Q_3$, and $Q_4$ each independently represent $-C_qH_{(2q-p)}P_p-$, where P is as defined above, "p" represents an integer of 0 to 3, and "q" represents an integer of 0 to 10, provided that q=0 means a single bond; "u" represents an integer of 0 to 3; $S_1$ and $S_2$ each independently represent $-O-$, $-CO-$, $-OCO-$, $-COO-$, or $-OCOO-$. v1, v2, and v3 each independently represent 0 or 1. T represents a divalent atom other than carbon, or a divalent group of an alicyclic, aromatic, or heterocyclic ring. As T, examples of the alicyclic, aromatic, or heterocyclic ring optionally containing a hetero-atom such as an oxygen atom are shown below. In T, positions bonded to $Q_2$ and $Q_3$ are not particularly limited, and can be selected appropriately in consideration of reactivity dependent on steric factors, availability of commercial reagents used in the reaction, and so on.

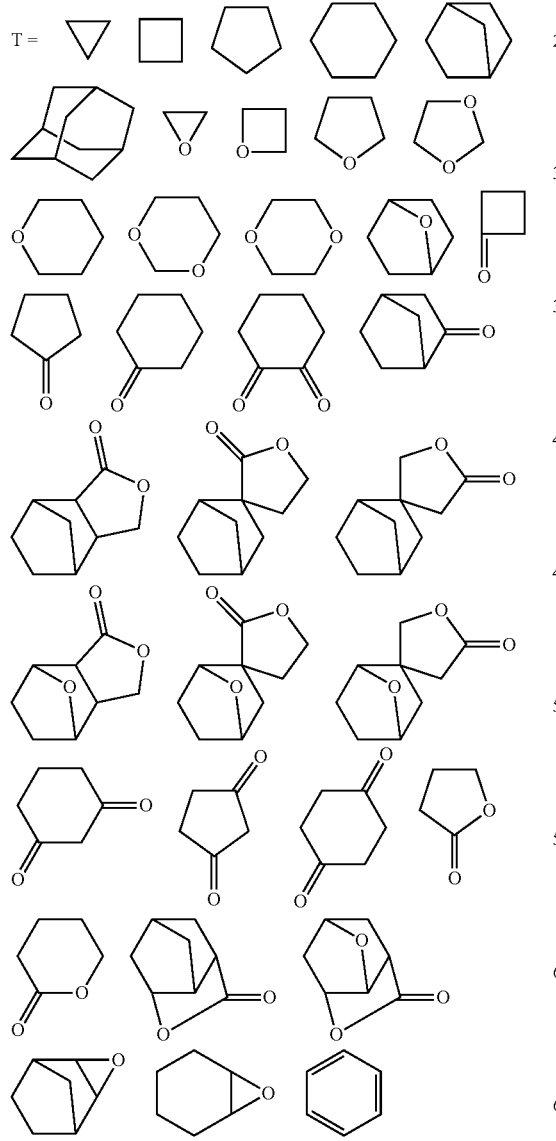

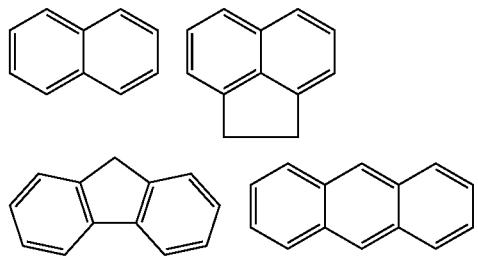

Preferable examples of the organic groups having one or more carbon-oxygen single bonds or carbon-oxygen double bonds in the general formula (Sm-R) include the following. Note that, in the following formulae, (Si) is depicted to show a bonding site to Si.

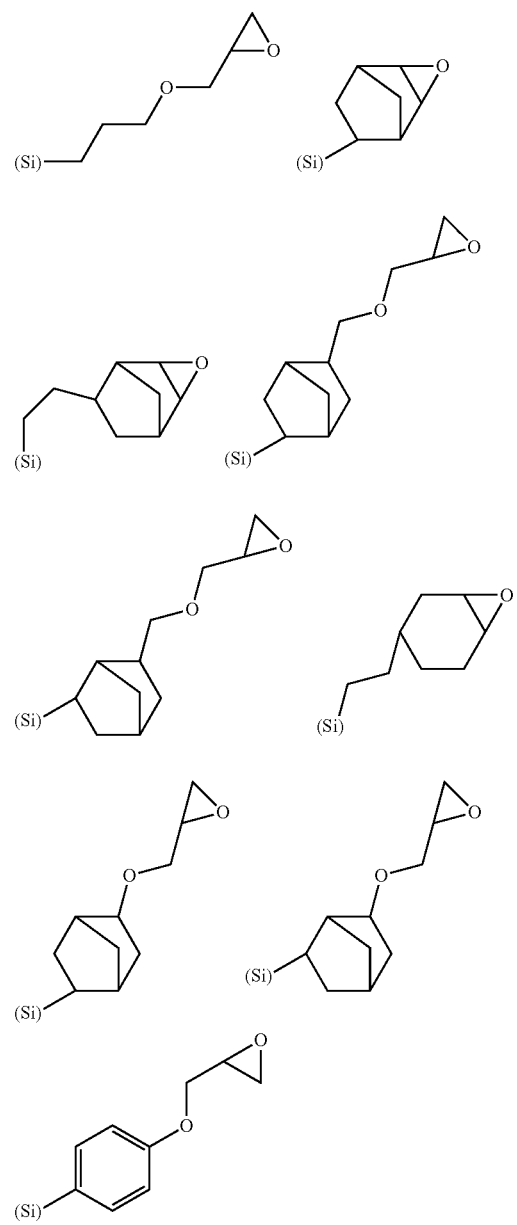

-continued
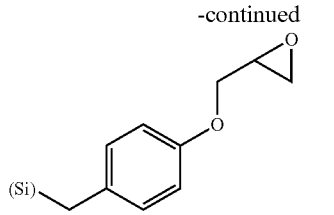
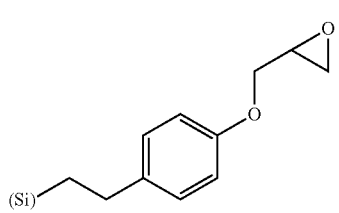
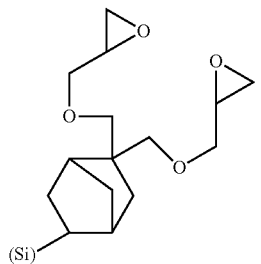
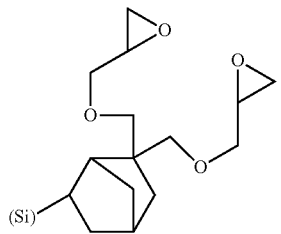
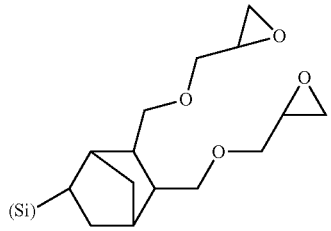
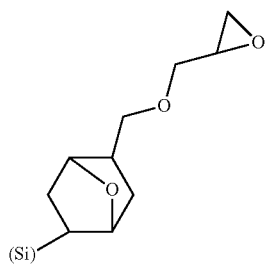
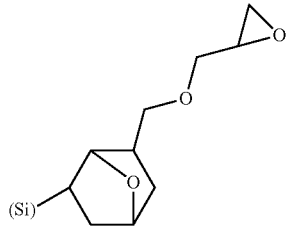
-continued
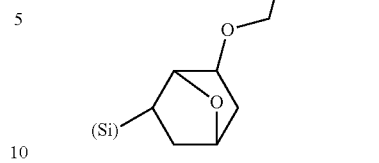
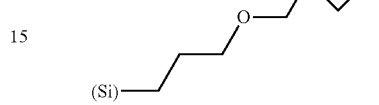
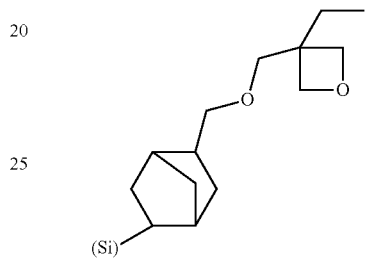
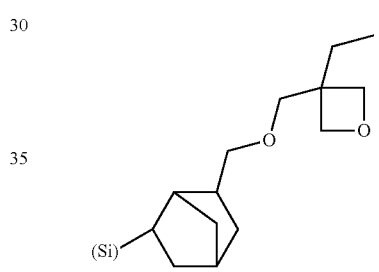
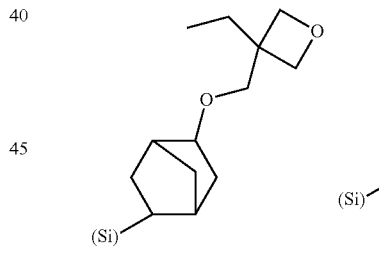
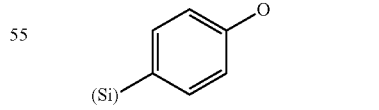
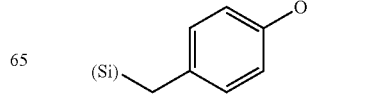

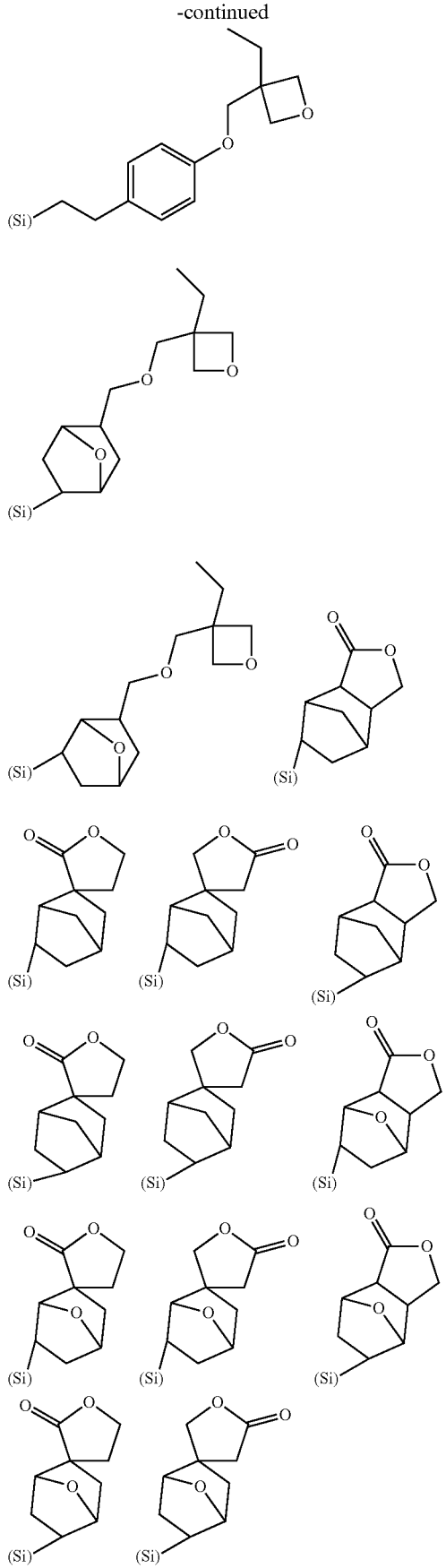

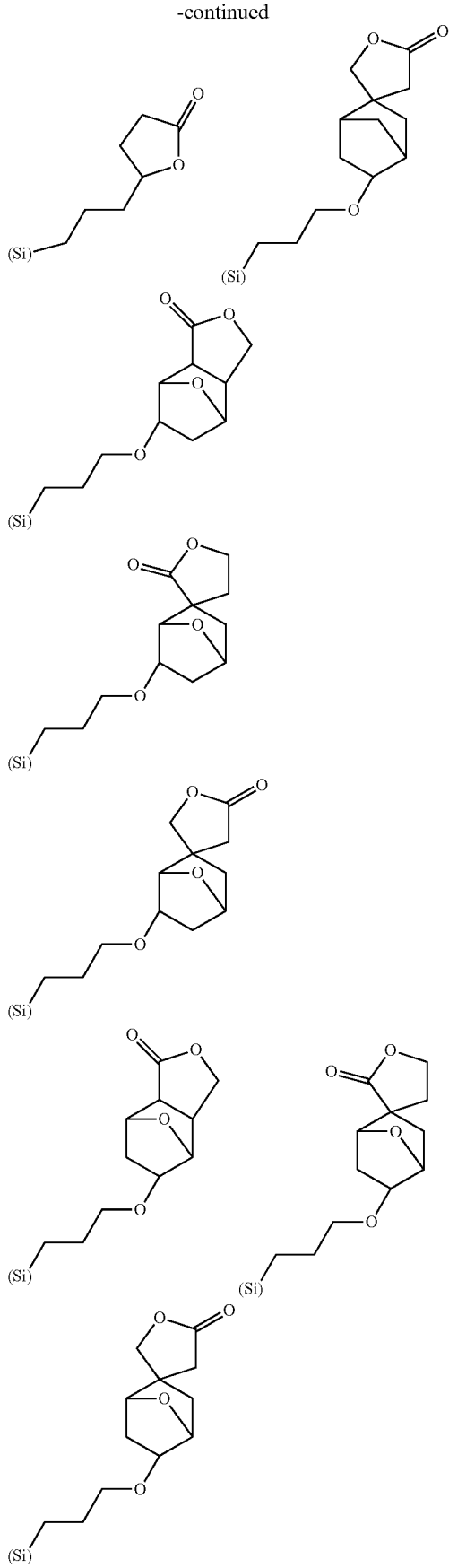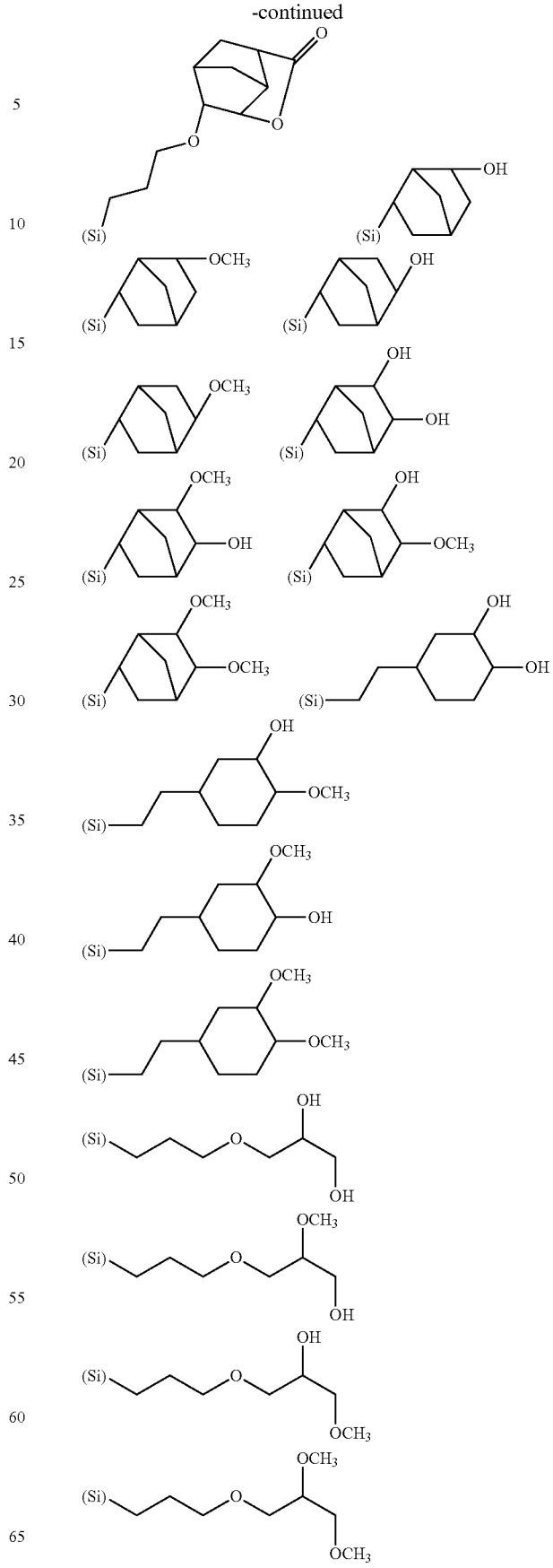

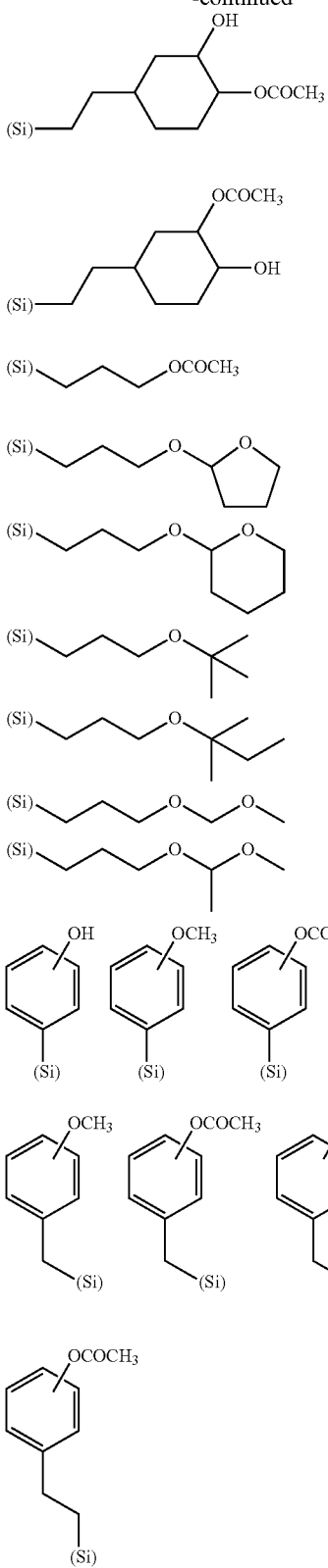

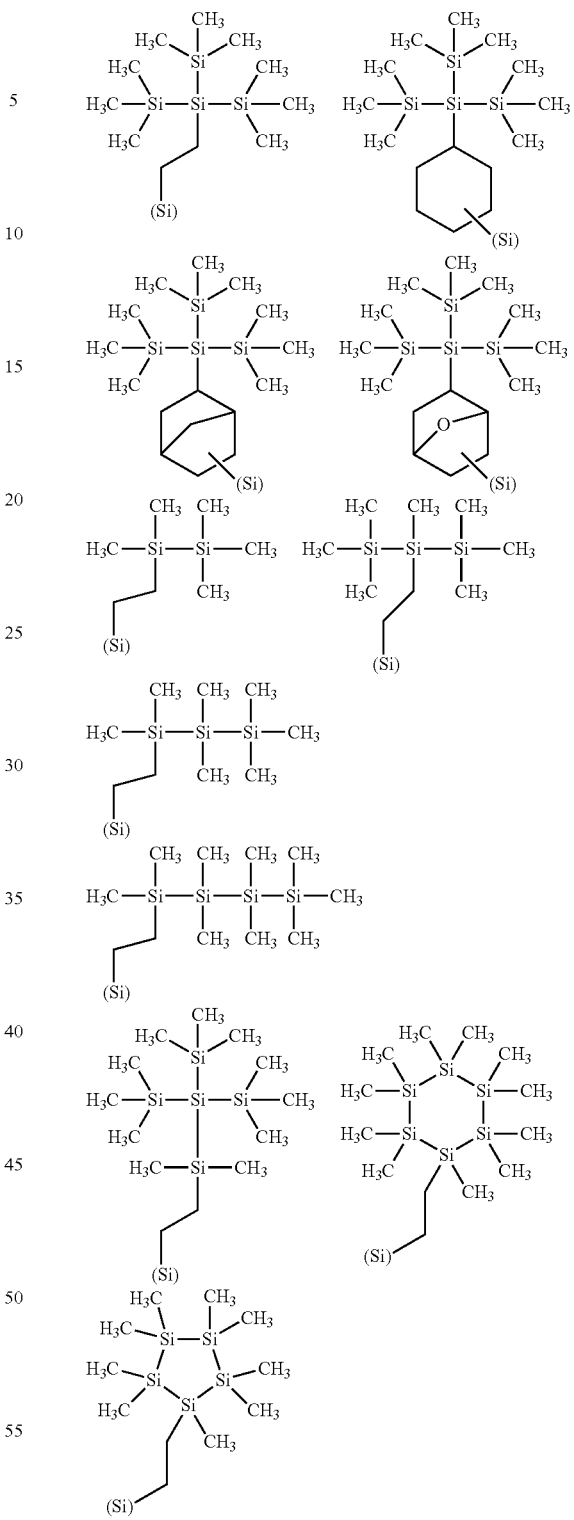

Moreover, as an example of the organic group of $R^1$, $R^2$, and $R^3$, an organic group containing a silicon-silicon bond can also be used. Specific examples thereof include the following.

Moreover, as an example of the organic group of $R^1$, $R^2$, and $R^3$, an organic group having a protective group that is decomposed with an acid can also be used. Specific examples thereof include organic groups shown from paragraphs (0043) to (0048) of JP 2013-167669 A, and organic groups obtained from silicon compounds shown in paragraph (0056) of JP 2013-224279A.

Further, as an example of the organic group of $R^1$, $R^2$, and $R^3$, an organic group having a fluorine atom can also be used. Specific examples thereof include organic groups obtained from silicon compounds shown from paragraphs (0059) to (0065) of JP 2012-53253A.

In the hydrolysable monomer (Sm), one, two, or three among chlorine, bromine, iodine, an acetoxy group, a methoxy group, an ethoxy group, a propoxy group, a butoxy group, and so forth are bonded as a hydrolysable group(s) on silicon shown by (Si) in the partial structure.

[Method for Synthesizing Thermally Crosslinkable Polysiloxane (Sx)]

(Synthesis Method 1: Acid Catalyst)

The inventive thermally crosslinkable polysiloxane (Sx) can be produced by hydrolysis condensation of one of the hydrolysable monomers (Sm) or a mixture of two or more kinds thereof in the presence of an acid catalyst.

Examples of the acid catalyst used in this event include organic acids such as formic acid, acetic acid, oxalic acid, maleic acid, methanesulfonic acid, benzenesulfonic acid, and toluenesulfonic acid; and inorganic acids such as hydrofluoric acid, hydrochloric acid, hydrobromic acid, sulfuric acid, nitric acid, perchloric acid, and phosphoric acid. The catalyst can be used in an amount of $1\times10^{-6}$ to 10 mol, preferably $1\times10^{-5}$ to 5 mol, more preferably $1\times10^{-4}$ to 1 mol, relative to 1 mol of the monomer.

When the thermally crosslinkable polysiloxane (Sx) is obtained from these monomers by the hydrolysis condensation, water is preferably added in an amount of 0.01 to 100 mol, more preferably 0.05 to 50 mol, further preferably 0.1 to 30 mol, per mol of the hydrolysable substituent bonded to the monomer. When the amount is 100 mol or less, a reaction device can be made small and economical.

As the operation method, the monomer is added to a catalyst aqueous solution to start the hydrolysis condensation reaction. In this event, an organic solvent may be added to the catalyst aqueous solution, or the monomer may be diluted with an organic solvent, or both of these operations may be performed. The reaction temperature may be 0 to 100° C., preferably 5 to 80° C. As a preferable method, when the monomer is added dropwise, the temperature is maintained at 5 to 80° C., and then the mixture is aged at 20 to 80° C.

The organic solvent which can be added to the catalyst aqueous solution or with which the monomer can be diluted is preferably methanol, ethanol, 1-propanol, 2-propanol, 1-butanol, 2-butanol, 2-methyl-1-propanol, acetone, acetonitrile, tetrahydrofuran, toluene, hexane, ethyl acetate, methyl ethyl ketone, methyl isobutyl ketone, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, t-butyl propionate, propylene glycol mono-t-butyl ether acetate, γ-butyrolactone, mixtures thereof, etc.

Among these solvents, water-soluble solvents are preferable. Examples thereof include alcohols such as methanol, ethanol, 1-propanol, and 2-propanol; polyhydric alcohols such as ethylene glycol and propylene glycol; polyhydric alcohol condensate derivatives such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, and ethylene glycol monopropyl ether; acetone, acetonitrile, tetrahydrofuran, etc. Among these, particularly preferable is one having a boiling point of 100° C. or less.

Note that the organic solvent is used in an amount of preferably 0 to 1,000 ml, particularly preferably 0 to 500 ml, relative to 1 mol of the monomer. When the organic solvent is used in a small amount, only a small reaction vessel is required and economical.

Then, if necessary, neutralization reaction of the catalyst is carried out to obtain a reaction mixture aqueous solution. In this event, the amount of an alkaline substance usable for the neutralization is preferably 0.1 to 2 equivalents relative to the acid used as the catalyst. This alkaline substance may be any substance as long as it shows alkalinity in water.

Subsequently, by-products such as alcohol produced by the hydrolysis condensation reaction are desirably removed from the reaction mixture by a procedure such as removal under reduced pressure. In this event, the reaction mixture is heated at a temperature of preferably 0 to 100° C., more preferably 10 to 90° C., further preferably 15 to 80° C., although the temperature depends on the kinds of the added organic solvent, the alcohol produced in the reaction, and so forth. Additionally, in this event, the degree of vacuum is preferably atmospheric pressure or less, more preferably 80 kPa or less in absolute pressure, further preferably 50 kPa or less in absolute pressure, although the degree of vacuum varies depending on the kinds of the organic solvent, alcohol, etc. to be removed, as well as exhausting equipment, condensation equipment, and heating temperature. In this case, it is difficult to accurately know the amount of alcohol to be removed, but it is desirable to remove about 80 mass % or more of the produced alcohol, etc.

Next, the acid catalyst used in the hydrolysis condensation may be removed from the reaction mixture. As a method for removing the acid catalyst, the thermally crosslinkable polysiloxane solution is mixed with water, and the thermally crosslinkable polysiloxane is extracted with an organic solvent. Preferably, the organic solvent used in this event is capable of dissolving the thermally crosslinkable polysiloxane and achieves two-layer separation when mixed with water. Examples of the organic solvent include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, cyclopentyl methyl ether, mixtures thereof, etc.

Further, it is also possible to use a mixture of a water-soluble organic solvent and a slightly-water-soluble organic solvent. Preferable examples of the mixture include methanol-ethyl acetate mixture, ethanol-ethyl acetate mixture, 1-propanol-ethyl acetate mixture, 2-propanol-ethyl acetate mixture, butanediol monomethyl ether-ethyl acetate mixture, propylene glycol monomethyl ether-ethyl acetate mixture, ethylene glycol monomethyl ether-ethyl acetate mixture, butanediol monoethyl ether-ethyl acetate mixture, propylene glycol monoethyl ether-ethyl acetate mixture, ethylene glycol monoethyl ether-ethyl acetate mixture, butanediol monopropyl ether-ethyl acetate mixture, propylene glycol monopropyl ether-ethyl acetate mixture, ethylene glycol monopropyl ether-ethyl acetate mixture, methanol-methyl isobutyl ketone mixture, ethanol-methyl isobutyl ketone mixture, 1-propanol-methyl isobutyl ketone mixture, 2-propanol-methyl isobutyl ketone mixture, propylene glycol monomethyl ether-methyl isobutyl ketone mixture, ethylene glycol monomethyl ether-methyl isobutyl ketone mixture, propylene glycol monoethyl ether-methyl isobutyl ketone mixture, ethylene glycol monoethyl ether-methyl isobutyl ketone mixture, propylene glycol monopropyl ether-methyl isobutyl ketone mixture, ethylene glycol monopropyl ether-methyl isobutyl ketone mixture, methanol-cyclopentyl methyl ether mixture, ethanol-cyclopentyl methyl ether mixture, 1-propanol-cyclopentyl methyl ether mixture, 2-propanol-cyclopentyl methyl ether mixture, propylene glycol monomethyl ether-cyclopentyl methyl ether mixture, ethylene glycol monomethyl ether-cyclopentyl methyl ether mixture, propylene glycol monoethyl ether-cyclopentyl methyl ether mixture, ethylene glycol monoethyl ether-cyclopentyl methyl ether mixture, propylene glycol monopropyl ether-cyclopentyl methyl ether mixture, ethylene glycol monopropyl ether-cyclopentyl methyl ether mixture, methanol-propylene glycol methyl ether acetate mixture, ethanol-propylene glycol methyl ether acetate mixture, 1-propanol-propylene glycol methyl ether acetate mixture, 2-propanol-propylene glycol methyl ether acetate mixture, propylene glycol monomethyl ether-propylene glycol methyl ether acetate mixture, ethylene glycol monomethyl ether-propylene glycol methyl ether acetate mixture, propylene glycol monoethyl ether-propylene glycol methyl ether acetate mixture, ethylene glycol monoethyl ether-propylene glycol methyl ether acetate mixture, propylene glycol monopropyl ether-propylene glycol methyl ether acetate mixture, ethylene glycol monopropyl ether-propylene glycol methyl ether acetate mixture, etc. However, the combination is not limited thereto.

Although the mixing ratio of the water-soluble organic solvent and the slightly-water-soluble organic solvent is appropriately selected, the amount of the water-soluble organic solvent may be 0.1 to 1,000 parts by mass, preferably 1 to 500 parts by mass, further preferably 2 to 100 parts by mass, based on 100 parts by mass of the slightly-water-soluble organic solvent.

Subsequently, the thermally crosslinkable polysiloxane may be washed with neutral water. As the water, what is commonly called deionized water or ultrapure water may be used. The amount of the water may be 0.01 to 100 L, preferably 0.05 to 50 L, more preferably 0.1 to 5 L, relative to 1 L of the thermally crosslinkable polysiloxane solution. This washing procedure may be performed by putting both the thermally crosslinkable polysiloxane and water into the same container, followed by stirring and then leaving to stand to separate the aqueous layer. The washing may be performed once or more, preferably once to approximately five times because washing ten times or more does not always produce the full washing effects thereof.

Other methods for removing the acid catalyst include a method using an ion-exchange resin, and a method in which the acid catalyst is removed after neutralization with an epoxy compound such as ethylene oxide and propylene oxide. These methods can be appropriately selected in accordance with the acid catalyst used in the reaction.

In this water-washing operation, a part of the thermally crosslinkable polysiloxane escapes into the aqueous layer, so that substantially the same effect as fractionation operation is obtained in some cases. Hence, the number of water-washing operations and the amount of washing water may be appropriately determined in view of the catalyst removal effect and the fractionation effect.

To a solution of either the thermally crosslinkable polysiloxane with the acid catalyst still remaining or the thermally crosslinkable polysiloxane with the acid catalyst having been removed, a final solvent may be added for solvent exchange under reduced pressure. Thus, a desired thermally crosslinkable polysiloxane solution is obtained. The temperature during this solvent exchange is preferably 0 to 100° C., more preferably 10 to 90° C., further preferably 15 to 80° C., depending on the kinds of the reaction solvent and the extraction solvent to be removed. Moreover, the degree of vacuum in this event is preferably atmospheric pressure or less, more preferably 80 kPa or less in absolute pressure, further preferably 50 kPa or less in absolute pressure, although the degree of vacuum varies depending on the kinds of the extraction solvent to be removed, exhausting equipment, condensation equipment, and heating temperature.

In this event, the thermally crosslinkable polysiloxane may become unstable by the solvent exchange. This occurs due to incompatibility of the thermally crosslinkable polysiloxane with the final solvent. Thus, in order to prevent this phenomenon, a monohydric, dihydric, or polyhydric alcohol having cyclic ether substituent as shown in paragraphs (0181) to (0182) of JP 2009-126940A may be added as a stabilizer. The alcohol may be added in an amount of 0 to 25 parts by mass, preferably 0 to 15 parts by mass, more preferably 0 to 5 parts by mass, based on 100 parts by mass of the thermally crosslinkable polysiloxane in the solution before the solvent exchange. When the alcohol is added, the amount is preferably 0.5 parts by mass or more. If necessary, the monohydric, dihydric, or polyhydric alcohol having cyclic ether substituent may be added to the solution before the solvent exchange operation.

If the thermally crosslinkable polysiloxane is concentrated above a certain concentration level, the condensation reaction may further progress, so that the thermally crosslinkable polysiloxane becomes no longer soluble in an organic solvent. Thus, it is preferable to maintain the solution state with a proper concentration. Meanwhile, if the concentration is too low, the amount of solvent is excessive. Hence, the solution state with a proper concentration is economical and preferable. The concentration in this state is preferably 0.1 to 20 mass %.

The final solvent added to the thermally crosslinkable polysiloxane solution is preferably an alcohol-based solvent, particularly preferably monoalkyl ether derivatives of ethylene glycol, diethylene glycol, triethylene glycol, propylene glycol, dipropylene glycol, butanediol, and so on. Specifically, preferable examples thereof include butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, diacetone alcohol, etc.

When these solvents are used as the main component, a non-alcohol-based solvent can also be added as an adjuvant solvent. Examples of the adjuvant solvent include acetone, tetrahydrofuran, toluene, hexane, ethyl acetate, cyclohexanone, methyl amyl ketone, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, cyclopentyl methyl ether, etc.

As an alternative reaction operation using an acid catalyst, water or a water-containing organic solvent is added to the monomer or an organic solution of the monomer to start the hydrolysis reaction. In this event, the catalyst may be added to the monomer or the organic solution of the monomer, or may be added to the water or the water-containing organic solvent. The reaction temperature may be 0 to 100° C., preferably 10 to 80° C. As a preferable method, when the water is added dropwise, the mixture is heated to 10 to 50° C., and then further heated to 20 to 80° C. for the aging.

When the organic solvent is used, a water-soluble solvent is preferable. Examples thereof include methanol, ethanol, 1-propanol, 2-propanol, 1-butanol, 2-butanol, 2-methyl-1-propanol, acetone, tetrahydrofuran, acetonitrile; polyhydric alcohol condensate derivatives such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether; mixtures thereof, etc.

The organic solvent is used in an amount of preferably 0 to 1,000 ml, particularly preferably 0 to 500 ml, relative to 1 mol of the monomer. When the organic solvent is used in a small amount, only a small reaction vessel is required and economical. The obtained reaction mixture may be subjected to post-treatment by the same procedure as mentioned above to obtain a thermally crosslinkable polysiloxane.

(Synthesis Method 2: Alkali Catalyst)

Alternatively, the thermally crosslinkable polysiloxane (Sx) can be produced by hydrolysis condensation of one of the hydrolysable monomers (Sm) or a mixture of two or more kinds thereof in the presence of an alkali catalyst. Examples of the alkali catalyst used in this event include methylamine, ethylamine, propylamine, butylamine, ethylenediamine, hexamethylenediamine, dimethylamine, diethylamine, ethylmethylamine, trimethylamine, triethylamine, tripropylamine, tributylamine, cyclohexylamine, dicyclohexylamine, monoethanolamine, diethanolamine, dimethyl monoethanolamine, monomethyl diethanolamine, triethanolamine, diazabicyclooctane, diazabicyclocyclononene, diazabicycloundecene, hexamethylenetetramine, aniline, N,N-dimethylaniline, pyridine, N,N-dimethylaminopyridine, pyrrole, piperazine, pyrrolidine, piperidine, picoline, tetramethylammonium hydroxide, choline hydroxide, tetrapropylammonium hydroxide, tetrabutylammonium hydroxide, ammonia, lithium hydroxide, sodium hydroxide, potassium hydroxide, barium hydroxide, calcium hydroxide, etc. The catalyst can be used in an amount of $1 \times 10^{-6}$ mol to 10 mol, preferably $1 \times 10^{-5}$ mol to 5 mol, more preferably $1 \times 10^{-4}$ mol to 1 mol, relative to 1 mol of the silicon monomer.

When the thermally crosslinkable polysiloxane is obtained from the monomer by the hydrolysis condensation, water is preferably added in an amount of 0.1 to 50 mol per mol of the hydrolysable substituent bonded to the monomer. When the amount is 50 mol or less, a reaction device can be made small and economical.

As the operation method, the monomer is added to a catalyst aqueous solution to start the hydrolysis condensation reaction. In this event, an organic solvent may be added to the catalyst aqueous solution, or the monomer may be diluted with an organic solvent, or both of these operations may be performed. The reaction temperature may be 0 to 100° C., preferably 5 to 80° C. As a preferable method, when the monomer is added dropwise, the temperature is maintained at 5 to 80° C., and then the mixture is aged at 20 to 80° C.

As the organic solvent which can be added to the alkali catalyst aqueous solution or with which the monomer can be diluted, the same organic solvents exemplified as the organic solvents which can be added to the acid catalyst aqueous solution are preferably used. Note that the organic solvent is used in an amount of preferably 0 to 1,000 ml relative to 1 mol of the monomer because the reaction can be performed economically.

Then, if necessary, neutralization reaction of the catalyst is carried out to obtain a reaction mixture aqueous solution. In this event, the amount of an acidic substance usable for the neutralization is preferably 0.1 to 2 equivalents relative to the alkaline substance used as the catalyst. This acidic substance may be any substance as long as it shows acidity in water.

Subsequently, by-products such as alcohol produced by the hydrolysis condensation reaction are desirably removed from the reaction mixture by a procedure such as removal under reduced pressure. In this event, the reaction mixture is heated at a temperature of preferably 0 to 100° C., more preferably 10 to 90° C., further preferably 15 to 80° C., although the temperature depends on the kinds of the added organic solvent and alcohol produced in the reaction. Moreover, the degree of vacuum in this event is preferably atmospheric pressure or less, more preferably 80 kPa or less in absolute pressure, further preferably 50 kPa or less in absolute pressure, although the degree of vacuum varies depending on the kinds of the organic solvent and alcohol to be removed, as well as exhausting equipment, condensation equipment, and heating temperature. In this case, it is difficult to accurately know the amount of alcohol to be removed, but it is desirable to remove about 80 mass % or more of the produced alcohol.

Next, to remove the alkali catalyst used in the hydrolysis condensation, the thermally crosslinkable polysiloxane may be extracted with an organic solvent. Preferably, the organic solvent used in this event is capable of dissolving the thermally crosslinkable polysiloxane and achieves two-layer separation when mixed with water. Examples of the organic solvent include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl amyl ketone, propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, cyclopentyl methyl ether, mixtures thereof, etc.

Further, a mixture of a water-soluble organic solvent and a slightly-water-soluble organic solvent can also be used.

As concrete examples of the organic solvent used for removing the alkali catalyst, it is possible to use the aforementioned organic solvents specifically exemplified for the acid catalyst removal or the same mixtures of the water-soluble organic solvent and the slightly-water-soluble organic solvent.

Although the mixing ratio of the water-soluble organic solvent and the slightly-water-soluble organic solvent is appropriately selected, the amount of the water-soluble organic solvent may be 0.1 to 1,000 parts by mass, preferably 1 to 500 parts by mass, further preferably 2 to 100 parts by mass, based on 100 parts by mass of the slightly-water-soluble organic solvent.

Subsequently, the thermally crosslinkable polysiloxane may be washed with neutral water. As the water, what is commonly called deionized water or ultrapure water may be used. The amount of the water may be 0.01 to 100 L, preferably 0.05 to 50 L, more preferably 0.1 to 5 L, relative to 1 L of the thermally crosslinkable polysiloxane solution. This washing procedure may be performed by putting both the thermally crosslinkable polysiloxane and water into the same container, followed by stirring and then leaving to stand to separate the aqueous layer. The washing may be performed once or more, preferably once to approximately five times because washing ten times or more does not always produce the full washing effects thereof.

To the washed thermally crosslinkable polysiloxane solution, a final solvent may be added for solvent exchange under reduced pressure. Thus, a desired thermally crosslinkable polysiloxane solution is obtained. The temperature during this solvent exchange is preferably 0 to 100° C., more preferably 10 to 90° C., further preferably 15 to 80° C., depending on the kind of the extraction solvent to be removed. Moreover, the degree of vacuum in this event is preferably atmospheric pressure or less, more preferably 80 kPa or less in absolute pressure, further preferably 50 kPa or less in absolute pressure, although the degree of vacuum varies depending on the kinds of the extraction solvent to be removed, exhausting equipment, condensation equipment, and heating temperature.

The final solvent added to the thermally crosslinkable polysiloxane solution is preferably an alcohol-based solvent, particularly preferably a monoalkyl ether of ethylene glycol, diethylene glycol, triethylene glycol, etc. and a monoalkyl ether of propylene glycol, dipropylene glycol, etc. Specifically, preferable examples thereof include propylene glycol monomethyl ether, ethylene glycol monomethyl ether, propylene glycol monoethyl ether, ethylene glycol monoethyl ether, propylene glycol monopropyl ether, ethylene glycol monopropyl ether, diacetone alcohol, etc.

As an alternative reaction operation using an alkali catalyst, water or a water-containing organic solvent is added to the monomer or an organic solution of the monomer to start the hydrolysis reaction. In this event, the catalyst may be added to the monomer or the organic solution of the monomer, or may be added to the water or the water-containing organic solvent. The reaction temperature may be 0 to 100° C., preferably 10 to 80° C. As a preferable method, when the water is added dropwise, the mixture is heated to 10 to 50° C., and then further heated to 20 to 80° C. for the aging.

The organic solvent usable for the organic solution of the monomer or the water-containing organic solvent is preferably a water-soluble solvent. Examples thereof include methanol, ethanol, 1-propanol, 2-propanol, 1-butanol, 2-butanol, 2-methyl-1-propanol, acetone, tetrahydrofuran, acetonitrile; polyhydric alcohol condensate derivatives such as propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether; mixtures thereof; etc.

The molecular weight of the thermally crosslinkable polysiloxane obtained by the above synthesis method 1 or 2 can be adjusted not only through the selection of the monomer but also by controlling the reaction conditions during the polymerization. Nevertheless, it is preferable to use the thermally crosslinkable polysiloxane having a weight-average molecular weight of 100,000 or less, more preferably 200 to 50,000, further preferably 300 to 30,000. When the weight-average molecular weight is 100,000 or less, generation of foreign matters and coating spots is suppressed. Regarding data on the weight-average molecular weight, the molecular weight is expressed in terms of polystyrene which is obtained by gel-permeation chromatography (GPC) using a refractive index (RI) detector, tetrahydrofuran as an eluent, and polystyrene as a reference substance.

Properties of the thermally crosslinkable polysiloxane used in the present invention vary depending on the kind of the acid or alkali catalyst used in the hydrolysis condensation and the reaction conditions. Thus, the catalyst and the reaction conditions can be appropriately selected in accordance with the characteristics of a resist underlayer film to be achieved.

Furthermore, a polysiloxane derivative produced from a mixture of one or more of the hydrolysable monomers (Sm) with a hydrolysable metal compound shown by the following general formula (Mm) under the conditions using the acid or alkali catalyst can be used as a component of the composition for forming a resist underlayer film.

$$U(OR^7)_{m7}(OR^8)_{m8} \qquad (Mm)$$

In the formula, $R^7$ and $R^8$ each represent an organic group having 1 to 30 carbon atoms; m7+m8 represents the same number of a valence determined by the kind of U; m7 and m8 each represent an integer of 0 or more; and U represents an element belonging to the group III, IV, or V in the periodic table, except for carbon and silicon.

Examples of the hydrolysable metal compound shown by the general formula (Mm) used in this event include the following.

When U is boron, examples of the compound shown by the general formula (Mm) include, as monomers, boron methoxide, boron ethoxide, boron propoxide, boron butoxide, boron amyloxide, boron hexyloxide, boron cyclopentoxide, boron cyclohexyloxide, boron allyloxide, boron phenoxide, boron methoxyethoxide, boric acid, boron oxide, etc.

When U is aluminum, examples of the compound shown by the general formula (Mm) include, as monomers, aluminum methoxide, aluminum ethoxide, aluminum propoxide, aluminum butoxide, aluminum amyloxide, aluminum hexyloxide, aluminum cyclopentoxide, aluminum cyclohexyloxide, aluminum allyloxide, aluminum phenoxide, aluminum methoxyethoxide, aluminum ethoxyethoxide, aluminum dipropoxy(ethyl acetoacetate), aluminum dibutoxy(ethyl acetoacetate), aluminum propoxy bis(ethyl acetoacetate), aluminum butoxy bis(ethyl acetoacetate), aluminum 2,4-pentanedionate, aluminum 2,2,6,6-tetramethyl-3,5-heptanedionate, etc.

When U is gallium, examples of the compound shown by the general formula (Mm) include, as monomers, gallium methoxide, gallium ethoxide, gallium propoxide, gallium butoxide, gallium amyloxide, gallium hexyloxide, gallium cyclopentoxide, gallium cyclohexyloxide, gallium allyloxide, gallium phenoxide, gallium methoxyethoxide, gallium ethoxyethoxide, gallium dipropoxy(ethyl acetoacetate), gallium dibutoxy(ethyl acetoacetate), gallium propoxy bis(ethyl acetoacetate), gallium butoxy bis(ethyl acetoacetate), gallium 2,4-pentanedionate, gallium 2,2,6,6-tetramethyl-3,5-heptanedionate, etc.

When U is yttrium, examples of the compound shown by the general formula (Mm) include, as monomers, yttrium methoxide, yttrium ethoxide, yttrium propoxide, yttrium butoxide, yttrium amyloxide, yttrium hexyloxide, yttrium cyclopentoxide, yttrium cyclohexyloxide, yttrium allyloxide, yttrium phenoxide, yttrium methoxyethoxide, yttrium ethoxyethoxide, yttrium dipropoxy(ethyl acetoacetate), yttrium dibutoxy(ethyl acetoacetate), yttrium propoxy bis(ethyl acetoacetate), yttrium butoxy bis(ethyl acetoacetate), yttrium 2,4-pentanedionate, yttrium 2,2,6,6-tetramethyl-3,5-heptanedionate, etc.

When U is germanium, examples of the compound shown by the general formula (Mm) include, as monomers, germanium methoxide, germanium ethoxide, germanium propoxide, germanium butoxide, germanium amyloxide, germanium hexyloxide, germanium cyclopentoxide, germanium cyclohexyloxide, germanium allyloxide, germanium phenoxide, germanium methoxyethoxide, germanium ethoxyethoxide, etc.

When U is titanium, examples of the compound shown by the general formula (Mm) include, as monomers, titanium methoxide, titanium ethoxide, titanium propoxide, titanium butoxide, titanium amyloxide, titanium hexyloxide, titanium cyclopentoxide, titanium cyclohexyloxide, titanium allyloxide, titanium phenoxide, titanium methoxyethoxide, titanium ethoxyethoxide, titanium dipropoxy bis(ethyl acetoacetate), titanium dibutoxy bis(ethyl acetoacetate), titanium dipropoxy bis(2,4-pentanedionate), titanium dibutoxy bis(2,4-pentanedionate), etc.

When U is hafnium, examples of the compound shown by the general formula (Mm) include, as monomers, hafnium methoxide, hafnium ethoxide, hafnium propoxide, hafnium butoxide, hafnium amyloxide, hafnium hexyloxide, hafnium cyclopentoxide, hafnium cyclohexyloxide, hafnium allyloxide, hafnium phenoxide, hafnium methoxyethoxide, hafnium ethoxyethoxide, hafnium dipropoxy bis(ethyl acetoacetate), hafnium dibutoxy bis(ethyl acetoacetate), hafnium dipropoxy bis(2,4-pentanedionate), hafnium dibutoxy bis(2,4-pentanedionate), etc.

When U is tin, examples of the compound shown by the general formula (Mm) include, as monomers, methoxy tin, ethoxy tin, propoxy tin, butoxy tin, phenoxy tin, methoxyethoxy tin, ethoxyethoxy tin, tin 2,4-pentanedionate, tin 2,2,6,6-tetramethyl-3,5-heptanedionate, etc.

When U is arsenic, examples of the compound shown by the general formula (Mm) include, as monomers, methoxy arsenic, ethoxy arsenic, propoxy arsenic, butoxy arsenic, phenoxy arsenic, etc.

When U is antimony, examples of the compound shown by the general formula (Mm) include, as monomers, methoxy antimony, ethoxy antimony, propoxy antimony, butoxy antimony, phenoxy antimony, antimony acetate, antimony propionate, etc.

When U is niobium, examples of the compound shown by the general formula (Mm) include, as monomers, methoxy niobium, ethoxy niobium, propoxy niobium, butoxy niobium, phenoxy niobium, etc.

When U is tantalum, examples of the compound shown by the general formula (Mm) include, as monomers, methoxy tantalum, ethoxy tantalum, propoxy tantalum, butoxy tantalum, phenoxy tantalum, etc.

When U is bismuth, examples of the compound shown by the general formula (Mm) include, as monomers, methoxy bismuth, ethoxy bismuth, propoxy bismuth, butoxy bismuth, phenoxy bismuth, etc.

When U is phosphorus, examples of the compound shown by the general formula (Mm) include, as monomers, trimethyl phosphate, triethyl phosphate, tripropyl phosphate, trimethyl phosphite, triethyl phosphite, tripropyl phosphite, diphosphorous pentaoxide, etc.

When U is vanadium, examples of the compound shown by the general formula (Mm) include, as monomers, vanadium oxide bis(2,4-pentanedionate), vanadium 2,4-pentanedionate, vanadium tributoxide oxide, vanadium tripropoxide oxide, etc.

When U is zirconium, examples of the compound shown by the general formula (Mm) include, as monomers, methoxy zirconium, ethoxy zirconium, propoxy zirconium, butoxy zirconium, phenoxy zirconium, zirconium dibutoxide bis(2,4-pentanedionate), zirconium dipropoxide bis(2,2,6,6-tetramethyl-3,5-heptanedionate), etc.

(Acid Generator)

The inventive composition for forming a silicon-containing resist underlayer film may be further blended with one or more kinds of an acid generator. As the acid generator, any of a thermal-acid generator, a photoacid generator, an acid amplifier, and the like may be used, as long as the substance acts as an acid precursor. In the present invention, the acid generator to be blended is more preferably a sulfonium salt which is a photoacid generator and generates an acid by an action of a high energy beam. More specific examples include the materials disclosed in paragraphs (0160) to (0179) of JP 2009-126940A, but are not limited thereto.

[Other Components]
(Crosslinking Catalyst (Xc))

The inventive composition for forming a silicon-containing resist underlayer film may be blended with another crosslinking catalyst (Xc) in addition to the quaternary ammonium salt shown by the general formula (A-1). An example of the blendable crosslinking catalyst (Xc) includes a compound shown by the following general formula (XcO):

where L represents lithium, sodium, potassium, rubidium, cesium, sulfonium, iodonium, phosphonium, or ammonium; A represents a non-nucleophilic counter ion; "a" represents an integer of 1 or more; "b" represents an integer of 0 or 1 or more; and a+b represents a valence of the non-nucleophilie counter ion.

Examples of the crosslinking catalyst (Xc) used in the present invention as specific (XcO) include a sulfonium salt of the following general formula (Xc-1), an iodonium salt of the following general formula (Xc-2), a phosphonium salt of the following general formula (Xc-3), an ammonium salt of the following general formula (Xc-4), an alkaline metal salt, etc.

Examples of the sulfonium salt (Xc-1), the iodonium salt (Xc-2), and the phosphonium salt (Xc-3) are shown below.

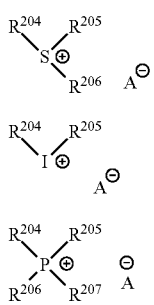

(Xc-1)

(Xc-2)

(Xc-3)

Moreover, an example of the ammonium salt (Xc-4) is shown below.

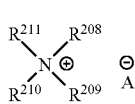

(Xc-4)

In the formulae, $R^{204}$, $R^{205}$, $R^{206}$, and $R^{207}$ each represent a linear, branched, or cyclic alkyl group, alkenyl group, oxoalkyl group, or oxoalkenyl group having 1 to 12 carbon atoms, a substituted or unsubstituted aryl group having 6 to 20 carbon atoms, or an aralkyl group or aryloxoalkyl group having 7 to 12 carbon atoms; some or all of hydrogen atoms of these groups are optionally substituted with an alkoxy group or the like. Additionally, $R^{205}$ and $R^{206}$ may form a ring; when a ring is formed, $R^{205}$ and $R^{206}$ each represent an alkylene group having 1 to 6 carbon atoms. A represents a non-nucleophilic counter ion. $R^{208}$, $R^{209}$, $R^{210}$, and $R^{211}$ are the same as $R^{204}$, $R^{205}$, $R^{206}$, and $R^{207}$, and may be each a hydrogen atom. $R^{208}$ and $R^{209}$, or $R^{208}$ and $R^{209}$ and $R^{210}$, may form a ring; when a ring is formed, $R^{208}$ and $R^{209}$, or $R^{208}$ and $R^{209}$ and $R^{210}$, represent an alkylene group having 3 to 10 carbon atoms.

$R^{204}$, $R^{205}$, $R^{206}$, $R^{207}$, $R^{208}$, $R^{209}$, $R^{210}$, and $R^{211}$ may be identical to or different from one another. Specific examples thereof include alkyl groups such as a methyl group, an ethyl group, a propyl group, an isopropyl group, an n-butyl group, a sec-butyl group, a tert-butyl group, a pentyl group, a hexyl group, a heptyl group, and an octyl group; a cyclopentyl group, a cyclohexyl group, a cycloheptyl group, a cyclopropylmethyl group, a 4-methylcyclohexyl group, a cyclohexylmethyl group, a norbornyl group, an adamantyl group, etc. Examples of the alkenyl group include a vinyl group, an allyl group, a propenyl group, a butenyl group, a hexenyl group, a cyclohexenyl group, etc. Examples of the oxoalkyl group include a 2-oxocyclopentyl group, a 2-oxocyclohexyl group, etc., and also include a 2-oxopropyl group, a 2-cyclopentyl-2-oxoethyl group, a 2-cyclohexyl-2-oxoethyl group, a 2-(4-methylcyclohexyl)-2-oxoethyl group, etc. Examples of the aryl group include a phenyl group, a naphthyl group, etc.; alkoxyphenyl groups such as a p-methoxyphenyl group, a m-methoxyphenyl group, an o-methoxyphenyl group, an ethoxyphenyl group, a p-tert-butoxyphenyl group, and a m-tert-butoxyphenyl group; alkylphenyl groups such as a 2-methylphenyl group, a 3-methylphenyl group, a 4-methylphenyl group, an ethylphenyl group, a 4-tert-butylphenyl group, a 4-butylphenyl group, and a dimethylphenyl group; alkylnaphthyl groups such as a methylnaphthyl group and an ethylnaphthyl group; alkoxynaphthyl groups such as a methoxynaphthyl group and an ethoxynaphthyl group; dialkylnaphthyl groups such as a dimethylnaphthyl group and a diethylnaphthyl group; dialkoxynaphthyl groups such as a dimethoxynaphthyl group and a diethoxynaphthyl group; etc. Examples of the aralkyl group include a benzyl group, a phenylethyl group, a phenethyl group, etc. Examples of the aryloxoalkyl group include 2-aryl-2-oxoethyl groups such as a 2-phenyl-2-oxoethyl group, a 2-(1-naphthyl)-2-oxoethyl group, and a 2-(2-naphthyl)-2-oxoethyl group; etc.

Examples of the non-nucleophilic counter ion include monovalent ions such as hydroxide ion, formate ion, acetate ion, propionate ion, butanoate ion, pentanoate ion, hexanoate ion, heptanoate ion, octanoate ion, nonanoate ion, decanoate ion, oleate ion, stearate ion, linoleate ion, linolenate ion, benzoate ion, phthalate ion, isophthalate ion, terephthalate ion, salicylate ion, trifluoroacetate ion, monochloroacetate ion, dichloroacetate ion, trichloroacetate ion, fluoride ion, chloride ion, bromide ion, iodide ion, nitrate ion, nitrite ion, chlorate ion, bromate ion, methanesulfonate ion, paratoluenesulfonate ion, and monomethylsulfate ion; monovalent or divalent ions such as oxalate ion, malonate ion, methylmalonate ion, ethylmalonate ion, propylmalonate ion, butylmalonate ion, dimethylmalonate ion, diethylmalonate ion, succinate ion, methylsuccinate ion, glutarate ion, adipate ion, itaconate ion, maleate ion, fumarate ion, citraconate ion, citrate ion, carbonate ion, sulfate ion, etc.

Examples of the alkaline metal salt include salts of lithium, sodium, potassium, cesium, magnesium, and calcium; monovalent salts such as hydroxide, formate, acetate, propionate, butanoate, pentanoate, hexanoate, heptanoate, octanoate, nonanoate, decanoate, oleate, stearate, linoleate, linolenate, benzoate, phthalate, isophthalate, terephthalate, salicylate, trifluoroacetate, monochloroacetate, dichloroacetate, and trichloroacetate; monovalent or divalent salts such as oxalate, malonate, methylmalonate, ethylmalonate, propylmalonate, butylmalonate, dimethylmalonate, diethylmalonate, succinate, methylsuccinate, glutarate, adipate, itaconate, maleate, fumarate, citraconate, citrate, carbonate, etc.

Specific examples of the sulfonium salt (Xc-1) include triphenylsulfonium formate, triphenylsulfonium acetate, triphenylsulfonium propionate, triphenylsulfonium butanoate, triphenylsulfonium benzoate, triphenylsulfonium phthalate, triphenylsulfonium isophthalate, triphenylsulfonium terephthalate, triphenylsulfonium salicylate, triphenylsulfonium trifluoromethanesulfonate, triphenylsulfonium trifluoroacetate, triphenylsulfonium monochloroacetate, triphenylsulfonium dichloroacetate, triphenylsulfonium trichloroacetate, triphenylsulfonium hydroxide, triphenylsulfonium nitrate, triphenylsulfonium chloride, triphenylsulfonium bromide, triphenylsulfonium oxalate, triphenylsulfonium malonate, triphenylsulfonium methylmalonate, triphenylsulfonium ethylmalonate, triphenylsulfonium propylmalonate, triphenylsulfonium butylmalonate, triphenylsulfonium dimethylmalonate, triphenylsulfonium diethylmalonate, triphenylsulfonium succinate, triphenylsulfonium methylsuccinate, triphenylsulfonium glutarate, triphenylsulfonium adipate, triphenylsulfonium itaconate, triphenylsulfonium maleate, triphenylsulfonium fumarate, triphenylsulfonium citraconate, triphenylsulfonium citrate, triphenylsulfonium carbonate, bistriphenylsulfonium oxalate, bistriphenylsulfonium maleate, bistriphenylsulfonium fumarate, bistriphenylsulfonium citraconate, bistriphenylsulfonium citrate, bistriphenylsulfonium carbonate, etc.

Specific examples of the iodonium salt (Xc-2) include diphenyliodonium formate, diphenyliodonium acetate, diphenyliodonium propionate, diphenyliodonium butanoate, diphenyliodonium benzoate, diphenyliodonium phthalate, diphenyliodonium isophthalate, diphenyliodonium terephthalate, diphenyliodonium salicylate, diphenyliodonium trifluoromethanesulfonate, diphenyliodonium trifluoroacetate, diphenyliodonium monochloroacetate, diphenyliodonium dichloroacetate, diphenyliodonium trichloroacetate, diphenyliodonium hydroxide, diphenyliodonium nitrate, diphenyliodonium chloride, diphenyliodonium bromide, diphenyliodonium iodide, diphenyliodonium oxalate, diphenyliodonium maleate, diphenyliodonium fumarate, diphenyliodonium citraconate, diphenyliodonium citrate, diphenyliodonium carbonate, bisdiphenyliodonium oxalate, bisdiphenyliodonium maleate, bisdiphenyliodonium fumarate, bisdiphenyliodonium citraconate, bisdiphenyliodonium citrate, bisdiphenyliodonium carbonate, etc.

Specific examples of the phosphonium salt (Xc-3) include tetraethylphosphonium formate, tetraethylphosphonium acetate, tetraethylphosphonium propionate, tetraethylphosphonium butanoate, tetraethylphosphonium benzoate, tetraethylphosphonium phthalate, tetraethylphosphonium isophthalate, tetraethylphosphonium terephthalate, tetraethylphosphonium salicylate, tetraethylphosphonium trifluoromethanesulfonate, tetraethylphosphonium trifluoroacetate, tetraethylphosphonium monochloroacetate, tetraethylphosphonium dichloroacetate, tetraethylphosphonium trichloroacetate, tetraethylphosphonium hydroxide, tetraethylphosphonium nitrate, tetraethylphosphonium chloride, tetraethylphosphonium bromide, tetraethylphosphonium iodide, tetraethylphosphonium oxalate, tetraethylphosphonium maleate, tetraethylphosphonium fumarate, tetraethylphosphonium citraconate, tetraethylphosphonium citrate, tetraethylphosphonium carbonate, bistetraethylphosphonium oxalate, bistetraethylphosphonium maleate, bistetraethylphosphonium fumarate, bistetraethylphosphonium citraconate, bistetraethylphosphonium citrate, bistetraethylphosphonium carbonate, tetraphenylphosphonium formate, tetraphenylphosphonium acetate, tetraphenylphosphonium propionate, tetraphenylphosphonium butanoate, tetraphenylphosphonium benzoate, tetraphenylphosphonium phthalate, tetraphenylphosphonium isophthalate, tetraphenylphosphonium terephthalate, tetraphenylphosphonium salicylate, tetraphenylphosphonium trifluoromethanesulfonate, tetraphenylphosphonium trifluoroacetate, tetraphenylphosphonium monochloroacetate, tetraphenylphosphonium dichloroacetate, tetraphenylphosphonium trichloroacetate, tetraphenylphosphonium hydroxide, tetraphenylphosphonium nitrate, tetraphenylphosphonium chloride, tetraphenylphosphonium bromide, tetraphenylphosphonium iodide, tetraphenylphosphonium oxalate, tetraphenylphosphonium maleate, tetraphenylphosphonium fumarate, tetraphenylphosphonium citraconate, tetraphenylphosphonium citrate, tetraphenylphosphonium carbonate, bistetraphenylphosphonium oxalate, bistetraphenylphosphonium maleate, bistetraphenylphosphonium fumarate, bistetraphenylphosphonium citraconate, bistetraphenylphosphonium citrate, bistetraphenylphosphonium carbonate, etc.

Meanwhile, specific examples of the ammonium salt (Xc-4) include tetramethylammonium formate, tetramethylammonium acetate, tetramethylammonium propionate, tetramethylammonium butanoate, tetramethylammonium benzoate, tetramethylammonium phthalate, tetramethylammonium isophthalate, tetramethylammonium terephthalate, tetramethylammonium salicylate, tetramethylammonium trifluoromethanesulfonate, tetramethylammonium trifluoroacetate, tetramethylammonium monochloroacetate, tetramethylammonium dichloroacetate, tetramethylammonium trichloroacetate, tetramethylammonium hydroxide, tetramethylammonium nitrate, tetramethylammonium chloride, tetramethylammonium bromide, tetramethylammonium iodide, tetramethylammonium monomethylsulfate, tetramethylammonium oxalate, tetramethylammonium malonate, tetramethylammonium maleate, tetramethylammonium fumarate, tetramethylammonium citraconate, tetramethylammonium citrate, tetramethylammonium carbonate, bistetramethylammonium oxalate, bistetramethylammonium malonate, bistetramethylammonium maleate, bistetramethylammonium fumarate, bistetramethylammonium citraconate, bistetramethylammonium citrate, bistetramethylammonium carbonate, tetraethylammonium formate, tetraethylammonium acetate, tetraethylammonium propionate, tetraethylammonium butanoate, tetraethylammonium benzoate, tetraethylammonium phthalate, tetraethylammonium isophthalate, tetraethylammonium terephthalate, tetraethylammonium salicylate, tetraethylammonium trifluoromethanesulfonate, tetraethylammonium trifluoroacetate, tetraethylammonium monochloroacetate, tetraethylammonium dichloroacetate, tetraethylammonium trichloroacetate, tetraethylammonium hydroxide, tetraethylammonium nitrate, tetraethylammonium chloride, tetraethylammonium bromide, tetraethylammonium iodide, tetraethylammonium monomethylsulfate, tetraethylammonium oxalate, tetraethylammonium malonate, tetraethylammonium maleate, tetraethylammonium fumarate, tetraethylammonium citraconate, tetraethylammonium citrate, tetraethylammonium carbonate, bistetraethylammonium oxalate, bistetraethylammonium malonate, bistetraethylammonium maleate, bistetraethylammonium fumarate, bistetraethylammonium citraconate, bistetraethylammonium citrate, bistetraethylammonium carbonate, tetrapropylammonium formate, tetrapropylammonium acetate, tetrapropylammonium propionate, tetrapropylammonium butanoate, tetrapropylammonium benzoate, tetrapropylammonium phthalate, tetrapropylammonium isophthalate, tetrapropylammonium terephthalate, tetrapropylammonium salicylate, tetrapropylammonium tri fluoromethanesulfonate, tetrapropylammonium trifluoroacetate, tetrapropylammonium monochloroacetate, tetrapropylammonium dichloroacetate, tetrapropylammonium trichloroacetate, tetrapropylammonium hydroxide, tetrapropylammonium nitrate, tetrapropylammonium chloride, tetrapropylammonium bromide, tetrapropylammonium iodide, tetrapropylammonium monomethylsulfate, tetrapropylammonium oxalate, tetrapropylammonium malonate, tetrapropylammonium maleate, tetrapropylammonium fumarate, tetrapropylammonium citraconate, tetrapropylammonium citrate, tetrapropylammonium carbonate, bistetrapropylammonium oxalate, bistetrapropylammonium malonate, bistetrapropylammonium maleate, bistetrapropylammonium fumarate, bistetrapropylammonium citraconate, bistetrapropylammonium citrate, bistetrapropylammonium carbonate, tetrabutylammonium formate, tetrabutylammonium acetate, tetrabutylammonium propionate, tetrabutylammonium butanoate, tetrabutylammonium benzoate, tetrabutylammonium phthalate, tetrabutylammonium isophthalate, tetrabutylammonium terephthalate, tetrabutylammonium salicylate, tetrabutylammonium trifluoromethanesulfonate, tetrabutylammonium trifluoroacetate, tetrabutylammonium monochloroacetate, tetrabutylammonium dichloroacetate, tetrabutylammonium trichloroacetate, tetrabutylammonium hydroxide, tetrabutylammonium nitrate, tetrabutylammonium chloride, tetrabutylammonium bromide, tetrabutylammonium iodide, tetrabutylammonium methanesulfonate, tetrabutylammonium monomethylsulfate, tetrabutylammonium oxalate, tetrabutylammonium malonate, tetrabutylammonium maleate, tetrabutylammonium fumarate, tetrabutylammonium citraconate, tetrabutylammonium citrate, tetrabutylammonium carbonate, bistetrabutylammonium oxalate, bistetrabutylammonium malonate, bistetrabutylammonium maleate, bistetrabutylammonium fumarate, bistetrabutylammonium citraconate, bistetrabutylammonium citrate, bistetrabutylammonium carbonate, etc.

Examples of the alkaline metal salt include lithium formate, lithium acetate, lithium propionate, lithium butanoate, lithium benzoate, lithium phthalate, lithium isophthalate, lithium terephthalate, lithium salicylate, lithium trifluoromethanesulfonate, lithium trifluoroacetate, lithium monochloroacetate, lithium dichloroacetate, lithium trichloroacetate, lithium hydroxide, lithium nitrate, lithium chloride, lithium bromide, lithium iodide, lithium methanesulfonate, lithium hydrogen oxalate, lithium hydrogen malonate, lithium hydrogen maleate, lithium hydrogen fumarate, lithium hydrogen citraconate, lithium hydrogen citrate, lithium hydrogen carbonate, lithium oxalate, lithium malonate, lithium maleate, lithium fumarate, lithium citraconate, lithium citrate, lithium carbonate, sodium formate, sodium acetate, sodium propionate, sodium butanoate, sodium benzoate, sodium phthalate, sodium isophthalate, sodium terephthalate, sodium salicylate, sodium trifluoromethanesulfonate, sodium trifluoroacetate, sodium monochloroacetate, sodium dichloroacetate, sodium trichloroacetate, sodium hydroxide, sodium nitrate, sodium chloride, sodium bromide, sodium iodide, sodium methanesulfonate, sodium hydrogen oxalate, sodium hydrogen malonate, sodium hydrogen maleate, sodium hydrogen fumarate, sodium hydrogen citraconate, sodium hydrogen citrate, sodium hydrogen carbonate, sodium oxalate, sodium malonate, sodium maleate, sodium fumarate, sodium citraconate, sodium citrate, sodium carbonate, potassium formate, potassium acetate, potassium propionate, potassium butanoate, potassium benzoate, potassium phthalate, potassium isophthalate, potassium terephthalate, potassium salicylate, potassium trifluoromethanesulfonate, potassium trifluoroacetate, potassium monochloroacetate, potassium dichloroacetate, potassium trichloroacetate, potassium hydroxide, potassium nitrate, potassium chloride, potassium bromide, potassium iodide, potassium methanesulfonate, potassium hydrogen oxalate, potassium hydrogen malonate, potassium hydrogen maleate, potassium hydrogen fumarate, potassium hydrogen citraconate, potassium hydrogen citrate, potassium hydrogen carbonate, potassium oxalate, potassium malonate, potassium maleate, potassium fumarate, potassium citraconate, potassium citrate, potassium carbonate, etc.

In the present invention, a polysiloxane (Xc-10) having a structure partially containing one of the sulfonium salt, the iodonium salt, the phosphonium salt, and the ammonium salt may be blended as the crosslinking catalyst (Xc) into the composition for forming a resist underlayer film.

As a raw material for producing (Xc-10) used here, it is possible to employ a compound shown by the following general formula (Xm):

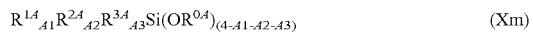

$$R^{1A}_{A1}R^{2A}_{A2}R^{3A}_{A3}Si(OR^{OA})_{(4-A1-A2-A3)} \quad (Xm)$$

where $R^{OA}$ represents a hydrocarbon group having 1 to 6 carbon atoms; at least one of $R^{1A}$, $R^{2A}$, and $R^{3A}$ represents an organic group having the ammonium salt, the sulfonium salt, the phosphonium salt, or the iodonium salt; the other(s) of $R^{1A}$, $R^{2A}$, and $R^{3A}$ represent a hydrogen atom or a monovalent organic group having 1 to 30 carbon atoms; and A1, A2, and A3 each represent 0 or 1, given that $1 \leq A1+A2+A3 \leq 3$.

Here, examples of $R^{OA}$ include a methyl group, an ethyl group, an n-propyl group, an iso-propyl group, an n-butyl group, an iso-butyl group, a sec-butyl group, a tert-butyl group, an n-pentyl group, a cyclopentyl group, an n-hexyl group, a cyclohexyl group, and a phenyl group.

An example of Xm includes a compound shown by the following general formula (Xm-1), which shows a hydrolysable silicon compound having a structure partially containing the sulfonium salt.

(Xm-1)

In the formula, R and R each represent a monovalent organic group such as a linear, branched, or cyclic alkyl group, alkenyl group, oxoalkyl group, or oxoalkenyl group having 1 to 20 carbon atoms, a substituted or unsubstituted aryl group having 6 to 20 carbon atoms, or an aralkyl group or aryloxyalkyl group having 7 to 20 carbon atoms; some or all of hydrogen atoms of these groups are optionally substituted with an alkoxy group, an amino group, an alkylamino group, a halogen atom, or the like. Moreover, $R^{SA1}$ and $R^{SA2}$ may form a ring together with a sulfur atom bonded to $R^{SA1}$ and $R^{SA2}$; when a ring is formed, $R^{SA1}$ and $R^{SA2}$ each represent an alkylene group having 1 to 6 carbon atoms. $R^{SA3}$ represents a divalent organic group such as a linear, branched, or cyclic alkylene group or alkenylene group having 1 to 20 carbon atoms, or a substituted or unsubstituted arylene group or aralkylene group having 6 to 20 carbon atoms; some or all of hydrogen atoms of these groups are optionally substituted with an alkoxy group, an amino group, an alkylamino group, or the like. $R^{SA1}$ to $R^{SA3}$ each may have an oxygen atom or a nitrogen atom within the chain or the ring.

Note that, in the general formula (Xm-1), (Si) is depicted to show a bonding site to Si.

Examples of $X^-$ include hydroxide ion, fluoride ion, chloride ion, bromide ion, iodide ion, formate ion, acetate ion, propionate ion, butanoate ion, pentanoate ion, hexanoate ion, heptanoate ion, octanoate ion, nonanoate ion, decanoate ion, oleate ion, stearate ion, linoleate ion, linolenate ion, benzoate ion, p-methylbenzoate ion, p-t-butylbenzoate ion, phthalate ion, isophthalate ion, terephthalate ion, salicylate ion, trifluoroacetate ion, monochloroacetate ion, dichloroacetate ion, trichloroacetate ion, nitrate ion, chlorate ion, perchlorate ion, bromate ion, iodate ion, methanesulfonate ion, benzenesulfonate ion, toluenesulfonate ion, monomethylsulfate ion, hydrogen sulfate ion, oxalate ion, malonate ion, methylmalonate ion, ethylmalonate ion, propylmalonate ion, butylmalonate ion, dimethylmalonate ion, diethylmalonate ion, succinate ion, methylsuccinate ion, glutarate ion, adipate ion, itaconate ion, maleate ion, fumarate ion, citraconate ion, citrate ion, carbonate ion, etc.

Specific examples of the cation moiety in the compound shown by the general formula (Xm-1) include the following ions.

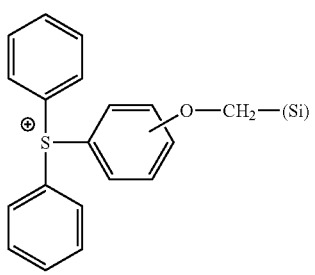
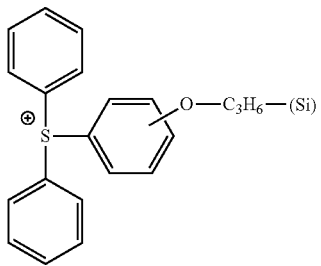
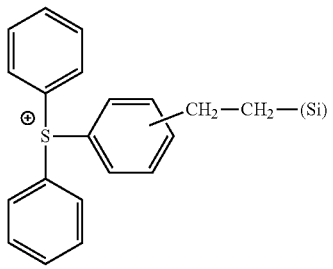
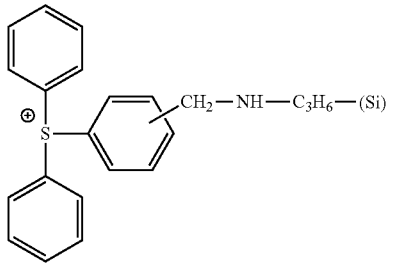
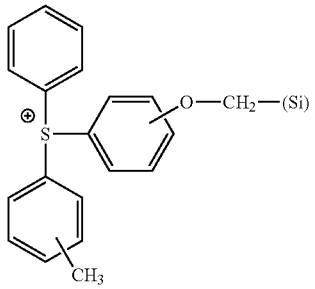
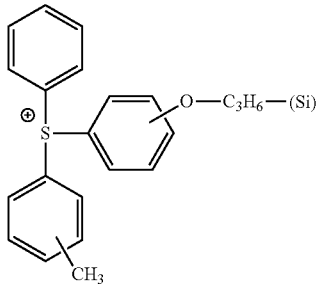
-continued
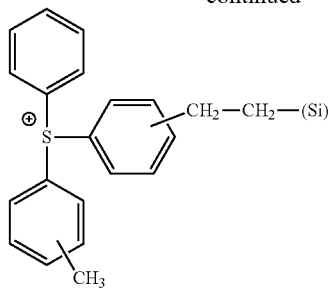
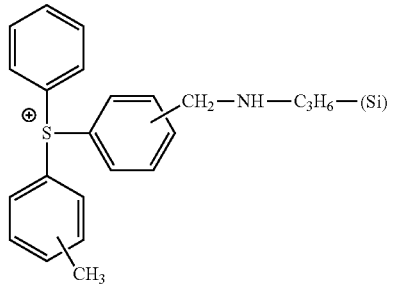
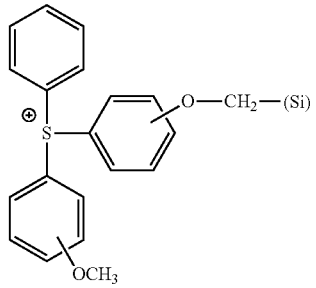
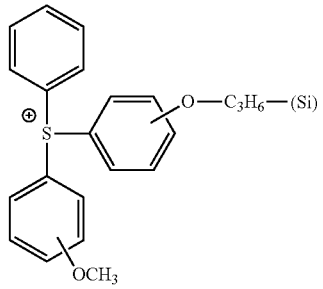
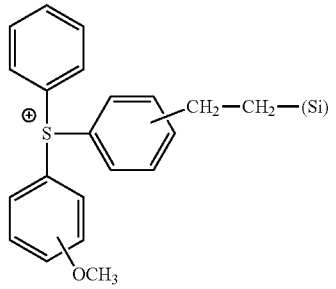
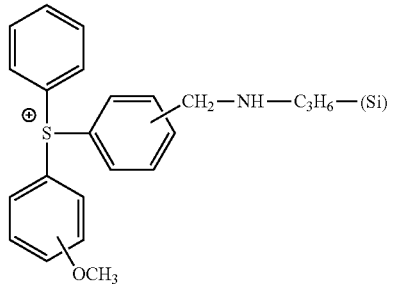

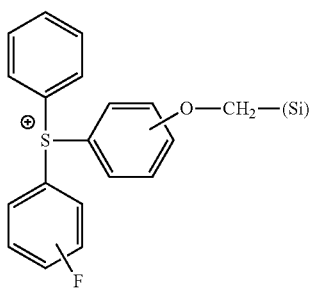
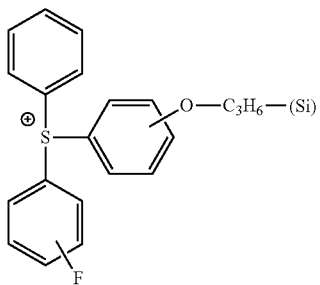
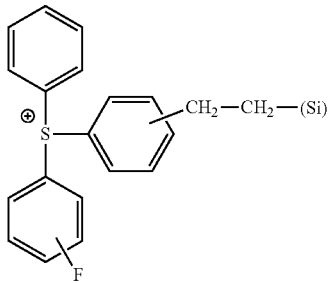
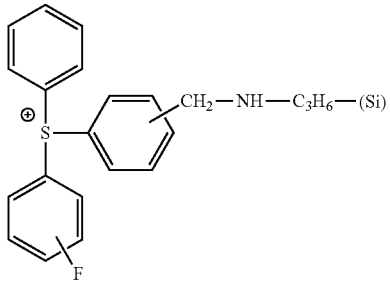
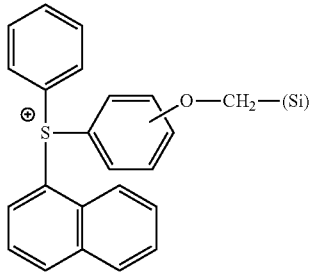
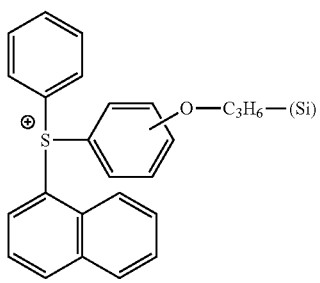
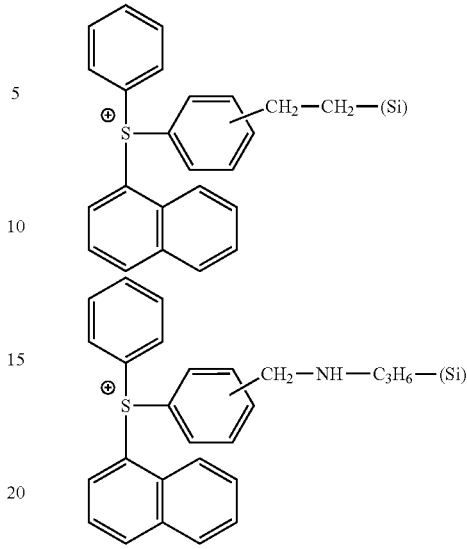

For example, a hydrolysable silicon compound having a structure partially containing the iodonium salt can be shown by the following general formula (Xm-2):

(Xm-2)

where $R^{IA1}$ represents a monovalent organic group such as a linear, branched, or cyclic alkyl group, alkenyl group, oxoalkyl group, or oxoalkenyl group having 1 to 20 carbon atoms, a substituted or unsubstituted aryl group having 6 to 20 carbon atoms, or an aralkyl group or aryloxoalkyl group having 7 to 20 carbon atoms; some or all of hydrogen atoms of these groups are optionally substituted with an alkoxy group, an amino group, an alkylamino group, a halogen atom, or the like. $R^{IA2}$ represents a divalent organic group such as a linear, branched, or cyclic alkylene group or alkenylene group having 1 to 20 carbon atoms, or a substituted or unsubstituted arylene group or aralkylene group having 6 to 20 carbon atoms; some or all of hydrogen atoms of these groups are optionally substituted with an alkoxy group, an amino group, an alkylamino group, or the like. $R^{IA1}$ and $R^{IA2}$ each may have an oxygen atom or a nitrogen atom within the chain or the ring.

Note that, in the general formula (Xm-2), (Si) is depicted to show a bonding site to Si. $X^-$ is as defined above.

Specific examples of the cation moiety in the compound shown by the general formula (Xm-2) include the following ions.

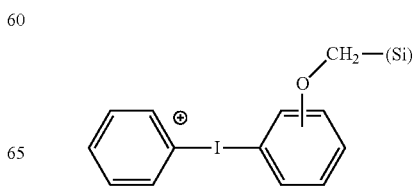

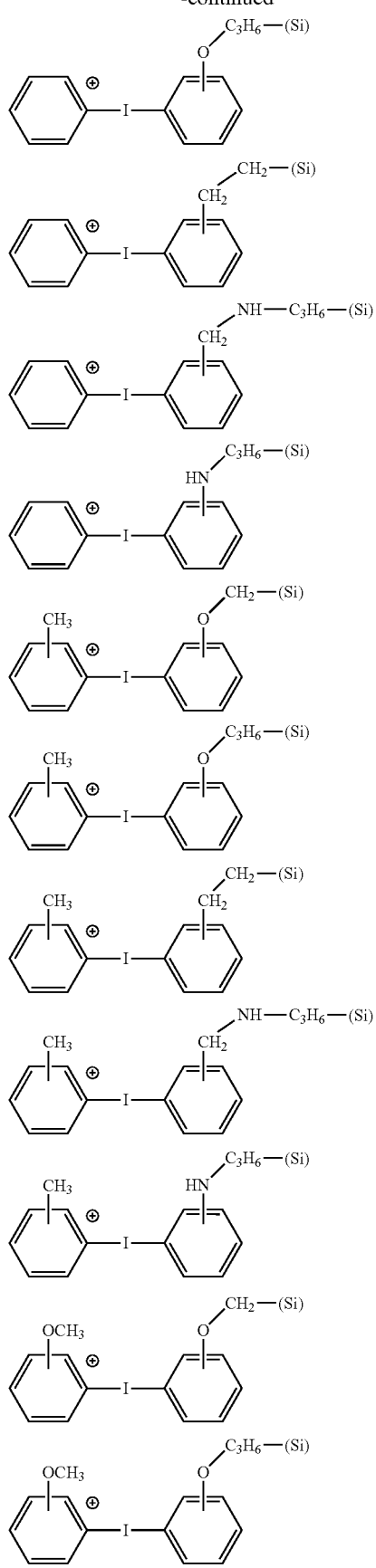

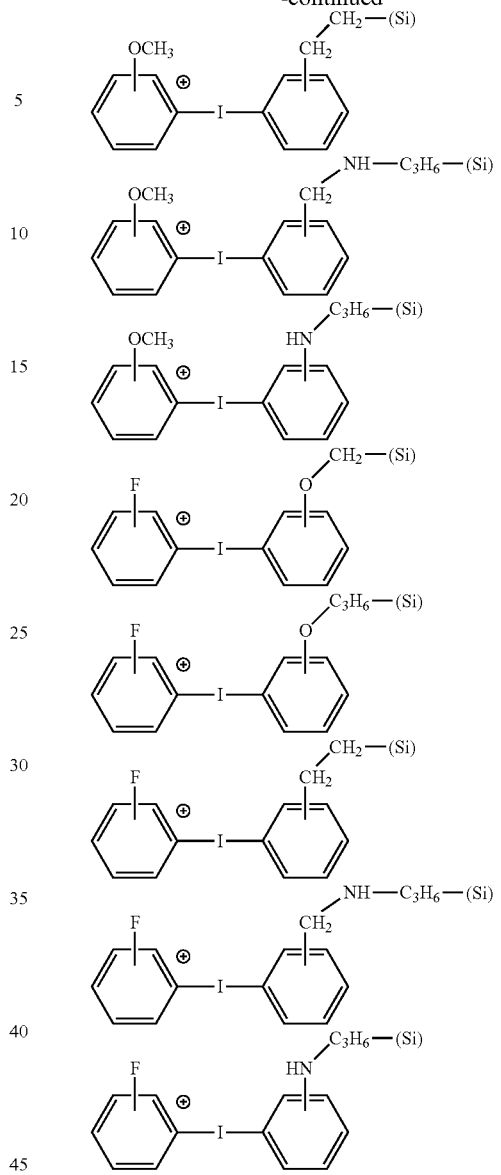

For example, a hydrolysable silicon compound having a structure partially containing the phosphonium salt can be shown by the following general formula (Xm-3):

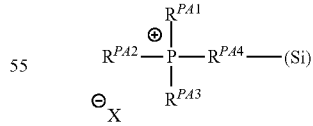

(Xm-3)

where $R^{PA1}$, $R^{PA2}$, and $R^{PA3}$ each represent a linear, branched, or cyclic alkyl group, alkenyl group, oxoalkyl group, or oxoalkenyl group having 1 to 20 carbon atoms, a substituted or unsubstituted aryl group having 6 to 20 carbon atoms, or an aralkyl group or aryloxoalkyl group having 7 to 20 carbon atoms; some or all of hydrogen atoms of these groups are optionally substituted with an alkoxy group, an amino group, an alkylamino group, a halogen atom, or the like. Moreover, $R^{PA1}$ and $R^{PA2}$ may form a ring together with a phosphorus atom bonded to $R^{PA1}$ and $R^{PA2}$; when a ring is formed, $R^{PA1}$ and $R^{PA2}$ each represent an alkylene group having 1 to 6 carbon atoms. $R^{PA4}$ represents a linear, branched, or cyclic alkylene group or alkenylene group having 1 to 20 carbon atoms, or a substituted or unsubstituted arylene group or aralkylene group having 6 to 20 carbon atoms; some or all of hydrogen atoms of these groups are optionally substituted with an alkoxy group, an amino group, an alkylamino group, or the like. $R^{PA1}$ to $R^{PA4}$ each may have an oxygen atom or a nitrogen atom within the chain or the ring.

Note that, in the general formula (Xm-3), (Si) is depicted to show a bonding site to Si. $X^-$ is as defined above.

Specific examples of the cation moiety in the compound shown by the general formula (Xm-3) include the following ions.

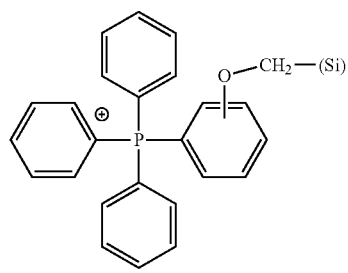

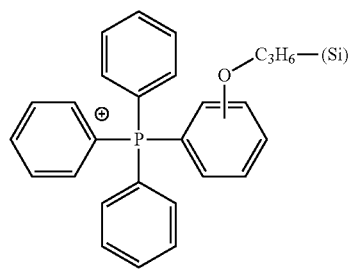

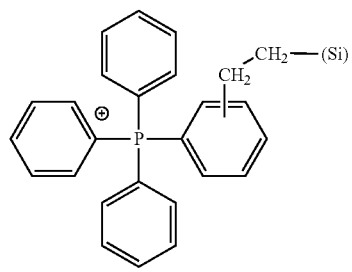

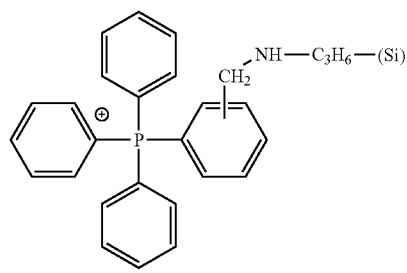

-continued

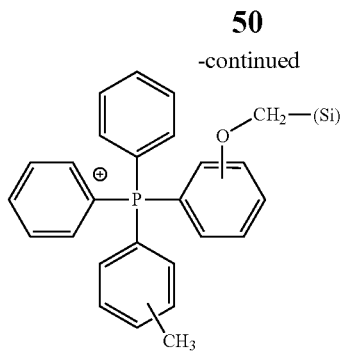

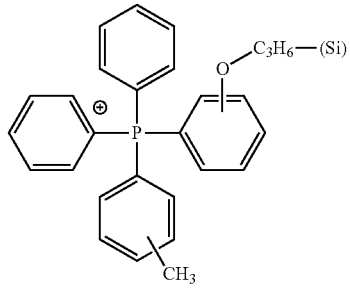

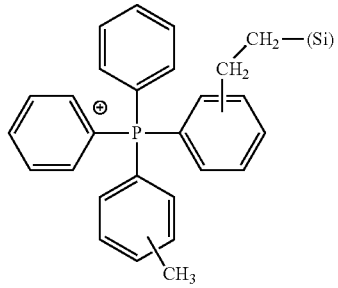

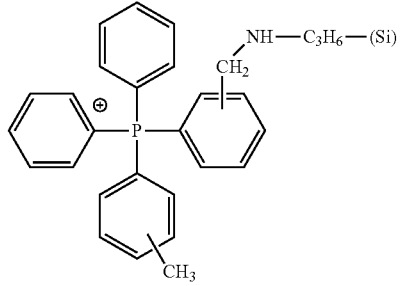

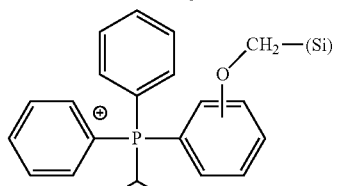

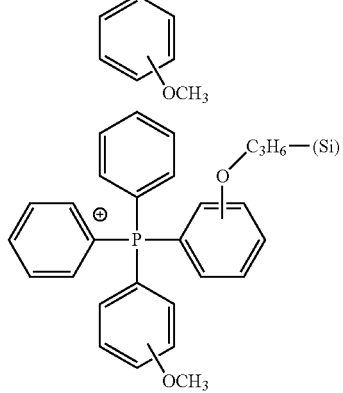

51
-continued
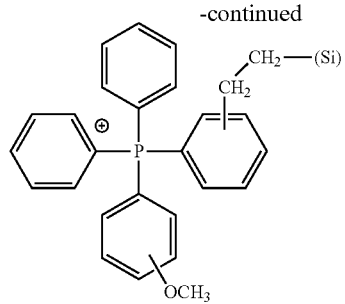
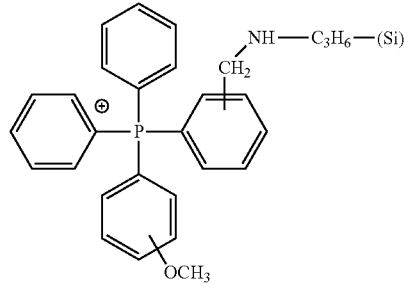
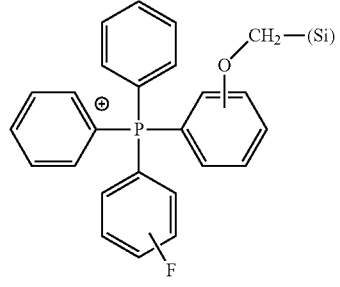
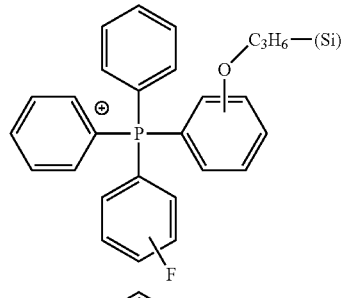
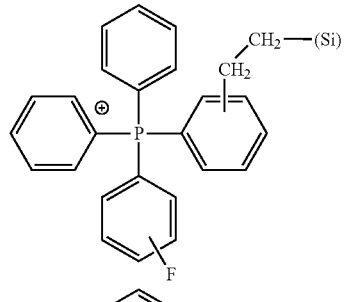
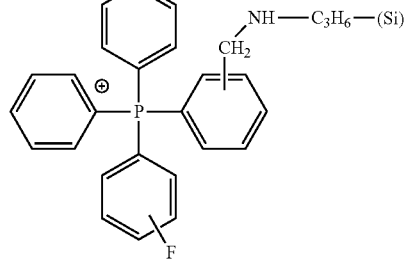
52
-continued
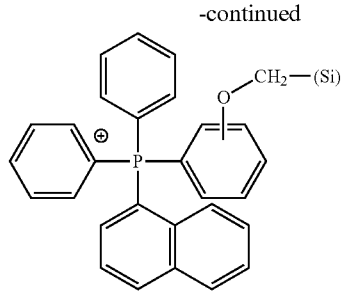
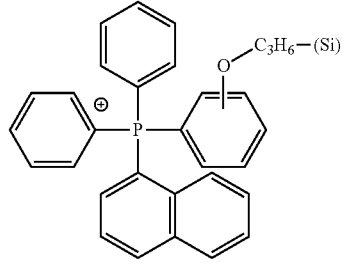
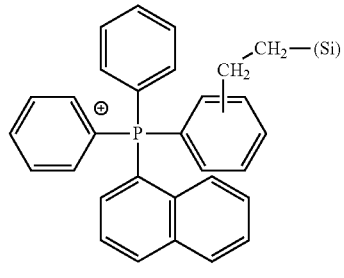
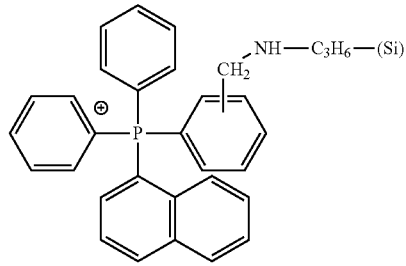
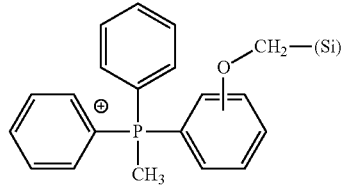
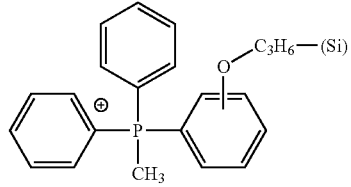
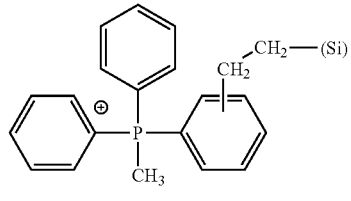

-continued

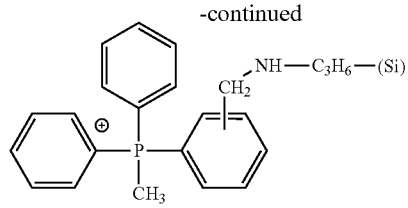
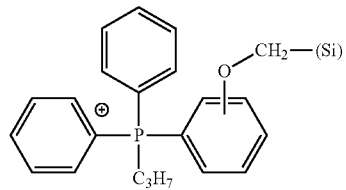
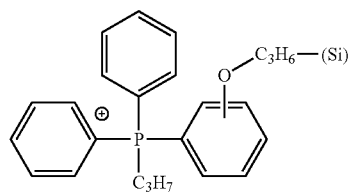
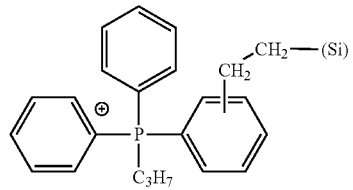
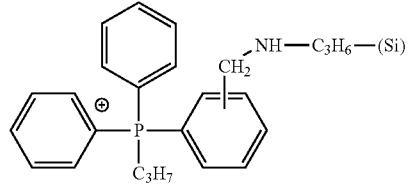
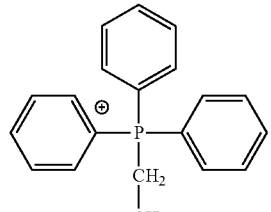
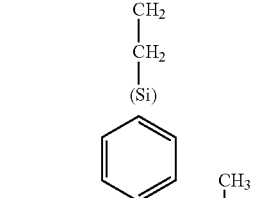
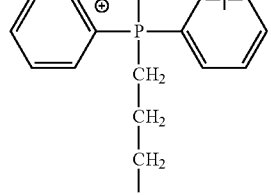

-continued

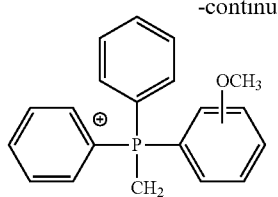
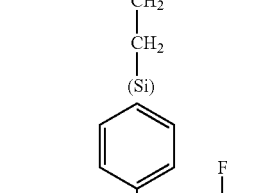
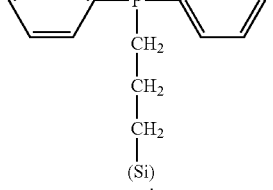
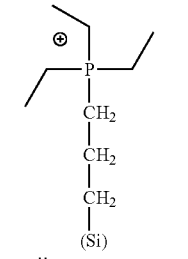
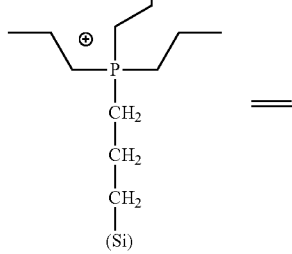
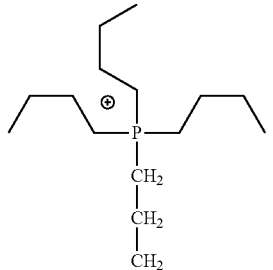

For example, a hydrolysable silicon compound having a structure partially containing the ammonium salt can be shown by the following general formula (Xm-4):

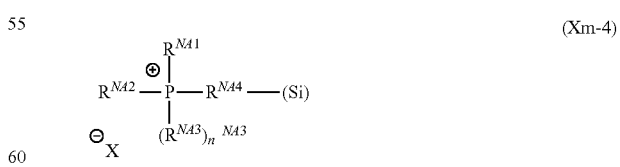

(Xm-4)

where $R^{NA1}$, $R^{NA2}$, and $R^{NA3}$ each represent hydrogen or a monovalent organic group such as a linear, branched, or cyclic alkyl group, alkenyl group, oxoalkyl group, or oxoalkenyl group having 1 to 20 carbon atoms, a substituted or unsubstituted aryl group having 6 to 20 carbon atoms, or an aralkyl group or aryloxyalkyl group having 7 to 20 carbon atoms; some or all of hydrogen atoms of these groups are optionally substituted with an alkoxy group, an amino group, an alkylamino group, or the like. Moreover, $R^{NA1}$ and $R^{NA2}$ may form a ring together with a nitrogen atom bonded to $R^{NA1}$ and $R^{NA2}$; when a ring is formed, $R^{NA1}$ and $R^{NA2}$ each represent an alkylene group having 1 to 6 carbon atoms or a heterocyclic ring or heteroaromatic ring containing nitrogen. $R^{NA4}$ represents a divalent organic group such as a linear, branched, or cyclic alkylene group or alkenylene group having 1 to 23 carbon atoms, or a substituted or unsubstituted arylene group or aralkylene group having 6 to 29 carbon atoms; some or all of hydrogen atoms of these groups are optionally substituted with an alkoxy group, an amino group, an alkylamino group, or the like. In the case where $R^{NA1}$ and $R^{NA2}$, or $R^{NA1}$ and $R^{NA4}$, form a cyclic structure which further contains unsaturated nitrogen, $n^{NA3}=0$; in the other cases, $n^{NA3}=1$. $R^{NA4}$ may have an oxygen atom or a nitrogen atom within the chain or the ring.

Note that, in the general formula (Xm-4), (Si) is depicted to show a bonding site to Si. X is as defined above.

Specific examples of the cation moiety in the compound shown by the general formula (Xm-4) include the following ions.

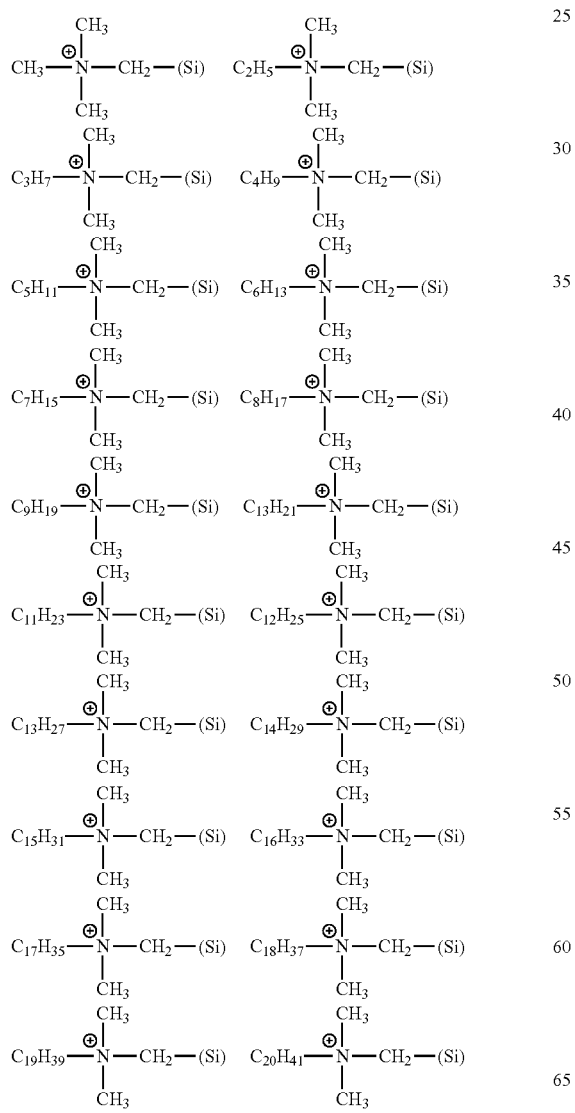

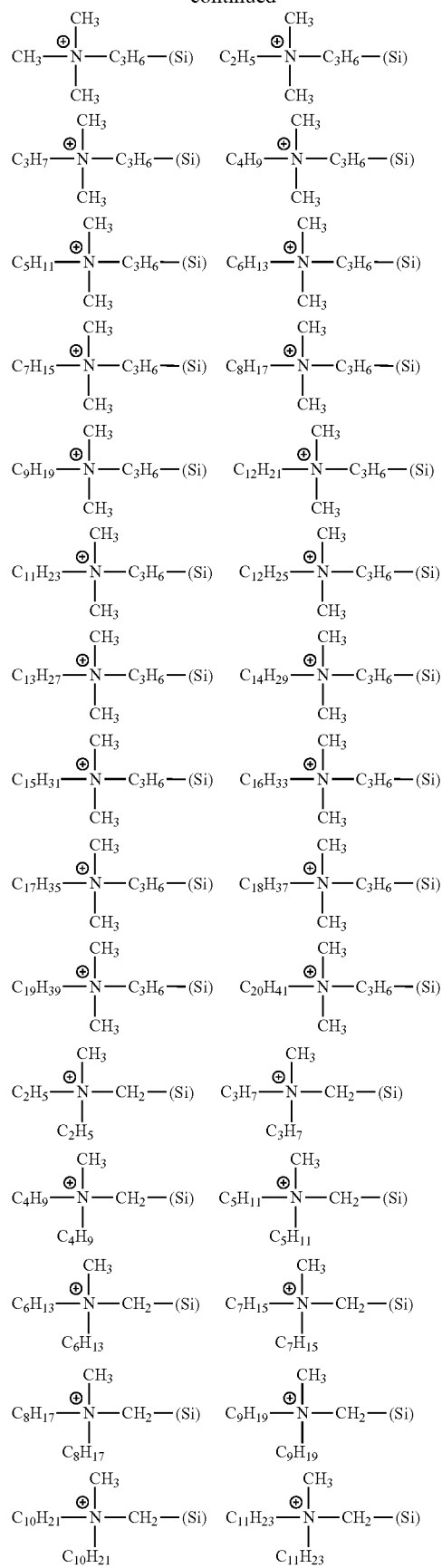

-continued $(C_{12}H_{25})(CH_3)\overset{\oplus}{N}(C_{12}H_{25})-CH_2-(Si)$  $(C_{13}H_{27})(CH_3)\overset{\oplus}{N}(C_{13}H_{27})-CH_2-(Si)$ $(C_{14}H_{29})(CH_3)\overset{\oplus}{N}(C_{14}H_{29})-CH_2-(Si)$  $(C_{15}H_{31})(CH_3)\overset{\oplus}{N}(C_{15}H_{31})-CH_2-(Si)$ $(C_{16}H_{33})(CH_3)\overset{\oplus}{N}(C_{16}H_{33})-CH_2-(Si)$  $(C_{17}H_{35})(CH_3)\overset{\oplus}{N}(C_{17}H_{35})-CH_2-(Si)$ $(C_{18}H_{37})(CH_3)\overset{\oplus}{N}(C_{18}H_{37})-CH_2-(Si)$  $(C_{19}H_{39})(CH_3)\overset{\oplus}{N}(C_{19}H_{39})-CH_2-(Si)$ $(C_{20}H_{41})(CH_3)\overset{\oplus}{N}(C_{20}H_{41})-C_4H_8-(Si)$  $(H_3C)(CH_3)\overset{\oplus}{N}(CH_3)-C_4H_8-(Si)$ $(H_3C)(CH_3)\overset{\oplus}{N}(CH_3)-C_5H_{10}-(Si)$  $(H_3C)(CH_3)\overset{\oplus}{N}(CH_3)-C_6H_{12}-(Si)$ $(H_3C)(CH_3)\overset{\oplus}{N}(CH_3)-C_7H_{14}-(Si)$  $(H_3C)(CH_3)\overset{\oplus}{N}(CH_3)-C_8H_{16}-(Si)$ $(H_3C)(CH_3)\overset{\oplus}{N}(CH_3)-C_9H_{18}-(Si)$  $(H_3C)(CH_3)\overset{\oplus}{N}(CH_3)-C_{10}H_{20}-(Si)$ $(H_3C)(CH_3)\overset{\oplus}{N}(CH_3)-C_{11}H_{22}-(Si)$  $(H_3C)(CH_3)\overset{\oplus}{N}(CH_3)-C_{12}H_{24}-(Si)$ $(H_3C)(CH_3)\overset{\oplus}{N}(CH_3)-C_{13}H_{26}-(Si)$  $(H_3C)(CH_3)\overset{\oplus}{N}(CH_3)-C_{14}H_{28}-(Si)$ $(H_3C)(CH_3)\overset{\oplus}{N}(CH_3)-C_{15}H_{30}-(Si)$  $(H_3C)(CH_3)\overset{\oplus}{N}(CH_3)-C_{16}H_{32}-(Si)$ $(H_3C)(CH_3)\overset{\oplus}{N}(CH_3)-C_{17}H_{34}-(Si)$  $(H_3C)(CH_3)\overset{\oplus}{N}(CH_3)-C_{18}H_{36}-(Si)$ $(H_3C)(CH_3)\overset{\oplus}{N}(CH_3)-C_{19}H_{38}-(Si)$  $(H_3C)(CH_3)\overset{\oplus}{N}(CH_3)-C_{20}H_{40}-(Si)$ $(C_2H_5)(CH_3)\overset{\oplus}{N}(C_2H_5)-C_3H_6-(Si)$  $(C_3H_7)(CH_3)\overset{\oplus}{N}(C_3H_7)-C_3H_6-(Si)$ $(C_4H_9)(CH_3)\overset{\oplus}{N}(C_4H_9)-C_3H_6-(Si)$  $(C_5H_{11})(CH_3)\overset{\oplus}{N}(C_5H_{11})-C_3H_6-(Si)$ -continued $(C_6H_{13})(CH_3)\overset{\oplus}{N}(C_6H_{13})-C_3H_6-(Si)$  $(C_7H_{15})(CH_3)\overset{\oplus}{N}(C_7H_{15})-C_3H_6-(Si)$ $(C_8H_{17})(CH_3)\overset{\oplus}{N}(C_8H_{17})-C_3H_6-(Si)$  $(C_9H_{19})(CH_3)\overset{\oplus}{N}(C_9H_{19})-C_3H_6-(Si)$ $(C_{10}H_{21})(CH_3)\overset{\oplus}{N}(C_{10}H_{21})-C_3H_6-(Si)$  $(C_{11}H_{29})(CH_3)\overset{\oplus}{N}(C_{11}H_{23})-C_3H_6-(Si)$ $(C_{12}H_{25})(CH_3)\overset{\oplus}{N}(C_{12}H_{25})-C_3H_6-(Si)$  $(C_{13}H_{27})(CH_3)\overset{\oplus}{N}(C_{13}H_{27})-C_3H_6-(Si)$ $(C_{14}H_{29})(CH_3)\overset{\oplus}{N}(C_{14}H_{29})-C_3H_6-(Si)$  $(C_{15}H_{31})(CH_3)\overset{\oplus}{N}(C_{15}H_{31})-C_3H_6-(Si)$ $(C_{16}H_{33})(CH_3)\overset{\oplus}{N}(C_{16}H_{33})-C_3H_6-(Si)$  $(C_{17}H_{35})(CH_3)\overset{\oplus}{N}(C_{17}H_{35})-C_3H_6-(Si)$ $(C_{18}H_{37})(CH_3)\overset{\oplus}{N}(C_{18}H_{37})-C_3H_6-(Si)$  $(C_{19}H_{39})(CH_3)\overset{\oplus}{N}(C_{19}H_{39})-C_3H_6-(Si)$ $(C_{20}H_{41})(CH_3)\overset{\oplus}{N}(C_{20}H_{41})-C_3H_6-(Si)$ $(H_3C)(CH_3)\overset{\oplus}{N}(CH_3)-C_2H_4-NH-CH_2-(Si)$ $(H_3C)(CH_3)\overset{\oplus}{N}(CH_3)-C_3H_6-NH-CH_2-(Si)$ $(H_3C)(CH_3)\overset{\oplus}{N}(CH_3)-C_4H_8-NH-CH_2-(Si)$ $(H_3C)(CH_3)\overset{\oplus}{N}(CH_3)-C_5H_{10}-NH-CH_2-(Si)$ $(H_3C)(CH_3)\overset{\oplus}{N}(CH_3)-C_6H_{12}-NH-CH_2-(Si)$ $(H_3C)(CH_3)\overset{\oplus}{N}(CH_3)-C_7H_{14}-NH-CH_2-(Si)$ $(H_3C)(CH_3)\overset{\oplus}{N}(CH_3)-C_8H_{16}-NH-CH_2-(Si)$

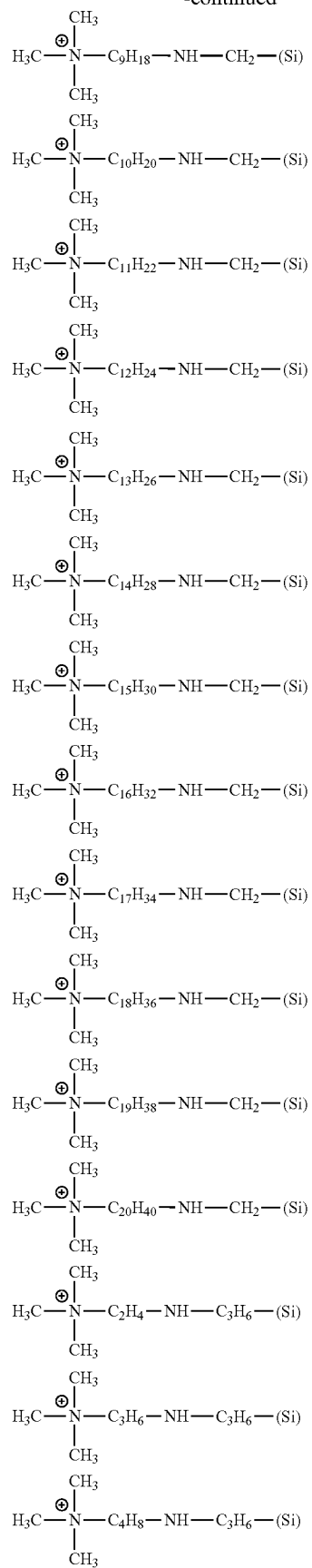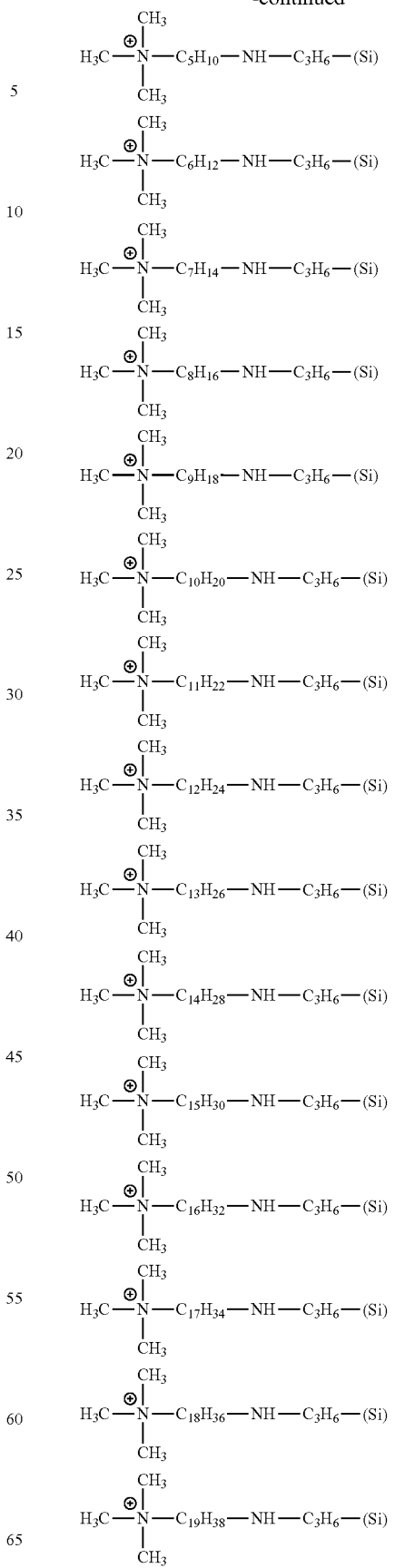

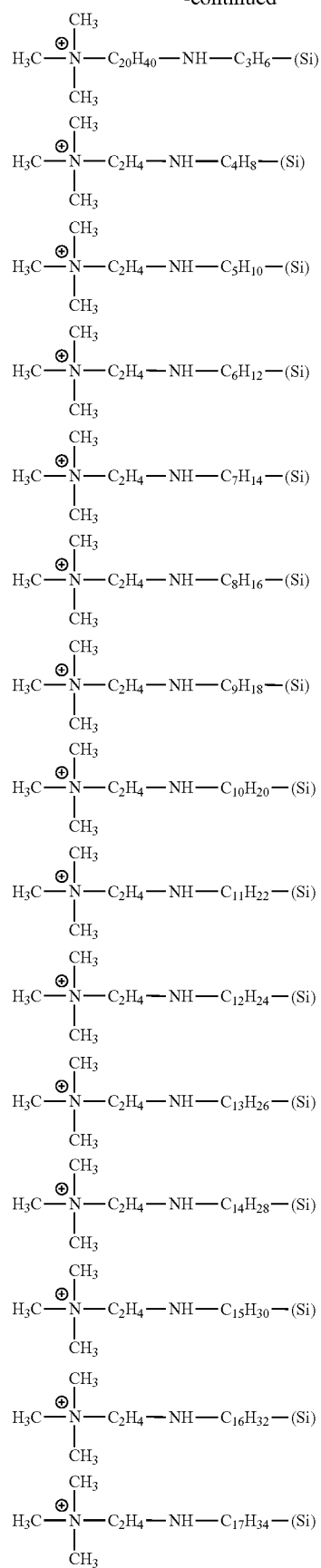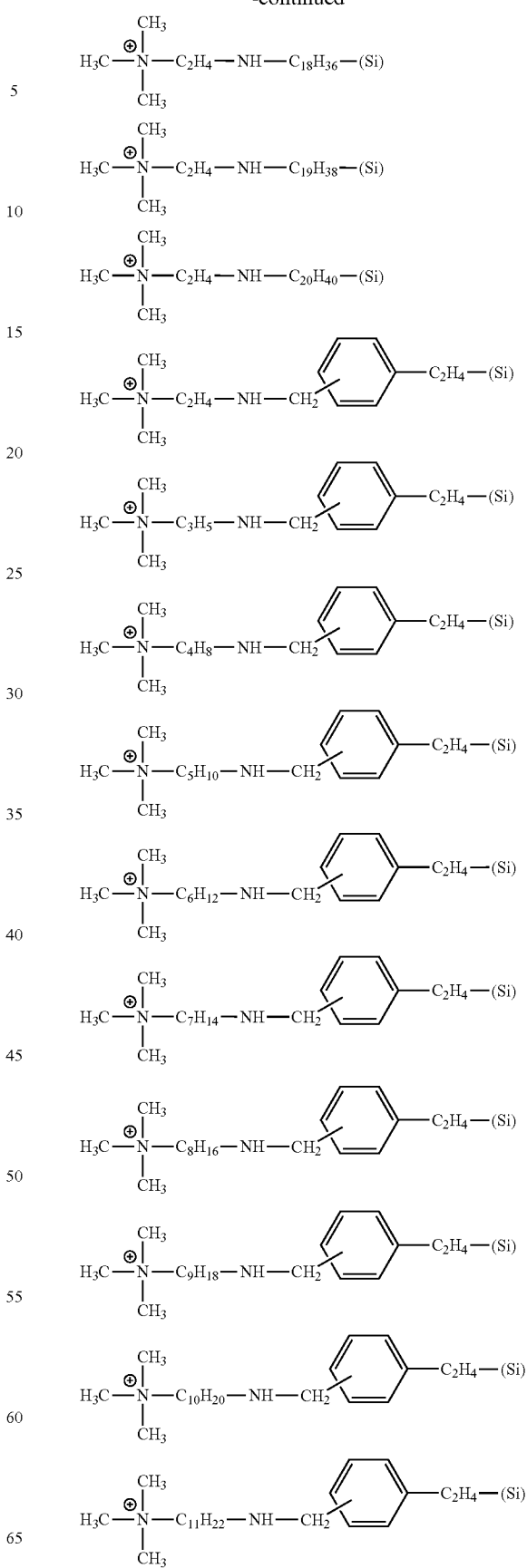

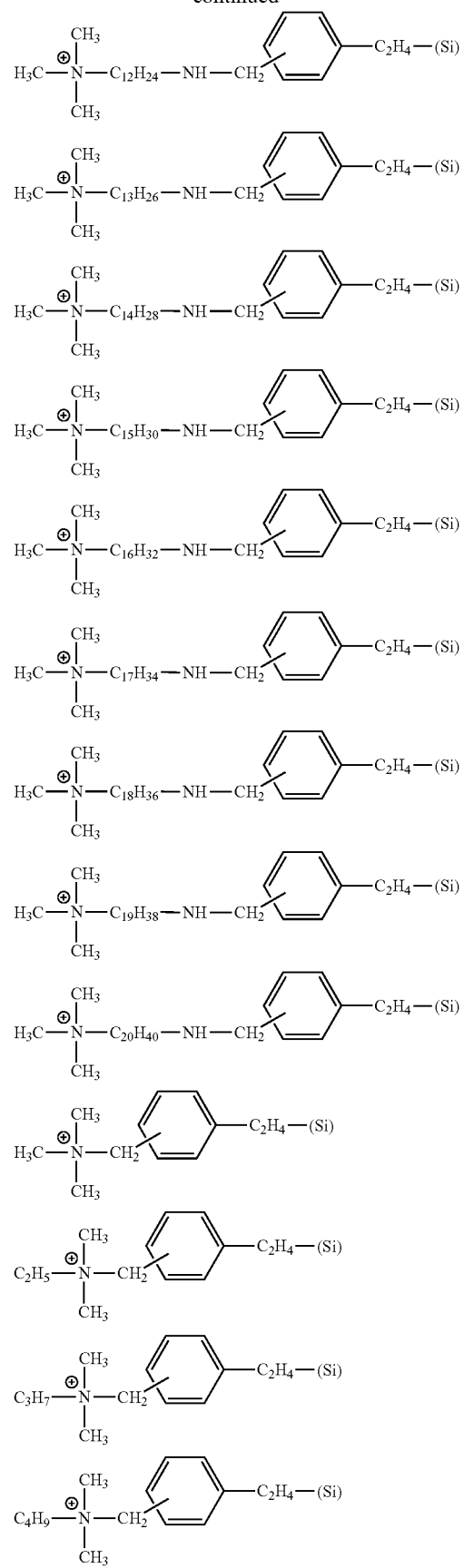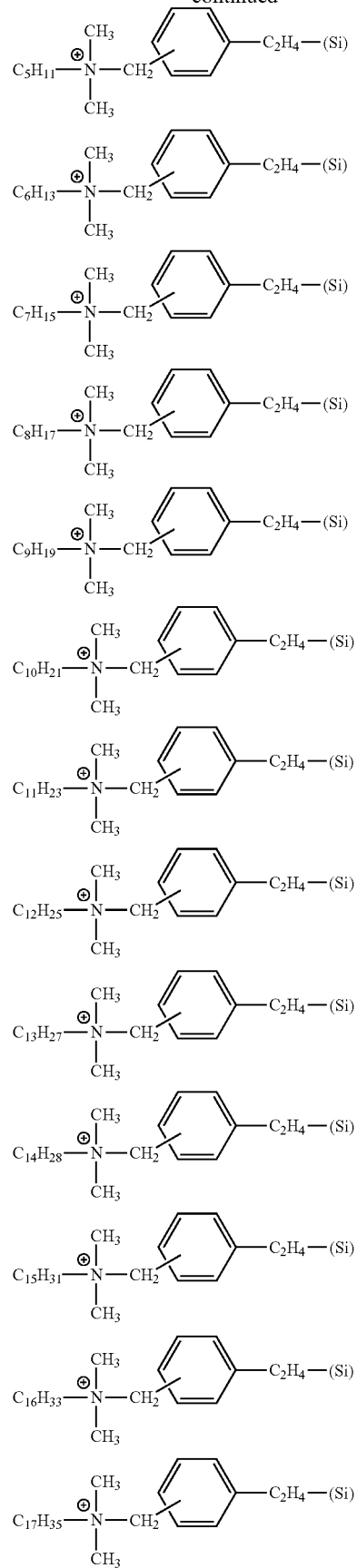

-continued

-continued
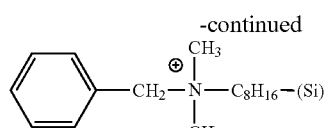
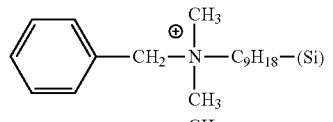
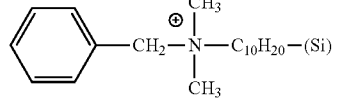
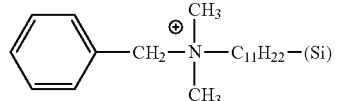
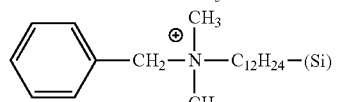
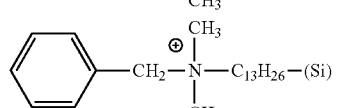
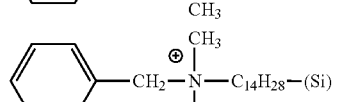
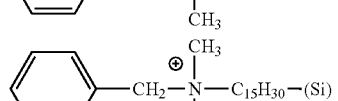
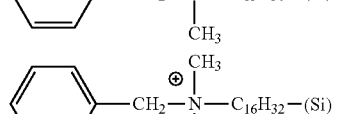
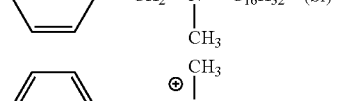
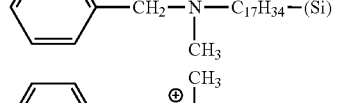
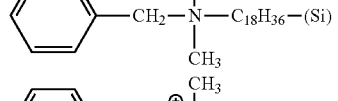
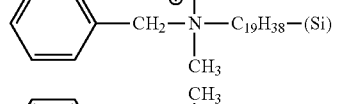
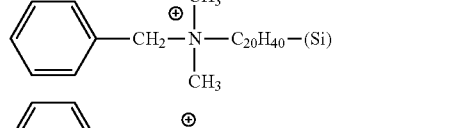
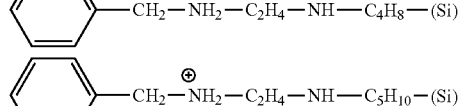
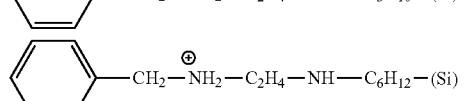
-continued
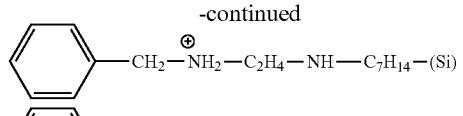
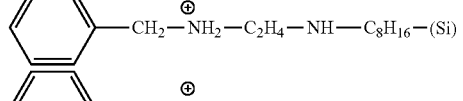
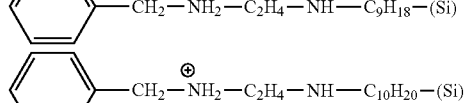
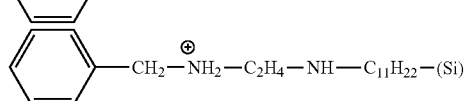
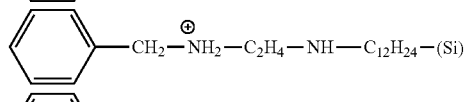
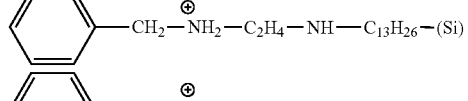
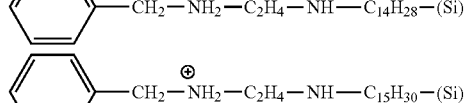
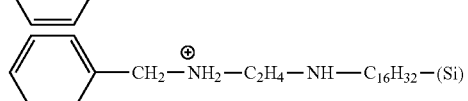
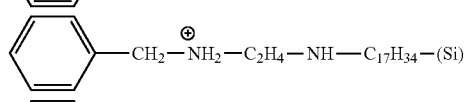
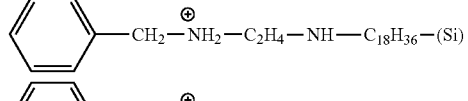
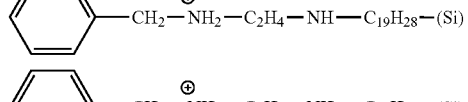
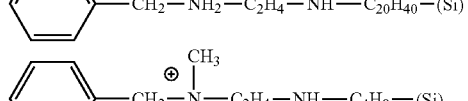
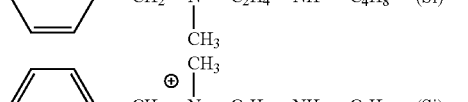
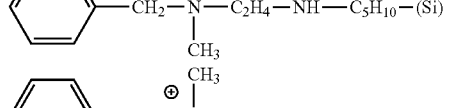
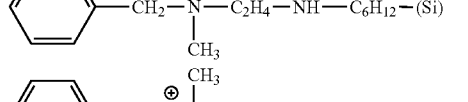
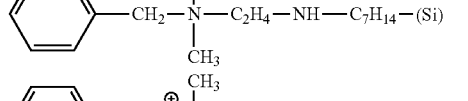
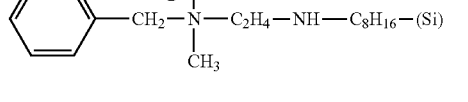

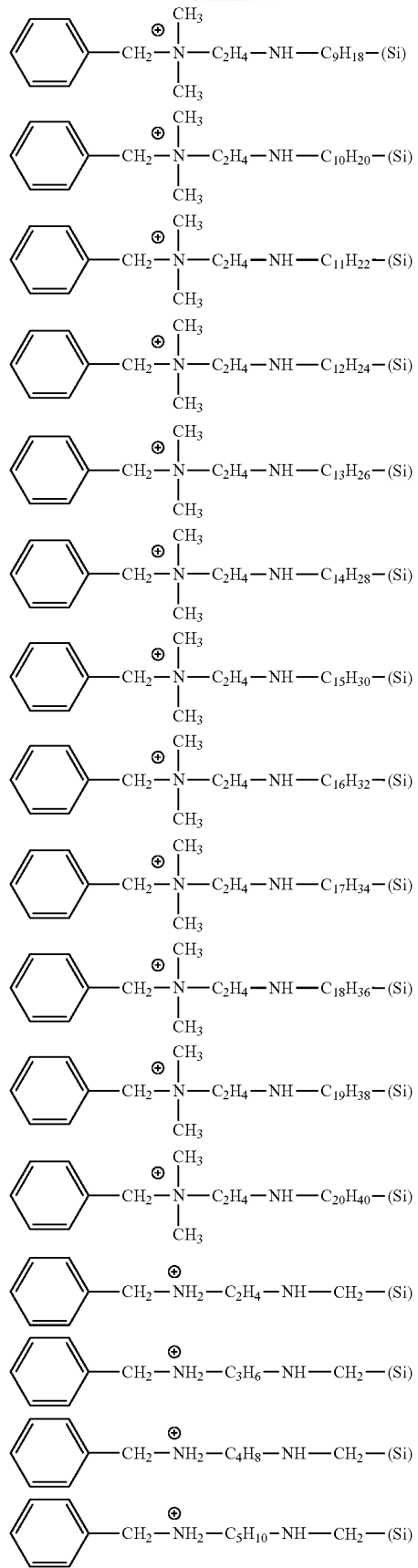
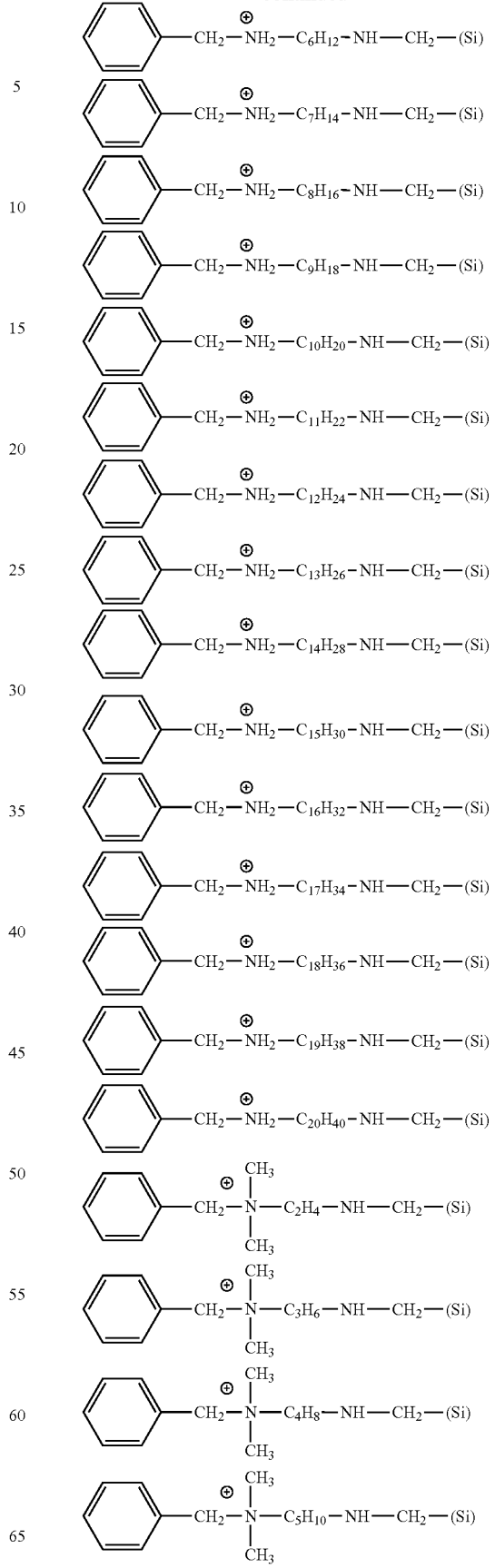

-continued
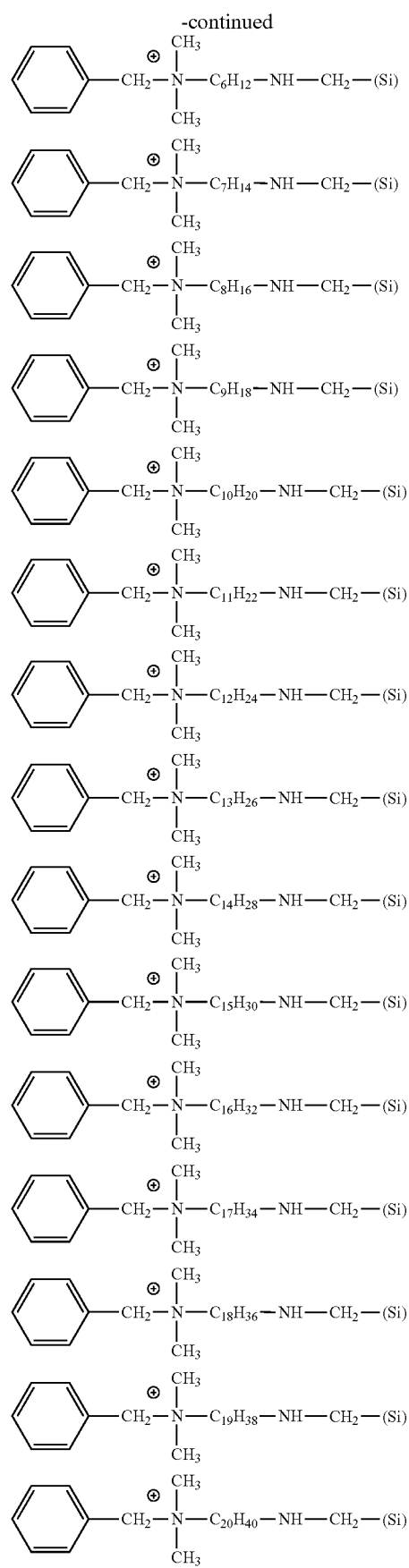
-continued
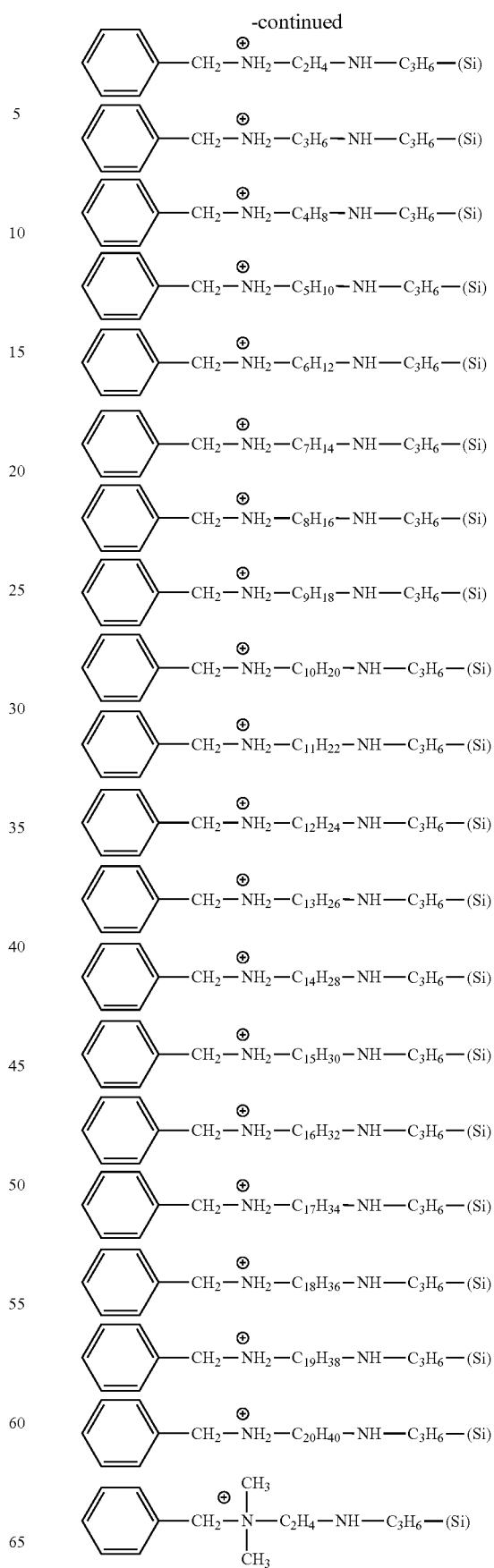

-continued
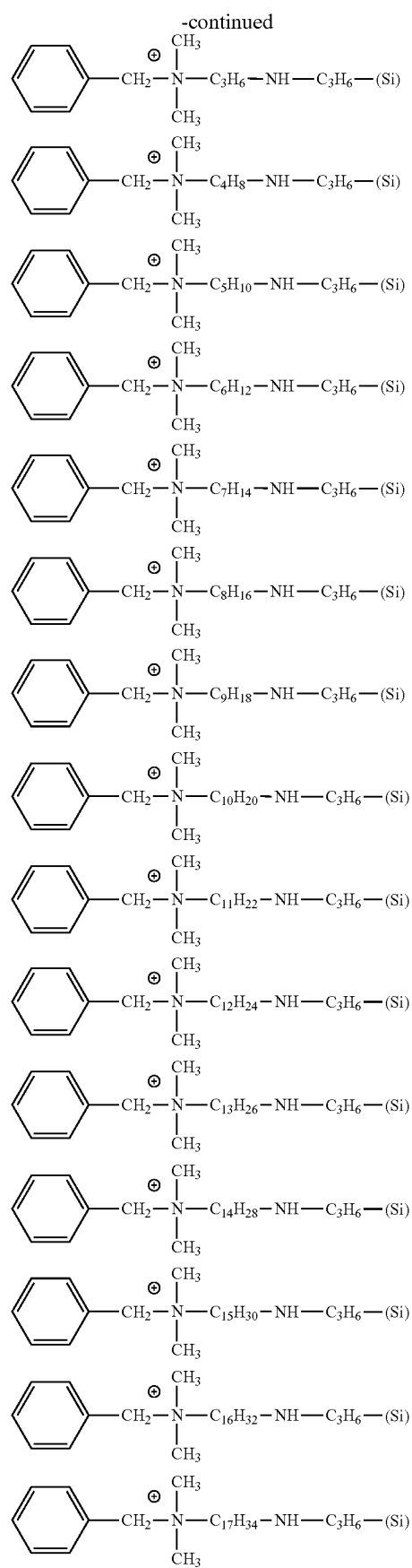
-continued
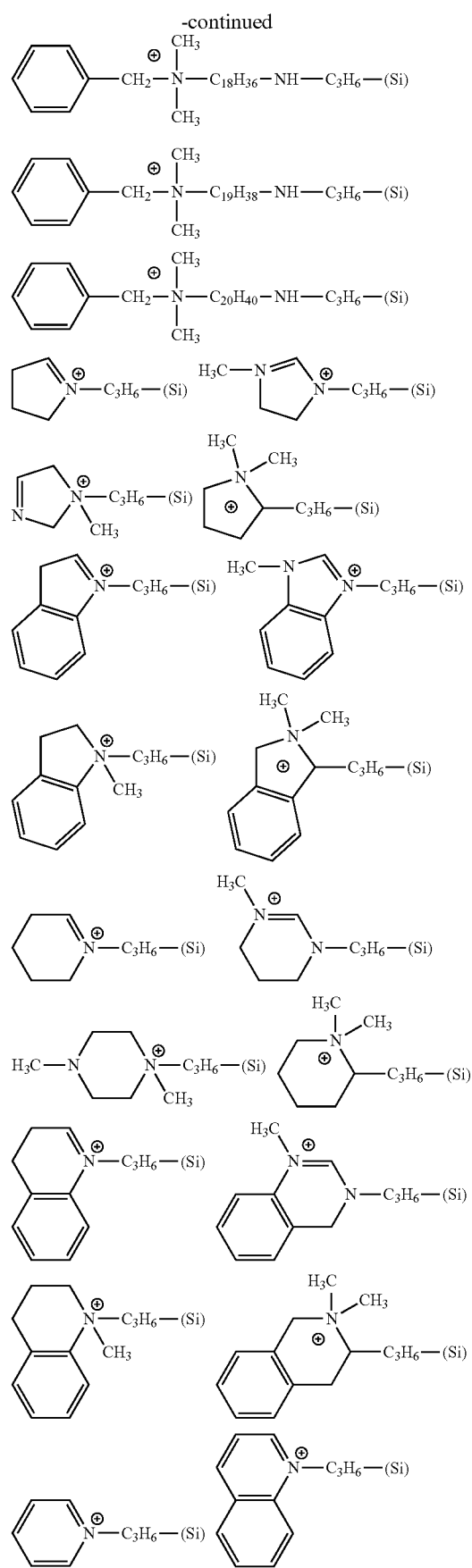

-continued

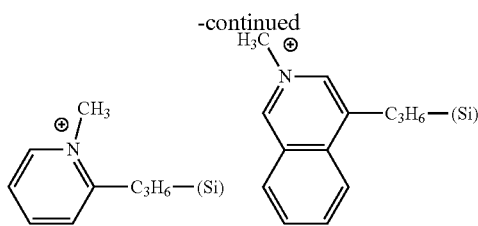

As a hydrolysable silicon compound simultaneously used with (Xm-1), (Xm-2), (Xm-3), and (Xm-4) to produce (Xc-10), the above-mentioned hydrolysable monomer (Sm) can be used, for example. Further, a hydrolysable metal compound (Mm) shown by the general formula (Mm) may be added.

A reaction raw material for forming (Xc-10) can be prepared by: selecting at least one of the monomers (Xm-1), (Xm-2), (Xm-3), and (Xm-4) described above, in addition to at least one (Sm), and optionally at least one (Mm); and mixing the selected materials before or during the reaction. The reaction conditions may follow the same method as the method for synthesizing the thermally crosslinkable polysiloxane (Sx).

The molecular weight of the silicon-containing compound (Xc-10) to be obtained can be adjusted not only through the selection of the monomers but also by controlling the reaction conditions during the polymerization. Nevertheless, it is preferable to use the silicon-containing compound (Xc-10) having a weight-average molecular weight of 100,000 or less, more preferably 200 to 50,000, further preferably 300 to 30,000. When the weight-average molecular weight is 100,000 or less, generation of foreign matters and coating spots is suppressed. Regarding data on the weight-average molecular weight, the molecular weight is expressed in terms of polystyrene which is obtained by gel permeation chromatography (GPC) using an RI (refractive index) detector, tetrahydrofuran as an eluent, and polystyrene as a reference substance.

Note that one of the crosslinking catalysts (Xc-1), (Xc-2), (Xc-3), (Xc-4), and (Xc-10) can be used alone, or two or more thereof can be used in combination. The crosslinking catalyst including the quaternary ammonium salt shown by the general formula (A-1) is added in a total amount of preferably 0.01 to 50 parts by mass, more preferably 0.1 to 40 parts by mass, based on 100 parts by mass of the base polymer (i.e., the silicon-containing compound (Sx) obtained by the above method).

(Organic Acid)

To improve the stability of the inventive composition for forming a silicon-containing resist underlayer film, it is preferable to add a monovalent, divalent, or more polyvalent organic acid having 1 to 30 carbon atoms. Examples of the acid added in this event include formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichloroacetic acid, oxalic acid, malonic acid, methylmalonic acid, ethylmalonic acid, propylmaionic acid, butylmalonic acid, dimethylmaionic acid, diethylmalonic acid, succinic acid, methylsuccinic acid, glutaric acid, adipic acid, itaconic acid, maleic acid, fumaric acid, citraconic acid, citric acid, etc. Particularly, oxalic acid, maleic acid, formic acid, acetic acid, propionic acid, citric acid, and the like are preferable. Moreover, a mixture of two or more acids may be used to keep the stability.

The amount of the organic acid to be added may be 0.001 to 25 parts by mass, preferably 0.01 to 15 parts by mass, more preferably 0.1 to 5 parts by mass, based on 100 parts by mass of silicon contained in the inventive composition for forming a silicon-containing resist underlayer film.

Otherwise, the organic acid may be blended based on the pH of the inventive composition for forming a silicon-containing resist underlayer film so as to satisfy preferably $0 \leq pH \leq 7$, more preferably $0.3 \leq pH \leq 6.5$, further preferably $0.5 \leq pH \leq 6$.

(Water)

In the present invention, water may be added to the composition. When water is added, the polysiloxane compound in the inventive composition for forming a silicon-containing resist underlayer film is hydrated, so that the lithography performance is improved. The water content in the solvent component of the inventive composition for forming a silicon-containing resist underlayer film may be more than 0 mass % and less than 50 mass %, particularly preferably 0.3 to 30 mass %, further preferably 0.5 to 20 mass %. When the amount of water added is in these ranges, the silicon-containing resist underlayer film has favorable uniformity, repelling will not occur, and the lithography performance will not be lowered, either.

The solvent including water is used in a total amount of preferably 100 to 100,000 parts by mass, particularly preferably 200 to 50,000 parts by mass, based on 100 parts by mass of the polysiloxane compound (Sx), which is the base polymer.

(Stabilizer)

Further, in the present invention, a stabilizer can be added to the composition. As the stabilizer, a monohydric, dihydric, or polyhydric alcohol having cyclic ether substituent can be added. Particularly, adding stabilizers shown in paragraphs (0181) to (0182) of JP 2009-126940A enables stability improvement of the composition for forming a silicon-containing resist underlayer film.

(Surfactant)

Further, in the present invention, a surfactant can be blended into the composition as necessary. Specifically, the materials described in paragraph (0185) of JP 2009-126940A can be added as the surfactant.

(High-Boiling-Point Solvent)

Further, in the present invention, a high-boiling-point solvent having a boiling point of 180° C. or more can also be added to the composition as necessary. Examples of the high-boiling-point solvent include 1-octanol, 2-ethylhexanol, 1-nonanol, 1-decanol, 1-undecanol, ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, glycerin, gamma-butyrolactone, tripropylene glycol monomethyl ether, diacetone alcohol, n-nonyl acetate, ethylene glycol monoethyl ether acetate, 1,2-diacetoxyethane, 1-acetoxy-2-methoxyethane, 1,2-diacetoxypropane, diethylene glycol monomethyl ether acetate, diethylene glycol monoethyl ether acetate, diethylene glycol mono-n-butyl ether acetate, propylene glycol monomethyl ether acetate, propylene glycol monopropyl ether acetate, propylene glycol monobutyl ether acetate, dipropylene glycol monomethyl ether acetate, dipropylene glycol monoethyl ether acetate, etc.

[Patterning Processes]

One of patterning processes of the present invention is a patterning process including steps of:

forming an organic film by using a coating-type organic film material on a body to be processed;

forming a silicon-containing resist underlayer film on the organic film by using the inventive composition for forming a silicon-containing resist underlayer film;

forming a resist upper layer film on the silicon-containing resist underlayer film by using a resist upper layer film composition composed of a photoresist composition;

forming a circuit pattern in the resist upper layer film;

transferring the pattern to the silicon-containing resist underlayer film by etching using the resist upper layer film having the formed circuit pattern as a mask;

transferring the pattern to the organic film by etching using the silicon-containing resist underlayer film having the transferred pattern as a mask; and transferring the pattern to the body to be processed by etching using the organic film having the transferred pattern as a mask (what is called "multilayer resist method").

Another patterning process of the present invention is a patterning process including steps of:

forming a hard mask mainly containing carbon by a CVD method on a body to be processed;

forming a silicon-containing resist underlayer film on the hard mask by using the inventive composition for forming a silicon-containing resist underlayer film;

forming a resist upper layer film on the silicon-containing resist underlayer film by using a resist upper layer film composition composed of a photoresist composition;

forming a circuit pattern in the resist upper layer film;

transferring the pattern to the silicon-containing resist underlayer film by etching using the resist upper layer film having the formed circuit pattern as a mask;

transferring the pattern to the hard mask by dry etching using the silicon-containing resist underlayer film having the transferred pattern as a mask; and transferring the pattern to the body to be processed by dry etching using the hard mask having the transferred pattern as a mask (what is called "multilayer resist method").

When a pattern is formed using the inventive composition for forming a silicon-containing resist underlayer film, the combination with the organic film or the hard mask is optimized as described above, so that an ultrafine pattern formed in the photoresist can be formed on the substrate, while suppressing pattern collapse and keeping the favorable profile. Moreover, the silicon-containing resist underlayer film remaining after the pattern formation is easily removed by etching or other means. This makes it possible to suppress defect-causing residue and prevent substrate damage under excessive etching conditions.

As described above, the invention patterning processes suppress pattern collapse of a resist upper layer film and enable formation of a favorable pattern profile. Further, a pattern is suitably transferred to the silicon-containing resist underlayer film by dry etching. Furthermore, since the silicon-containing resist underlayer film remaining after the patterning is easily removed, defect is hardly generated by the residue. Thus, the patterning processes are particularly practical for forming fine patterns.

In a positive patterning process, after photoresist film formation and heat treatment, exposure and alkaline development with alkaline developer are normally carried out to obtain a positive resist pattern. In addition, it is preferable to perform post exposure bake (PEB) after the exposure.

As the alkaline developer, a tetramethylammonium hydroxide (TMAH) aqueous solution can be used, for example.

In the step of forming the circuit pattern in the resist upper layer film, the pattern is preferably formed by a photolithography with a wavelength of 10 nm or more and 300 nm or less, direct lithography with electron beam, nanoimprinting, or a combination thereof.

The body to be processed is preferably a semiconductor device substrate, a metal film, a metal carbide film, a metal oxide film, a metal nitride film, a metal oxycarbide film, or a metal oxynitride film.

When the body to be processed is like these, the effects of the present invention are more sufficiently exhibited.

A metal constituting the body to be processed is preferably silicon, gallium, titanium, tungsten, hafnium, zirconium, chromium, germanium, copper, silver, gold, indium, arsenic, palladium, tantalum, iridium, aluminum, iron, molybdenum, cobalt, or an alloy thereof.

When the metal constituting the body to be processed is a certain metal as listed above, the effects of the present invention are more sufficiently exhibited.

EXAMPLE

Hereinafter, the present invention will be specifically described with reference to Synthesis Examples, Examples, and Comparative Examples. However, the present invention is not limited to these descriptions. Note that, in the following examples, % means mass %, and molecular weight Mw means weight-average molecular weight in terms of polystyrene determined by GPC measurement.

Synthesis Example 1

To a mixture containing 120 g of methanol, 0.1 g of 10% nitric acid, and 60 g of deionized water, a mixture containing 30.6 g of Compound (101), 38.1 g of Compound (102), and 5.9 g of Compound (110) was added and maintained at 40° C. for 12 hours to perform hydrolysis condensation. After completion of the reaction, 600 g of propylene glycol ethyl ether (PGEE) was added thereto. Then, the water used for the hydrolysis condensation and by-produced alcohol were distilled off under reduced pressure. Thus, 440 g of PGEE solution of Polysiloxane Compound 1 was obtained (compound concentration: 10%). The molecular weight of Polysiloxane Compound 1 was measured in terms of polystyrene and found Mw=2,900.

Synthesis Examples 2 to 16

[Synthesis Example 2] to [Synthesis Example 16] were carried out under the same conditions as in Synthesis Example 1 by using monomers shown in Table 1 to obtain the target products.

TABLE 1

| Synthesis Example | Reaction raw materials | Mw |
|---|---|---|
| 1 | Compound (101): 30.6 g, Compound (102): 38.1 g, Compound (110): 5.9 g | 2900 |
| 2 | Compound (101): 30.6 g, Compound (102): 38.1 g, Compound (111): 6.4 g | 2300 |
| 3 | Compound (101): 30.6 g, Compound (102): 38.1 g, Compound (112): 7.0 g | 2900 |

TABLE 1-continued

| Synthesis Example | Reaction raw materials | Mw |
|---|---|---|
| 4 | Compound (101): 30.6 g, Compound (102): 38.1 g, Compound (113): 6.8 g | 2300 |
| 5 | Compound (101): 30.6 g, Compound (102): 38.1 g, Compound (114): 7.1 g | 2500 |
| 6 | Compound (101): 30.6 g, Compound (102): 38.1 g, Compound (115): 8.9 g | 2600 |
| 7 | Compound (101): 30.6 g, Compound (102): 38.1 g, Compound (116): 8.0 g | 2300 |
| 8 | Compound (100): 5.0 g, Compound (101): 30.6 g, Compound (102): 38.1 g | 2500 |
| 9 | Compound (101): 13.6 g, Compound (102): 53.3 g, Compound (110): 11.8 g | 2100 |
| 10 | Compound (101): 13.6 g, Compound (102): 53.3 g, Compound (111): 12.7 g | 2800 |
| 11 | Compound (101): 13.6 g, Compound (102): 53.3 g, Compound (112): 13.9 g | 2500 |
| 12 | Compound (101): 13.6 g, Compound (102): 53.3 g, Compound (113): 13.5 g | 2500 |
| 13 | Compound (101): 13.6 g, Compound (102): 53.3 g, Compound (114): 14.2 g | 2700 |
| 14 | Compound (101): 13.6 g, Compound (102): 53.3 g, Compound (115): 17.7 g | 2700 |
| 15 | Compound (101): 13.6 g, Compound (102): 53.3 g, Compound (116): 16.0 g | 3000 |
| 16 | Compound (100): 5.0 g, Compound (101): 17.0 g, Compound (102): 53.3 g | 2800 |

The compounds used in Examples and Comparative Examples are shown below.

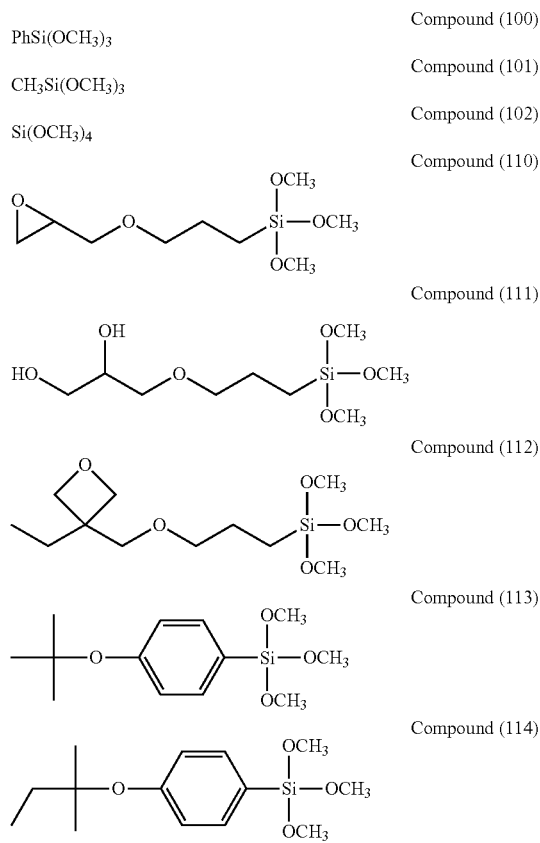

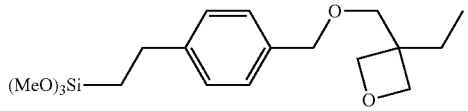

Compound (115)

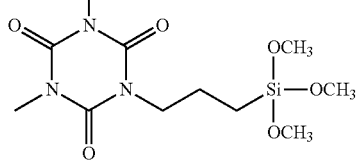

Compound (116)

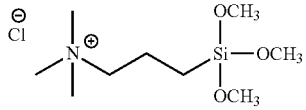

Compound (117)

Synthesis Example of Crosslinking Catalyst

To a mixture containing 120 g of methanol, 0.1 g of 10% nitric acid, and 60 g of deionized water, a mixture containing 61.3 g of Compound (101) and 12.9 g of Compound (117) was added and maintained at 40° C. for 12 hours to perform hydrolysis condensation. After completion of the reaction, 300 g of propylene glycol ethyl ether (PGEE) was added thereto. Then, the water used for the hydrolysis condensation and by-produced alcohol were distilled off under reduced pressure. Thus, 250 g of PGEE solution of ammonium salt-containing Polysiloxane Compound 17 was obtained (compound concentration: 20%). The molecular weight of Polysiloxane Compound 17 was measured in terms of polystyrene and found Mw=1,500.

Examples, Comparative Examples

Polysiloxane Compounds 1 to 16 obtained in Synthesis Examples, quaternary ammonium salts shown by the general formula (A-1) as crosslinking catalysts or comparative crosslinking catalysts, photoacid generators (PAG-1 to -7 shown in Table 7), acid, solvents, and water were mixed at ratios shown in Tables 2 to 6. Each mixture was filtered through a 0.1-μm filter made of fluorinated resin. Thus, composition solutions for forming a silicon-containing underlayer film were prepared and referred to as Sol. 1 to Sol. 96 hereinbelow.

TABLE 2

| No. | Polysiloxane (parts by mass) | Crosslinking catalyst (parts by mass) | Photoacid generator (parts by mass) | Acid (parts by mass) | Solvent (parts by mass) | Water (parts by mass) |
|---|---|---|---|---|---|---|
| Sol.1 | Compound 1 (1) | XL-1 (0.03) | none | maleic acid (0.01) | PGEE (100) | water (10) |
| Sol.2 | Compound 1 (1) | XL-2 (0.03) | none | maleic acid (0.01) | PGEE (100) | water (10) |
| Sol.3 | Compound 1 (1) | XL-3 (0.03) | none | maleic acid (0.01) | PGEE (90) GBL (10) | water (10) |
| Sol.4 | Compound 1 (1) | XL-7 (0.03) | none | maleic acid (0.01) | PGEE (100) | water (10) |
| Sol.5 | Compound 1 (1) | XL-8 (0.03) | PAG-3 (0.01) | maleic acid (0.01) | PGEE (100) | water (10) |
| Sol.6 | Compound 1 (1) | XL-9 (0.03) | none | maleic acid (0.01) | PGEE (100) | water (10) |
| Sol.7 | Compound 2 (1) | XL-4 (0.03) | PAG-1 (0.01) | maleic acid (0.01) | PGEE (100) | water (10) |
| Sol.8 | Compound 2 (1) | XL-5 (0.03) | none | maleic acid (0.01) | PGEE (100) | water (10) |
| Sol.9 | Compound 2 (1) | XL-6 (0.03) | none | maleic acid (0.01) | PGEE (100) | water (10) |
| Sol.10 | Compound 2 (1) | XL-10 (0.03) | none | maleic acid (0.01) | PGEE (100) | water (10) |
| Sol.11 | Compound 2 (1) | XL-3 (0.015) XL-11 (0.015) | none | maleic acid (0.01) | PGEE (100) | water (10) |
| Sol.12 | Compound 2 (1) | XL-12 (0.03) | none | maleic acid (0.01) | PGEE (100) | water (10) |
| Sol.13 | Compound 3 (1) | XL-1 (0.03) | PAG-6 (0.01) | maleic acid (0.01) | PGEE (90) PGME (10) | water (10) |
| Sol.14 | Compound 3 (1) | XL-2 (0.03) | none | maleic acid (0.01) | PGEE (100) | water (10) |
| Sol.15 | Compound 3 (1) | XL-3 (0.03) | none | maleic acid (0.01) | PGEE (100) | water (10) |
| Sol.16 | Compound 3 (1) | XL-13 (0.03) | PAG-3 (0.01) | maleic acid (0.01) | PGEE (100) | water (10) |
| Sol.17 | Compound 3 (1) | XL-14 (0.03) | none | maleic acid (0.01) | PGEE (100) | water (10) |
| Sol.18 | Compound 3 (1) | XL-15 (0.03) | none | maleic acid (0.01) | PGEE (100) | water (10) |
| Sol.19 | Compound 4 (1) | XL-4 (0.03) | PAG-2 (0.01) | maleic acid (0.01) | PGEE (100) | water (10) |
| Sol.20 | Compound 4 (1) | XL-5 (0.03) | none | maleic acid (0.01) | PGEE (100) | water (10) |
| Sol.21 | Compound 4 (1) | XL-2 (0.015) XL-3 (0.015) | none | maleic acid (0.01) | PGEE (100) | water (10) |
| Sol.22 | Compound 4 (1) | XL-16 (0.03) | none | maleic acid (0.01) | PGEE (100) | water (10) |

TABLE 3

| No. | Polysiloxane (parts by mass) | Crosslinking catalyst (parts by mass) | Photoacid generator (parts by mass) | Acid (parts by mass) | Solvent (parts by mass) | Water (parts by mass) |
|---|---|---|---|---|---|---|
| Sol.23 | Compound 4 (1) | XL-17 (0.03) | none | maleic acid (0.01) | PGEE (100) | water (10) |
| Sol.24 | Compound 5 (1) | XL-1 (0.03) | PAG-7 (0.01) | maleic acid (0.01) | PGEE (100) | water (10) |
| Sol.25 | Compound 5 (1) | XL-2 (0.03) | none | maleic acid (0.01) | PGEE (100) | water (10) |
| Sol.26 | Compound 5 (1) | XL-3 (0.03) | none | maleic acid (0.01) | PGEE (100) | water (10) |
| Sol.27 | Compound 5 (1) | XL-7 (0.03) | none | maleic acid (0.01) | PGEE (100) | water (10) |
| Sol.28 | Compound 5 (1) | XL-8 (0.03) | none | maleic acid (0.01) | PGEE (90) PGME (10) | water (10) |
| Sol.29 | Compound 5 (1) | XL-9 (0.03) | none | maleic acid (0.01) | PGEE (100) | water (10) |
| Sol.30 | Compound 6 (1) | XL-4 (0.03) | none | maleic acid (0.01) | PGEE (100) | water (10) |
| Sol.31 | Compound 6 (1) | XL-5 (0.03) | PAG-5 (0.01) | maleic acid (0.01) | PGEE (90) GBL (10) | water (10) |

TABLE 3-continued

| No. | Polysiloxane (parts by mass) | Crosslinking catalyst (parts by mass) | Photoacid generator (parts by mass) | Acid (parts by mass) | Solvent (parts by mass) | Water (parts by mass) |
|---|---|---|---|---|---|---|
| Sol.32 | Compound 6 (1) | XL-6 (0.03) | none | maleic acid (0.01) | PGEE (100) | water (10) |
| Sol.33 | Compound 6 (1) | XL-10 (0.03) | none | maleic acid (0.01) | PGEE (100) | water (10) |
| Sol.34 | Compound 6 (1) | XL-11 (0.03) | none | maleic acid (0.01) | PGEE (100) | water (10) |
| Sol.35 | Compound 6 (1) | XL-12 (0.03) | none | maleic acid (0.01) | PGEE (100) | water (10) |
| Sol.36 | Compound 7 (1) | XL-1 (0.03) | none | maleic acid (0.01) | PGEE (100) | water (10) |
| Sol.37 | Compound 7 (1) | XL-2 (0.03) | none | maleic acid (0.01) | PGEE (100) | water (10) |
| Sol.38 | Compound 7 (1) | XL-1 (0.015) XL-4 (0.015) | none | maleic acid (0.01) | PGEE (100) | water (10) |
| Sol.39 | Compound 7 (1) | XL-13 (0.03) | none | maleic acid (0.01) | PGEE (100) | water (10) |
| Sol.40 | Compound 7 (1) | XL-14 (0.03) | PAG-6 (0.01) | maleic acid (0.01) | PGEE (100) | water (10) |
| Sol.41 | Compound 7 (1) | XL-15 (0.03) | none | maleic acid (0.01) | PGEE (100) | water (10) |
| Sol.42 | Compound 8 (1) | XL-4 (0.03) | none | maleic acid (0.01) | PGEE (100) | water (10) |
| Sol.43 | Compound 8 (1) | XL-5 (0.03) | none | maleic acid (0.01) | PGEE (90) DAA (10) | water (10) |
| Sol.44 | Compound 8 (1) | XL-6 (0.03) | none | maleic acid (0.01) | PGEE (100) | water (10) |

TABLE 4

| No. | Polysiloxane (parts by mass) | Crosslinking catalyst (parts by mass) | Photoacid generator (parts by mass) | Acid (parts by mass) | Solvent (parts by mass) | Water (parts by mass) |
|---|---|---|---|---|---|---|
| Sol.45 | Compound 8 (1) | XL-16 (0.03) | none | maleic acid (0.01) | PGEE (100) | water (10) |
| Sol.46 | Compound 8 (1) | XL-17 (0.03) | none | maleic acid (0.01) | PGEE (100) | water (10) |
| Sol.47 | Compound 9 (1) | XL-1 (0.03) | none | maleic acid (0.01) | PGEE (100) | water (10) |
| Sol.48 | Compound 9 (1) | XL-2 (0.03) | none | maleic acid (0.01) | PGEE (90) GBL (10) | water (10) |
| Sol.49 | Compound 9 (1) | XL-3 (0.03) | none | maleic acid (0.01) | PGEE (100) | water (10) |
| Sol.50 | Compound 9 (1) | XL-7 (0.03) | none | maleic acid (0.01) | PGEE (100) | water (10) |
| Sol.51 | Compound 9 (1) | XL-2 (0.015) XL-8 (0.015) | none | maleic acid (0.01) | PGEE (100) | water (10) |
| Sol.52 | Compound 9 (1) | XL-9 (0.03) | none | maleic acid (0.01) | PGEE (100) | water (10) |
| Sol.53 | Compound 10 (1) | XL-4 (0.03) | none | maleic acid (0.01) | PGEE (100) | water (10) |
| Sol.54 | Compound 10 (1) | XL-5 (0.03) | none | maleic acid (0.01) | PGEE (100) | water (10) |
| Sol.55 | Compound 10 (1) | XL-6 (0.03) | none | maleic acid (0.01) | PGEE (100) | water (10) |
| Sol.56 | Compound 10 (1) | XL-10 (0.03) | none | maleic acid (0.01) | PGEE (100) | water (10) |
| Sol.57 | Compound 10 (1) | XL-11 (0.03) | none | maleic acid (0.01) | PGEE (90) PGME (10) | water (10) |
| Sol.58 | Compound 10 (1) | XL-12 (0.03) | none | maleic acid (0.01) | PGEE (100) | water (10) |
| Sol.59 | Compound 11 (1) | XL-1 (0.03) | PAG-1 (0.01) | maleic acid (0.01) | PGEE (90) GBL (10) | water (10) |
| Sol.60 | Compound 11 (1) | XL-2 (0.03) | none | maleic acid (0.01) | PGEE (100) | water (10) |
| Sol.61 | Compound 11 (1) | XL-3 (0.03) | none | maleic acid (0.01) | PGEE (100) | water (10) |
| Sol.62 | Compound 11 (1) | XL-13 (0.03) | none | maleic acid (0.01) | PGEE (100) | water (10) |

TABLE 4-continued

| No. | Polysiloxane (parts by mass) | Crosslinking catalyst (parts by mass) | Photoacid generator (parts by mass) | Acid (parts by mass) | Solvent (parts by mass) | Water (parts by mass) |
|---|---|---|---|---|---|---|
| Sol.63 | Compound 11 (1) | XL-14 (0.03) | none | maleic acid (0.01) | PGEE (100) | water (10) |
| Sol.64 | Compound 11 (1) | XL-15 (0.03) | none | maleic acid (0.01) | PGEE (100) | water (10) |
| Sol.65 | Compound 12 (1) | XL-4 (0.03) | PAG-4 (0.01) | maleic acid (0.01) | PGEE (100) | water (10) |
| Sol.66 | Compound 12 (1) | XL-5 (0.03) | none | maleic acid (0.01) | PGEE (100) | water (10) |

TABLE 5

| No. | Polysiloxane (parts by mass) | Crosslinking catalyst (parts by mass) | Photoacid generator (parts mass) | Acid (parts by mass) | Solvent (parts by mass) | Water (parts by mass) |
|---|---|---|---|---|---|---|
| Sol.67 | Compound 12 (1) | XL-6 (0.03) | none | maleic acid (0.01) | PGEE (90) PGME (10) | water (10) |
| Sol.68 | Compound 12 (1) | XL-16 (0.03) | none | maleic acid (0.01) | PGEE (100) | water (10) |
| Sol.69 | Compound 12 (1) | XL-17 (0.03) | none | maleic acid (0.01) | PGEE (100) | water (10) |
| Sol.70 | Compound 13 (1) | XL-1 (0.03) | none | maleic acid (0.01) | PGEE (100) | water (10) |
| Sol.71 | Compound 13 (1) | XL-2 (0.03) | none | maleic acid (0.01) | PGEE (100) | water (10) |
| Sol.72 | Compound 13 (1) | XL-3 (0.03) | none | maleic acid (0.01) | PGEE (100) | water (10) |
| Sol.73 | Compound 13 (1) | XL-7 (0.03) | none | maleic acid (0.01) | PGEE (100) | water (10) |
| Sol.74 | Compound 13 (1) | XL-8 (0.03) | none | maleic acid (0.01) | PGEE (100) | water (10) |
| Sol.75 | Compound 13 (1) | XL-9 (0.03) | none | maleic acid (0.01) | PGEE (100) | water (10) |
| Sol.76 | Compound 14 (1) | XL-4 (0.03) | PAG-4 (0.01) | maleic acid (0.01) | PGEE (100) | water (10) |
| Sol.77 | Compound 14 (1) | XL-1 (0.015) XL-2 (0.015) | none | maleic acid (0.01) | PGEE (100) | water (10) |
| Sol.78 | Compound 14 (1) | XL-6 (0.03) | none | maleic acid (0.01) | PGEE (90) GBL (10) | water (10) |
| Sol.79 | Compound 14 (1) | XL-10 (0.03) | none | maleic acid (0.01) | PGEE (100) | water (10) |
| Sol.80 | Compound 14 (1) | XL-11 (0.03) | none | maleic acid (0.01) | PGEE (100) | water (10) |
| Sol.81 | Compound 14 (1) | XL-12 (0.03) | none | maleic acid (0.01) | PGEE (100) | water (10) |
| Sol.82 | Compound 15 (1) | XL-1 (0.03) | PAG-5 (0.01) | maleic acid (0.01) | PGEE (100) | water (10) |
| Sol.83 | Compound 15 (1) | XL-2 (0.03) | none | maleic acid (0.01) | PGEE (100) | water (10) |
| Sol.84 | Compound 15 (1) | XL-3 (0.015) XL-5 (0.015) | none | maleic acid (0.01) | PGEE (100) | water (10) |
| Sol.85 | Compound 15 (1) | XL-13 (0.03) | none | maleic acid (0.01) | PGEE (100) | water (10) |
| Sol.86 | Compound 15 (1) | XL-14 (0.03) | none | maleic acid (0.01) | PGEE (100) | water (10) |
| Sol.87 | Compound 15 (1) | XL-15 (0.03) | none | maleic acid (0.01) | PGEE (100) | water (10) |
| Sol.88 | Compound 16 (1) | XL-4 (0.03) | none | maleic acid (0.01) | PGEE (90) DAA (10) | water (10) |

TABLE 6

| No. | Polysiloxane (parts by mass) | Crosslinking catalyst (parts by mass) | Photoacid generator (parts by mass) | Acid (parts by mass) | Solvent (parts by mass) | Water (parts by mass) |
|---|---|---|---|---|---|---|
| Sol.89 | Compound 16 (1) | XL-5 (0.03) | none | maleic acid (0.01) | PGEE (100) | water (10) |
| Sol.90 | Compound 16 (1) | XL-6 (0.03) | none | maleic acid (0.01) | PGEE (100) | water (10) |
| Sol.91 | Compound 16 (1) | XL-16 (0.03) | none | maleic acid (0.01) | PGEE (100) | water (10) |
| Sol.92 | Compound 16 (1) | XL-17 (0.03) | none | maleic acid (0.01) | PGEE (100) | water (10) |
| Sol.93 | Compound 1 (1) | XL-18 (0.03) | PAG-1 (0.01) | maleic acid (0.01) | PGEE (100) | water (10) |
| Sol.94 | Compound 5 (1) | XL-19 (0.03) | PAG-3 (0.01) | maleic acid (0.01) | PGEE (100) | water (10) |
| Sol.95 | Compound 7 (1) | XL-20 (0.03) | PAG-4 (0.01) | maleic acid (0.01) | PGEE (100) | water (10) |
| Sol.96 | Compound 14 (1) | XL-21 (0.03) | PAG-5 (0.01) | maleic acid (0.01) | PGEE (100) | water (10) |

The following crosslinking catalysts were used.
XL-1 . . . trimethylphenylammonium hydroxide
XL-2 . . . trimethylphenylammonium nitrate
XL-3 . . . triethylphenylammonium iodide
XL-4 . . . benzyldimethylphenylammonium chloride
XL-5 . . . dimethyldiphenylammonium chloride
XL-6 . . . 3-(trifluoromethyl)phenyltrimethylammonium hydroxide
XL-7 to -17 . . . see the following formulae
XL-18 . . . tetramethylammonium nitrate
XL-19 . . . tetraoctylammonium nitrate
XL-20 . . . trimethylsulfonium iodide
XL-21 . . . ammonium salt-containing Polysiloxane Compound

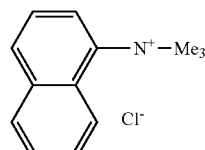

XL-7

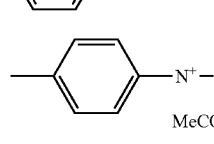

XL-8

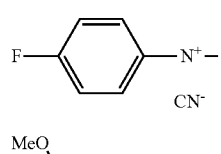

XL-9

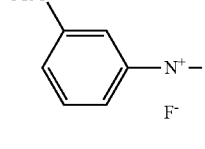

XL-10

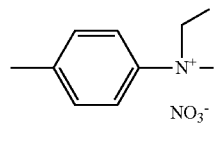

XL-11

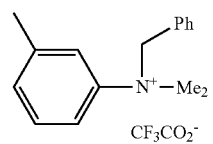

XL-12

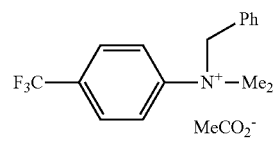

XL-13

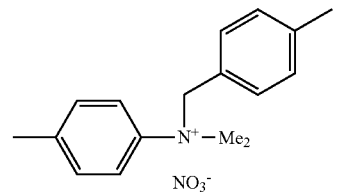

XL-14

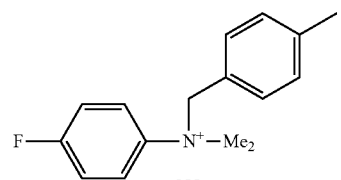

XL-15

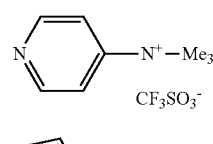

XL-16

XL-17

The following solvents were used.
PGEE . . . propylene glycol ethyl ether
PGME . . . propylene glycol methyl ether
GBL . . . gamma-butyrolactone
DAA . . . diacetone alcohol

TABLE 7

| PAG | |
|---|---|
| 1 | |
| 2 | |
| 3 | |
| 4 | |
| 5 | |

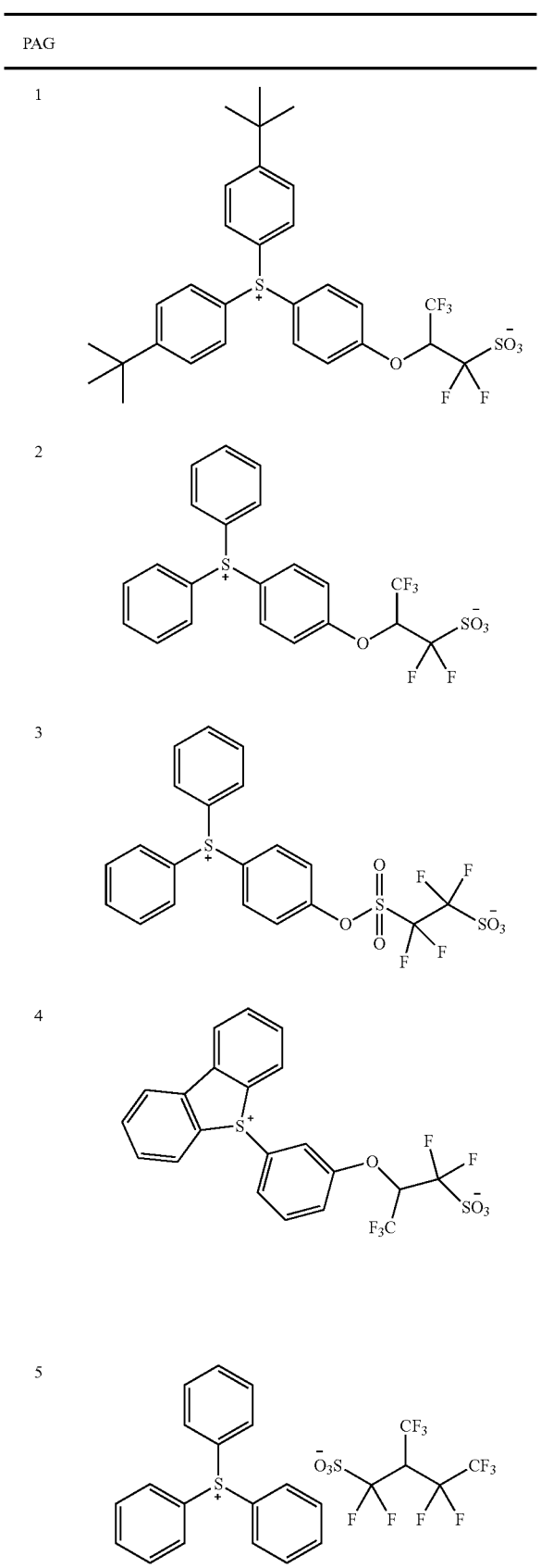

TABLE 7-continued

| PAG | |
|---|---|
| 6 | |
| 7 | |

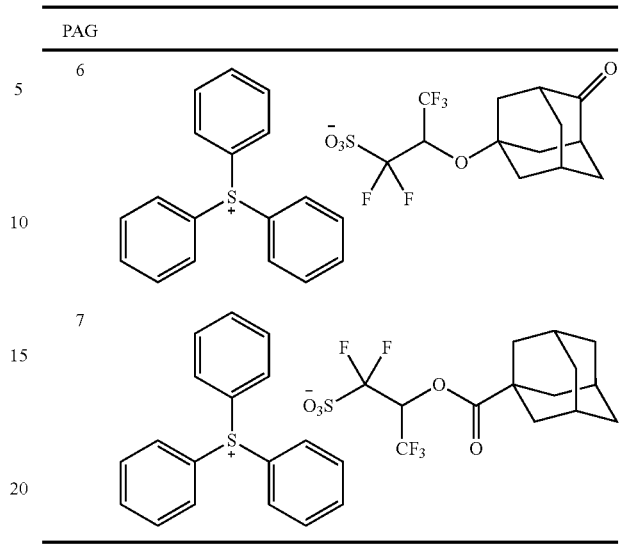

(EUV Patterning Test)

A silicon wafer was spin-coated with one of the composition Sols. 1 to 96 for forming a silicon-containing resist underlayer film, and heated at 220° C. for 60 seconds. In this way, silicon-containing films (polysiloxane resist underlayer films) were prepared as Films 1 to 96 each of which had a film thickness of 25 nm on the Si substrate.

Subsequently, Films 1 to 96 were each spin-coated with a resist material in which the following components were dissolved at ratios in Table 8, and prebaked at 105° C. for 60 seconds using a hot plate to prepare a resist film having a film thickness of 35 nm. The resultant was exposed using an EUV scanner NXE3300 (manufactured by ASML, NA: 0.33, a: 0.9/0.6, quadrupole illumination for an L/S pattern with a pitch of 36 nm (on-wafer size)), followed by PEB at 100° C. for 60 seconds on the hot plate and development with a 2.38 mass % TMAH aqueous solution for 30 seconds to obtain a line with a dimension of 18 nm.

The resulting line dimension was measured with a CD-SEM (CG5000) manufactured by Hitachi High-Technologies Corporation, and evaluated to be: good if no pattern collapse with a line width of 15 nm was observed; or poor if a pattern collapse was observed. Moreover, the sectional profile was observed with an electron microscope (S-4800) manufactured by Hitachi High-Technologics Corporation, and evaluated to be: good if no footing was observed; or poor if footing was clearly observed.

The following polymer, quencher, sensitizer, surfactant, and organic solvents were used.

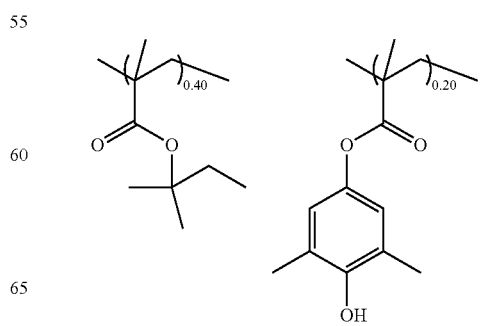

-continued

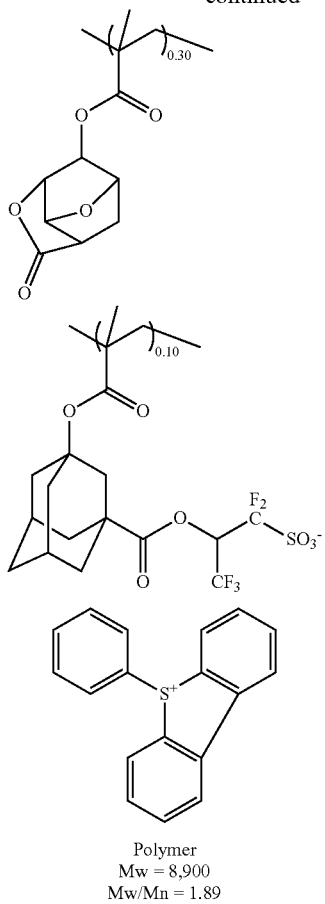

Polymer
Mw = 8,900
Mw/Mn = 1.89

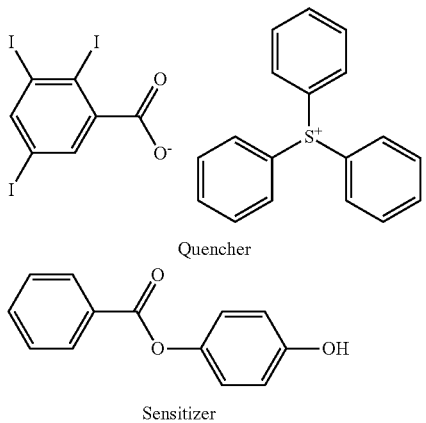

Quencher

Sensitizer

Surfactant: FC-4430 manufactured by 3M
PGMEA: propylene glycol monomethyl ether acetate
CyHO: cyclohexanone
PGME: propylene glycol monomethyl ether

TABLE 8

| Components | Polymer | Quencher | Sensitizer | Surfactant | Organic solvents |
|---|---|---|---|---|---|
| Composition (parts by mass) | (100) | (4.0) | (2.1) | (0.25) | PGMEA (400) CyHO (2000) PGME (100) |

(Coating-Film Etching Test)

A silicon wafer was spin-coated with one of the composition Sols. 1 to 96 for forming a silicon-containing resist underlayer film, and heated at 220° C. for 60 seconds. In this way, silicon-containing films were prepared as Films 1 to 96 each of which had a film thickness of 25 nm on the Si substrate.

These films were subjected to an etching test under the following etching conditions.

If the dry etching rate is at least 44 nm/min under the following conditions, the film is considered to have sufficient etching rate.

Etching Test with $CHF_3/CF_4$-based Gas Apparatus: a dry etching apparatus Telius SP manufactured by Tokyo Electron Limited Etching Conditions:

| Chamber pressure | 10 Pa |
|---|---|
| Upper/Lower RF power | 200 W/100 W |
| $CHF_3$ gas flow rate | 50 ml/min |
| $CF_4$ gas flow rate | 50 ml/min |
| $N_2$ gas flow rate | 100 ml/min |
| Treatment time | 20 sec |

Tables 9 to 11 show the test results.

TABLE 9

| Example | Polysiloxane resist underlayer film | Pattern collapse/ Pattern profile | Dry etching rate (nm/min) with $CHF_3/CF_4$-based gas |
|---|---|---|---|
| Example 1-1 | Film 1 | good/good | 48.5 |
| Example 1-2 | Film 2 | good/good | 49.2 |
| Example 1-3 | Film 3 | good/good | 49.3 |
| Example 1-4 | Film 4 | good/good | 48.7 |
| Example 1-5 | Film 5 | good/good | 48.8 |
| Example 1-6 | Film 6 | good/good | 48.6 |
| Example 1-7 | Film 7 | good/good | 48.3 |
| Example 1-8 | Film 8 | good/good | 49 |
| Example 1-9 | Film 9 | good/good | 49 |
| Example 1-10 | Film 10 | good/good | 49.1 |
| Example 1-11 | Film 11 | good/good | 49.3 |
| Example 1-12 | Film 12 | good/good | 48.8 |
| Example 1-13 | Film 13 | good/good | 47.9 |
| Example 1-14 | Film 14 | good/good | 48.2 |
| Example 1-15 | Film 15 | good/good | 48.2 |
| Example 1-16 | Film 16 | good/good | 48.7 |
| Example 1-17 | Film 17 | good/good | 48.9 |
| Example 1-18 | Film 18 | good/good | 49 |
| Example 1-19 | Film 19 | good/good | 48 |
| Example 1-20 | Film 20 | good/good | 47.6 |
| Example 1-21 | Film 21 | good/good | 48.6 |
| Example 1-22 | Film 22 | good/good | 48.9 |
| Example 1-23 | Film 23 | good/good | 49.3 |
| Example 1-24 | Film 24 | good/good | 47.6 |
| Example 1-25 | Film 25 | good/good | 48.6 |
| Example 1-26 | Film 26 | good/good | 49 |
| Example 1-27 | Film 27 | good/good | 49.2 |
| Example 1-28 | Film 28 | good/good | 48.8 |
| Example 1-29 | Film 29 | good/good | 48.5 |
| Example 1-30 | Film 30 | good/good | 47 |
| Example 1-31 | Film 31 | good/good | 46.8 |
| Example 1-32 | Film 32 | good/good | 47.3 |
| Example 1-33 | Film 33 | good/good | 49.1 |
| Example 1-34 | Film 34 | good/good | 48.8 |
| Example 1-35 | Film 35 | good/good | 48.4 |
| Example 1-36 | Film 36 | good/good | 48 |
| Example 1-37 | Film 37 | good/good | 48.3 |
| Example 1-38 | Film 38 | good/good | 48.4 |
| Example 1-39 | Film 39 | good/good | 48.3 |
| Example 1-40 | Film 40 | good/good | 48.5 |

TABLE 10

| Example | Polysiloxane resist underlayer film | Pattern collapse/ Pattern profile | Dry etching rate (nm/min) with $CHF_3/CF_4$-based gas |
|---|---|---|---|
| Example 1-41 | Film 41 | good/good | 48.7 |
| Example 1-42 | Film 42 | good/good | 47.5 |
| Example 1-43 | Film 43 | good/good | 47.6 |
| Example 1-44 | Film 44 | good/good | 47.8 |
| Example 1-45 | Film 45 | good/good | 49.1 |
| Example 1-46 | Film 46 | good/good | 49.3 |
| Example 1-47 | Film 47 | good/good | 48 |
| Example 1-48 | Film 48 | good/good | 47.6 |
| Example 1-49 | Film 49 | good/good | 48 |
| Example 1-50 | Film 50 | good/good | 48.7 |
| Example 1-51 | Film 51 | good/good | 48.9 |
| Example 1-52 | Film 52 | good/good | 49.4 |
| Example 1-53 | Film 53 | good/good | 48.4 |
| Example 1-54 | Film 54 | good/good | 47.9 |
| Example 1-55 | Film 55 | good/good | 48 |
| Example 1-56 | Film 56 | good/good | 49.1 |
| Example 1-57 | Film 57 | good/good | 49.3 |
| Example 1-58 | Film 58 | good/good | 48.6 |
| Example 1-59 | Film 59 | good/good | 46 |
| Example 1-60 | Film 60 | good/good | 46.3 |
| Example 1-61 | Film 61 | good/good | 46.5 |
| Example 1-62 | Film 62 | good/good | 49.2 |
| Example 1-63 | Film 63 | good/good | 48.8 |
| Example 1-64 | Film 64 | good/good | 49.4 |
| Example 1-65 | Film 65 | good/good | 47.1 |
| Example 1-66 | Film 66 | good/good | 47.4 |
| Example 1-67 | Film 67 | good/good | 47.6 |
| Example 1-68 | Film 68 | good/good | 48.3 |
| Example 1-69 | Film 69 | good/good | 48.6 |
| Example 1-70 | Film 70 | good/good | 46.2 |
| Example 1-71 | Film 71 | good/good | 46.8 |
| Example 1-72 | Film 72 | good/good | 46.3 |
| Example 1-73 | Film 73 | good/good | 48.3 |
| Example 1-74 | Film 74 | good/good | 48.9 |
| Example 1-75 | Film 75 | good/good | 48.2 |
| Example 1-76 | Film 76 | good/good | 46.2 |
| Example 1-77 | Film 77 | good/good | 47.2 |
| Example 1-78 | Film 78 | good/good | 46.2 |
| Example 1-79 | Film 79 | good/good | 48.5 |
| Example 1-80 | Film 80 | good/good | 48.6 |

TABLE 11

| Example | Polysiloxane resist underlayer film | Pattern collapse/ Pattern profile | Dry etching rate (nm/min) with $CHF_3/CF_4$-based gas |
|---|---|---|---|
| Example 1-81 | Film 81 | good/good | 48.5 |
| Example 1-82 | Film 82 | good/good | 46.7 |
| Example 1-83 | Film 83 | good/good | 46.2 |
| Example 1-84 | Film 84 | good/good | 47.3 |
| Example 1-85 | Film 85 | good/good | 48.6 |
| Example 1-86 | Film 86 | good/good | 48.2 |
| Example 1-87 | Film 87 | good/good | 48.1 |
| Example 1-88 | Film 88 | good/good | 45.2 |
| Example 1-89 | Film 89 | good/good | 46.3 |
| Example 1-90 | Film 90 | good/good | 44.8 |
| Example 1-91 | Film 91 | good/good | 47.8 |
| Example 1-92 | Film 92 | good/good | 48.3 |
| Comparative Example 1-1 | Film 93 | poor/good | 48.7 |
| Comparative Example 1-2 | Film 94 | good/poor | 38.5 |
| Comparative Example 1-3 | Film 95 | poor/poor | 47.8 |
| Comparative Example 1-4 | Film 96 | poor/poor | 43.8 |

As shown in Tables 9 to 11, in Examples 1-1 to 1-92 using the inventive quaternary ammonium salts (XL-1 to XL-17) shown by the general formula (A-1) as the crosslinking catalysts, the effect of suppressing pattern collapse and favorable pattern profiles were observed, and having sufficient etching rates was verified.

Meanwhile, in Comparative Example 1-1, 1-3, and 1-4 using the salts (XL-18 to XL-21) different from the quaternary ammonium salts shown by the general formula (A-1) as the crosslinking catalysts, pattern collapses at the line width of 15 nm were observed. In Comparative Example 1-2, 1-3, and 1-4, footings were clearly observed. Moreover, in Comparative Examples 1-2 and 1-4, not having sufficient etching rate was verified.

The above results have revealed that when the inventive quaternary ammonium salt shown by the general formula (A-1) (XL-1 to XL-17) is used as a crosslinking catalyst, excellent effect of suppressing pattern collapse, effect of forming favorable pattern, and sufficient etching rate are demonstrated in comparison with those of the conventional techniques.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A composition for forming a silicon-containing resist underlayer film, comprising at least:

one or more kinds of a quaternary ammonium salt having an organic or inorganic anion as a counterion of a quaternary ammonium cation selected from the group consisting of cations shown by the formulae below:

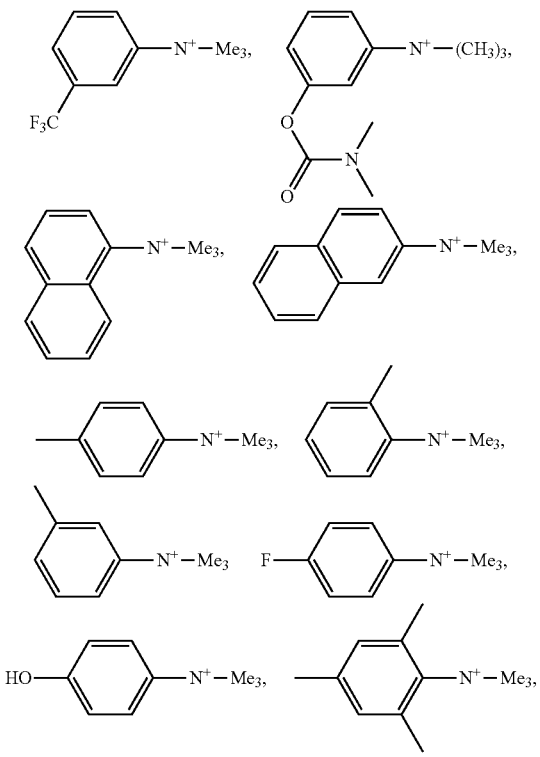

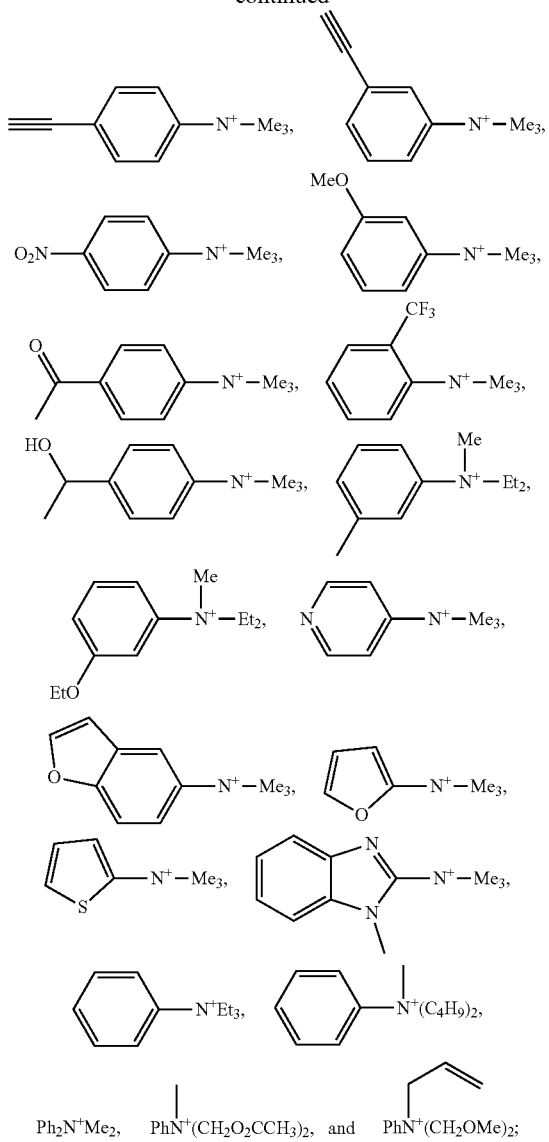

a thermally crosslinkable polysiloxane (Sx); and an acid generator, wherein the acid generator is a sulfonium salt which is a photoacid generator and generates an acid by an action of a high energy beam.

2. The composition for forming a silicon-containing resist underlayer film according to claim 1, wherein the thermally crosslinkable polysiloxane (Sx) comprises any one or more of a repeating unit shown by the following general formula (Sx-1), a repeating unit shown by the following general formula (Sx-2), and a partial structure shown by the following general formula (Sx-3):

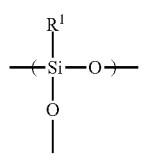
(Sx-1)

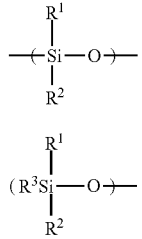

wherein $R^1$, $R^2$, and $R^3$ are identical to or different from each other and each represent a monovalent organic group having 1 to 30 carbon atoms.

3. A patterning process comprising steps of:

forming an organic film by using a coating-type organic film material on a body to be processed;

forming a silicon-containing resist underlayer film on the organic film by using the composition for forming a silicon-containing resist underlayer film according to claim 1;

forming a resist upper layer film on the silicon-containing resist underlayer film by using a resist upper layer film composition composed of a photoresist composition;

forming a circuit pattern in the resist upper layer film;

transferring the pattern to the silicon-containing resist underlayer film by etching using the resist upper layer film having the formed circuit pattern as a mask;

transferring the pattern to the organic film by etching using the silicon-containing resist underlayer film having the transferred pattern as a mask; and transferring the pattern to the body to be processed by etching using the organic film having the transferred pattern as a mask.

4. A patterning process comprising steps of:

forming a hard mask mainly containing carbon by a CVD method on a body to be processed;

forming a silicon-containing resist underlayer film on the hard mask by using the composition for forming a silicon-containing resist underlayer film according to claim 1;

forming a resist upper layer film on the silicon-containing resist underlayer film by using a resist upper layer film composition composed of a photoresist composition;

forming a circuit pattern in the resist upper layer film;

transferring the pattern to the silicon-containing resist underlayer film by etching using the resist upper layer film having the formed circuit pattern as a mask;

transferring the pattern to the hard mask by dry etching using the silicon-containing resist underlayer film having the transferred pattern as a mask; and transferring the pattern to the body to be processed by dry etching using the hard mask having the transferred pattern as a mask.

5. The patterning process according to claim 3, wherein in the step of forming the circuit pattern in the resist upper layer film, the pattern is formed by a photolithography with a wavelength of 10 nm or more and 300 nm or less, direct lithography with electron beam, nanoimprinting, or a combination thereof.

6. The patterning process according to claim 4, wherein in the step of forming the circuit pattern in the resist upper layer film, the pattern is formed by a photolithography with a wavelength of 10 nm or more and 300 nm or less, direct lithography with electron beam, nanoimprinting, or a combination thereof.

7. The patterning process according to claim 3, wherein the body to be processed is a semiconductor device substrate, a metal film, a metal carbide film, a metal oxide film, a metal nitride film, a metal oxycarbide film, or a metal oxynitride film.

8. The patterning process according to claim 4, wherein the body to be processed is a semiconductor device substrate, a metal film, a metal carbide film, a metal oxide film, a metal nitride film, a metal oxycarbide film, or a metal oxynitride film.

9. The patterning process according to claim 5, wherein the body to be processed is a semiconductor device substrate, a metal film, a metal carbide film, a metal oxide film, a metal nitride film, a metal oxycarbide film, or a metal oxynitride film.

10. The patterning process according to claim 6, wherein the body to be processed is a semiconductor device substrate, a metal film, a metal carbide film, a metal oxide film, a metal nitride film, a metal oxycarbide film, or a metal oxynitride film.

11. The patterning process according to claim 3, wherein a metal constituting the body to be processed is silicon, gallium, titanium, tungsten, hafnium, zirconium, chromium, germanium, copper, silver, gold, indium, arsenic, palladium, tantalum, iridium, aluminum, iron, molybdenum, cobalt, or an alloy thereof.

12. The patterning process according to claim 4, wherein a metal constituting the body to be processed is silicon, gallium, titanium, tungsten, hafnium, zirconium, chromium, germanium, copper, silver, gold, indium, arsenic, palladium, tantalum, iridium, aluminum, iron, molybdenum, cobalt, or an alloy thereof.

13. The patterning process according to claim 5, wherein a metal constituting the body to be processed is silicon, gallium, titanium, tungsten, hafnium, zirconium, chromium, germanium, copper, silver, gold, indium, arsenic, palladium, tantalum, iridium, aluminum, iron, molybdenum, cobalt, or an alloy thereof.

14. The patterning process according to claim 6, wherein a metal constituting the body to be processed is silicon, gallium, titanium, tungsten, hafnium, zirconium, chromium, germanium, copper, silver, gold, indium, arsenic, palladium, tantalum, iridium, aluminum, iron, molybdenum, cobalt, or an alloy thereof.

15. The patterning process according to claim 7, wherein a metal constituting the body to be processed is silicon, gallium, titanium, tungsten, hafnium, zirconium, chromium, germanium, copper, silver, gold, indium, arsenic, palladium, tantalum, iridium, aluminum, iron, molybdenum, cobalt, or an alloy thereof.

16. The patterning process according to claim 8, wherein a metal constituting the body to be processed is silicon, gallium, titanium, tungsten, hafnium, zirconium, chromium, germanium, copper, silver, gold, indium, arsenic, palladium, tantalum, iridium, aluminum, iron, molybdenum, cobalt, or an alloy thereof.

* * * * *